United States Patent
Ohsawa

(10) Patent No.: US 7,539,043 B2
(45) Date of Patent: May 26, 2009

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 11/935,017

(22) Filed: Nov. 5, 2007

(65) Prior Publication Data
US 2008/0130379 A1 Jun. 5, 2008

(30) Foreign Application Priority Data
Nov. 7, 2006 (JP) .............................. 2006-301377

(51) Int. Cl.
G11C 7/00 (2006.01)
(52) U.S. Cl. .................................. 365/149; 365/230.06
(58) Field of Classification Search ................. 365/149, 365/230.06, 204
See application file for complete search history.

(56) References Cited

U.S. PATENT DOCUMENTS

| | | | |
|---|---|---|---|
| 6,617,651 B2 | 9/2003 | Ohsawa | |
| 6,621,725 B2 | 9/2003 | Ohsawa | |
| 6,687,152 B2 | 2/2004 | Ohsawa | |
| 6,927,999 B2 * | 8/2005 | Sim et al. | 365/185.2 |

OTHER PUBLICATIONS

Pierre Malinge, et al., "An 8Mbit DRAM Design Using a 1TBulk Cell", Symposium on VLSI Circuits Digest of Technical Papers, 2005, pp. 358-361.
Pierre C. Fazan, et al., "A Simple 1-Transistor Capacitor-Less Memory Cell for High Performance Embedded DRAMs", IEEE Custom Integrated Circuits Conference, 2002, pp. 99-102.

* cited by examiner

Primary Examiner—Vu A Le
(74) Attorney, Agent, or Firm—Oblon, Spivak, McClelland, Maier & Neustadt, P.C.

(57) ABSTRACT

This disclosure concerns a memory comprising a memory cell including a floating body provided between a source and a drain and storing therein data according to number of majority carriers accumulated in the floating body; a word line connected to a gate of the memory cell; a bit line connected to the drain of the memory cell; a source line connected to the source of the memory cell; a sense amplifier sensing data from the memory cell selected by the bit line and the word line; a driver applying a voltage to the word line to form a channel in the memory cell and shifting a voltage of the source line in a voltage direction opposite to a transition direction of the voltage of the word line when first data indicating that the number of the majority carriers is small is written to the memory cell.

18 Claims, 48 Drawing Sheets

NORMAL DATA WRITE OPERATION

EARLY WRITE OPERATION

DATA READ OPERATION

EARLY WRITE OPERATION

NORMAL DATA WRITE OPERATION

DATA READ OPERATION

NORMAL DATA WRITE OPERATION

FIG. 38 EARLY WRITE OPERATION

DATA READ OPERATION

FAST CYCLE READ OPERATION

SIXTH EMBODIMENT

SEMICONDUCTOR MEMORY DEVICE

CROSS-REFERENCE TO RELATED APPLICATION

This application is based upon and claims the benefit of priority from the prior Japanese Patent Applications No. 2006-301377, filed on Nov. 7, 2006, the entire contents of which are incorporated herein by reference.

BACKGROUND OF THE INVENTION

1. Field of the Invention

The present invention relates to a semiconductor memory device, for example, an FBC (Floating Body Cell) memory device for storing data by accumulating majority carriers in floating bodies of field effect transistors.

2. Related Art

In recent years, there has been known an FBC memory device as a semiconductor memory device expected to replace a 1T (Transistor)-1C (Capacitor) DRAM. The FBC memory device includes memory cells each configured so that an FET (Field Effect Transistor) including a floating body (hereinafter, also "body") formed on an SOI (Silicon On Insulator) is formed and so that data "1" or "0" is stored in the FET according to the number of majority carriers accumulated in the body. A state in which the number of holes (majority carriers) in the body is small corresponds to data "0" and a state in which the number of holes (majority carriers) in the body is large corresponds to data "1".

In a conventional FBC memory device using n-type FETs as memory cells, voltages of word lines and source lines are lowered to an equal negative voltage so as to write data "0" to the memory cells. Accordingly, a forward bias is applied to junctions between bodies and sources and holes accumulated in the respective bodies are discharged to the respective sources (P. Malinge et al., "An 8 Mbit DRAM Design Using a 1TBulk Cell" 2005 Symposium on VLSI Circuits Digest of Technical Papers, pp. 358-361, June 2005 (non-patent document 1)). The reason for setting the voltages of the source lines and the word lines to the equal negative voltage is to avoid formation of channels in the memory cell so as not to carry a current between the sources and the drains. By so setting, write current is reduced.

To write data "0" to the memory cells, there is known a method of setting the voltage of the word lines and the bit lines to a high voltage (P. Fazan et al., "A Simple 1-Transistor Capacitor-Less Memory Cell for High Performance Embedded DRAMs" in Proc. IEEE Custom Integrated Circuits Conf. (CICC), September 2002, pp. 99-102 (non-patent document 2)). With this method, a voltage of the word lines is set higher than that of the bit lines, thereby causing transistors to operate in linear regions. As a result, potentials of the bodies are raised and a forward bias is applied to the junctions between the bodies and the source without causing impact ionization. The forward bias discharges the holes accumulated in the bodies to the sources.

With these conventional techniques, the forward bias applied to the junctions between the sources and the bodies is not large. Due to this, the conventional techniques have a disadvantage in that many holes remain in the bodies. If many holes remain in the bodies, a difference $\Delta V_{th}$ (=$V_{th0}$−$V_{th1}$) between a threshold voltage $V_{th0}$ of the memory cells storing therein data "0" (hereinafter, also "0" cells) and a threshold voltage $V_{th1}$ of the memory cells storing therein data "1" (hereinafter, also "1" cells) becomes small.

Generally, many memory cells are present in a semiconductor memory device and threshold voltages of the memory cells are always irregular. If the threshold voltage difference $\Delta V_{th}$ is smaller, the number of defective memory cells that cannot be detected by sense amplifiers becomes larger due to the influence of the irregularity among the threshold voltages.

SUMMARY OF THE INVENTION

A semiconductor memory device according to an embodiment of the present invention comprises a memory cell including a source layer, a drain layer, and a floating body provided between the source layer and the drain layer and being in an electrically floating state, the memory cell storing therein data according to number of majority carriers accumulated in the floating body; a word line connected to a gate of the memory cell, and extending in a first direction; a bit line connected to the drain layer of the memory cell, and extending in a second direction different from the first direction; a source line connected to the source layer of the memory cell, and extending in the first direction; a sense amplifier connected to the bit line, and sensing data from the memory cell selected by the bit line and the word line; a driver applying a voltage to the word line to form a channel in the memory cell and shifting a voltage of the source line in a voltage direction opposite to a transition direction of the voltage of the word line when first data indicating that the number of the majority carriers is small is written to the memory cell.

A method of driving a semiconductor memory device according to an embodiment of the present invention, the semiconductor memory device comprising: a memory cell including a source layer, a drain layer, and a floating body provided between the source layer and the drain layer and being in an electrically floating state, the memory cell storing therein data according to number of majority carriers accumulated in the floating body; a word line connected to a gate of the memory cell, and extending in a first direction; a bit line connected to the drain layer of the memory cell, and extending in a second direction different from the first direction; a source line connected to the source layer of the memory cell, and extending in the first direction; a sense amplifier connected to the bit line, and sensing data from the memory cell selected by the bit line and the word line; a driver driving the word line and the source line, the method comprises shifting a voltage of the source line from a level during data holding time to a voltage direction opposite to a transition direction of the voltage of the word line when first data indicating that number of majority carriers is small is written to the memory cell.

BRIEF DESCRIPTION OF THE DRAWINGS

FIG. 19 is a circuit diagram showing a configuration of each of the sense amplifiers S/As;

DETAILED DESCRIPTION OF THE INVENTION

Embodiments of the present invention will be explained below with reference to the accompanying drawings. The present invention is not limited to the embodiments.

First Embodiment

Figure 1:
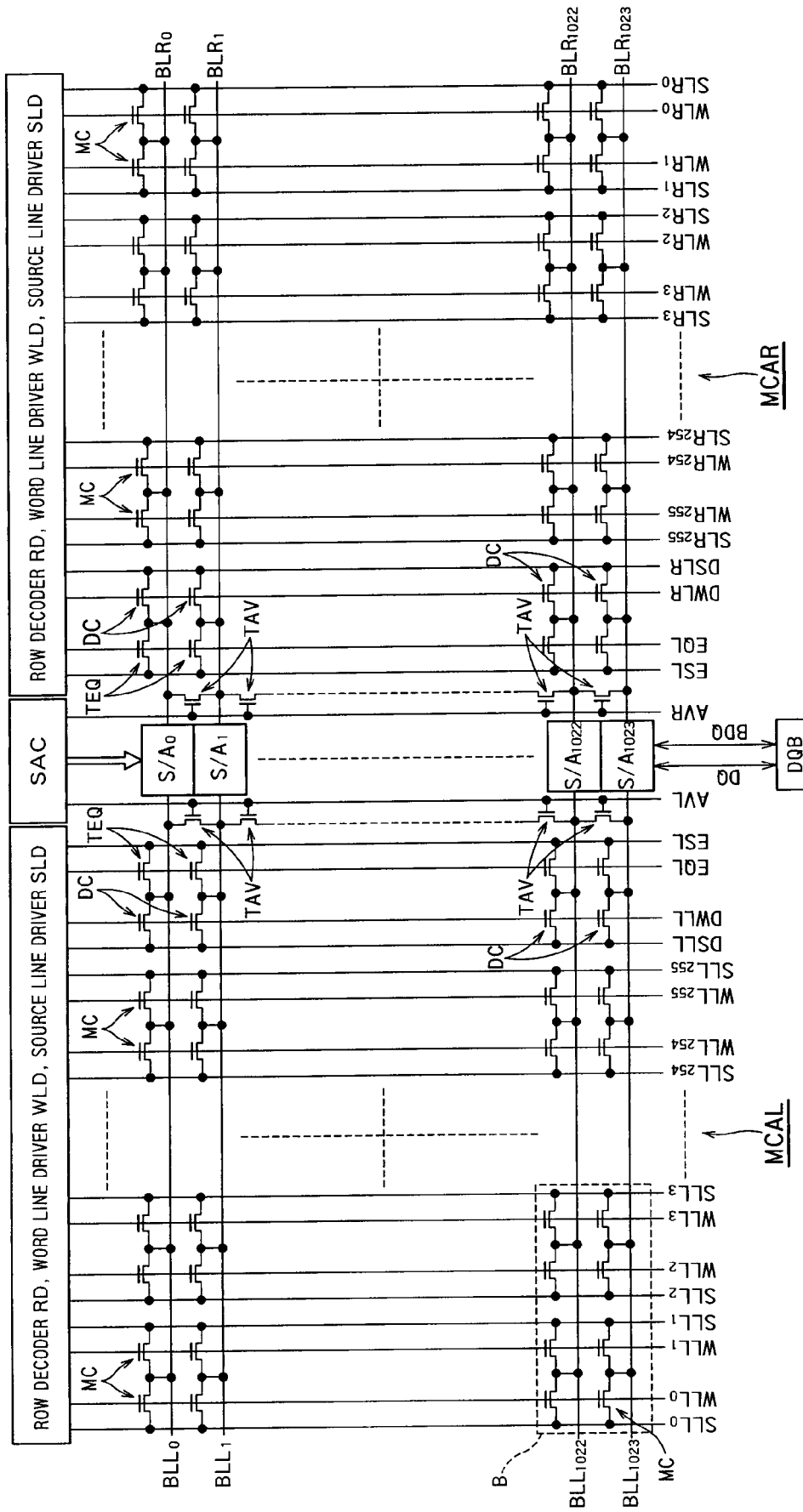
FIG. 1 shows a configuration of an FBC memory device according to a first embodiment of the present invention.

FIG. 1 shows a configuration of an FBC memory device according to a first embodiment of the present invention. An FBC memory device 100 includes memory cells MCs, dummy cells DCs, word lines WLLi and WLRi (where i is an integer) (hereinafter, also "WLs"), dummy word lines DWLLs and DWLRs (hereinafter, also "DWLs"), bit lines BLLi and BLRi (hereinafter, also "BLs"), sense amplifiers S/Ai (hereinafter, also "S/As"), equalizing lines EQLs, equalizing transistors TEQs, averaging lines AVL and AVR (hereinafter, also "AVs"), source lines SLLi and SLRi (hereinafter, also "SLs"), row decoders RDs, word line drivers WLDs, and source line drivers SLDs.

The memory cells MCs are arranged two-dimensionally in a matrix and constitute memory cell arrays MCAL and MCAR (hereinafter, also "MCAs"). The word lines WLs extend in a row direction that is a first direction and are connected to gates of the memory cells MCs. 256 word lines WLs are arranged on each of the left and right of the sense amplifiers S/As. In FIG. 1, the 256 word lines on the left of the sense amplifiers S/As are denoted by WLL0 to WLL255, and the 256 word lines on the right of the sense amplifiers S/As are denoted by WLR0 to WLR255, respectively. The bit lines BLs extend in a column direction that is a second direction and are connected to drains of the memory cells MCs. 1024 bit lines BLs are arranged on each of the left and right of the sense amplifiers S/As. In FIG. 1, the 1024 bit lines on the left of the sense amplifiers S/As are denoted by BLL0 to BLL1023, and the 1024 bit lines on the right of the sense amplifiers S/As are denoted by BLR0 to BLR1023, respectively. Each pair of two adjacent memory cells MC shares a drain therebetween. The word lines WLs are orthogonal to the bit lines BLs and the memory cells MCs are arranged at respective cross points between the word lines WLs and the bit lines BLs. These memory cells MCs are, therefore, referred to as "cross point cells". Note that the row direction and the column direction can be replaced with each other.

The source lines SLs extend in the first direction in parallel to the word lines WLs and are connected to sources of the memory cells MCs. Similarly to the word lines WLs, 256 source lines are arranged on each of the left and right of the sense amplifiers S/As. In FIG. 1, the 256 source lines on the left of the sense amplifiers S/As are denoted by SLL0 to SLL255, and the 256 source lines on the right of the sense amplifiers S/As are denoted by SLR0 to SLR255, respectively. The source lines SLs are provided to correspond to the respective word lines WLs.

The dummy cells DCs are arranged in the (row) direction in which the dummy word lines DWLs extend. Prior to a data read or write operation, the dummy cells DCs alternately store therein data "0" or data "1" having reversed polarities with respect to each other along the direction in which the dummy cells DCs are arranged. Generally, the data "0" or "1" is written to the dummy cells DCs right after the FBC memory device 100 is turned on. The polarity indicates a logic value "0" or "1" of data. The number of dummy cells DCs storing therein data "0" is equal to that of dummy cells DCs storing therein data "1" having a reversed polarity with respect to the polarity of the data "0". The dummy cells DCs are employed to generate a reference current Iref when data stored in the memory cells MCs is detected. The reference current Iref is almost an intermediate current between a current carried across the "0" cells and that carried across the "1" cells.

The dummy word lines DWLs extend in the row direction and are connected to gates of the dummy cells DCs. One dummy word line DWL is arranged on each of the left and right of the sense amplifiers S/As.

The equalizing lines EQLs are connected to gates of the equalizing transistors TEQs. The equalizing transistors TEQs connect the bit lines BLs to the equalizing lines EQLs during a precharge period before or after the data read or writhe operation, thereby fixing voltages of the respective bit lines BLs to a constant voltage.

The averaging lines AVs are connected to gates of the averaging transistors TAVs. The averaging transistors TAVs are connected between the bit lines BLs and can short all the bit lines BLs in the respective memory cell arrays. During the data read operation, the averaging transistors TAVs short the dummy cells DCs having reversed polarities, thereby averaging a current carried across the dummy cells DCs. As a result, the reference current Iref is generated.

The sense amplifiers S/As, the row decoders RDs, the word line drivers WLDs, and the source line drivers SLDs will be described later. Since a sense amplifier controller SAC and a DQ buffer DQB can be similar to a conventional sense amplifier controller and a conventional DQ buffer, respectively, they will not be described herein.

Figure 2:
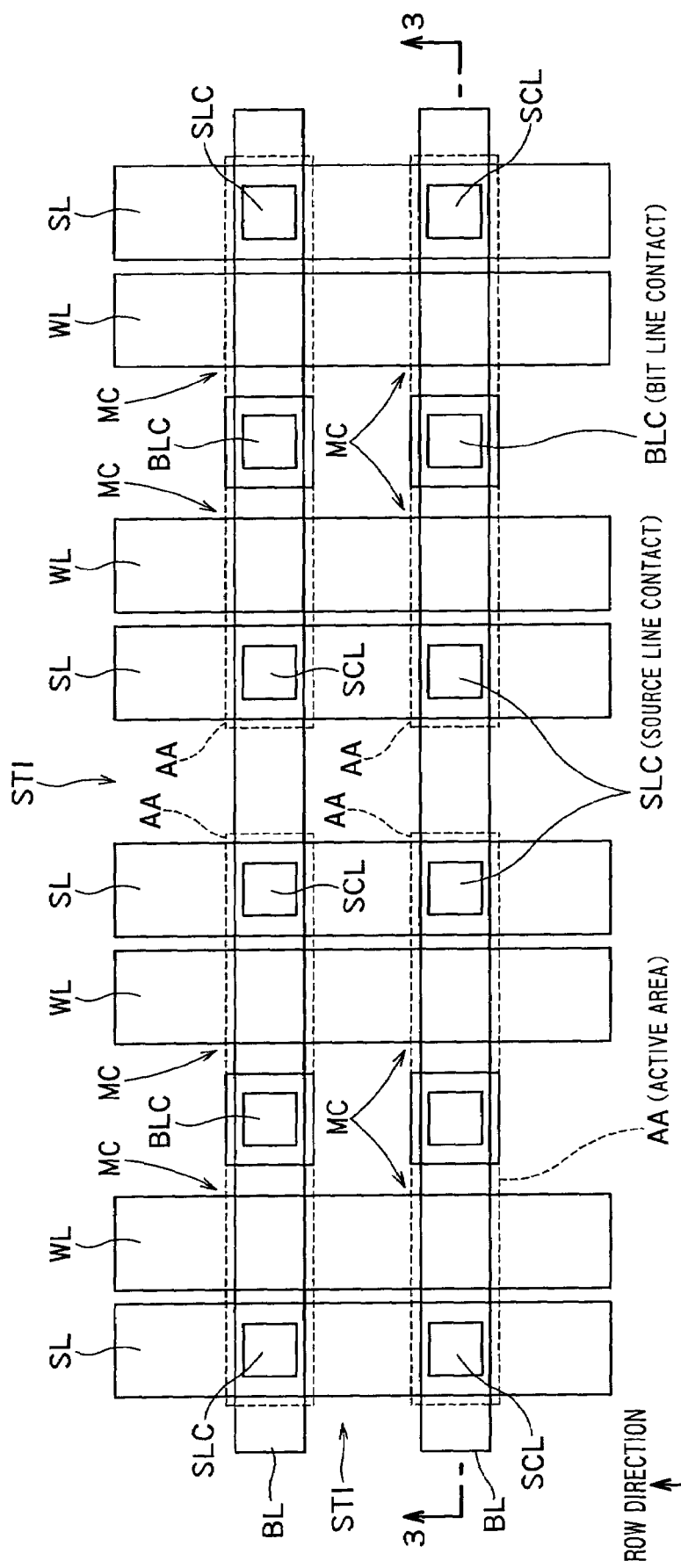
FIG. 2 is a plan view showing eight memory cells MCs surrounded by a broken line shown in FIG. 1 in more detail.
Figure 3:
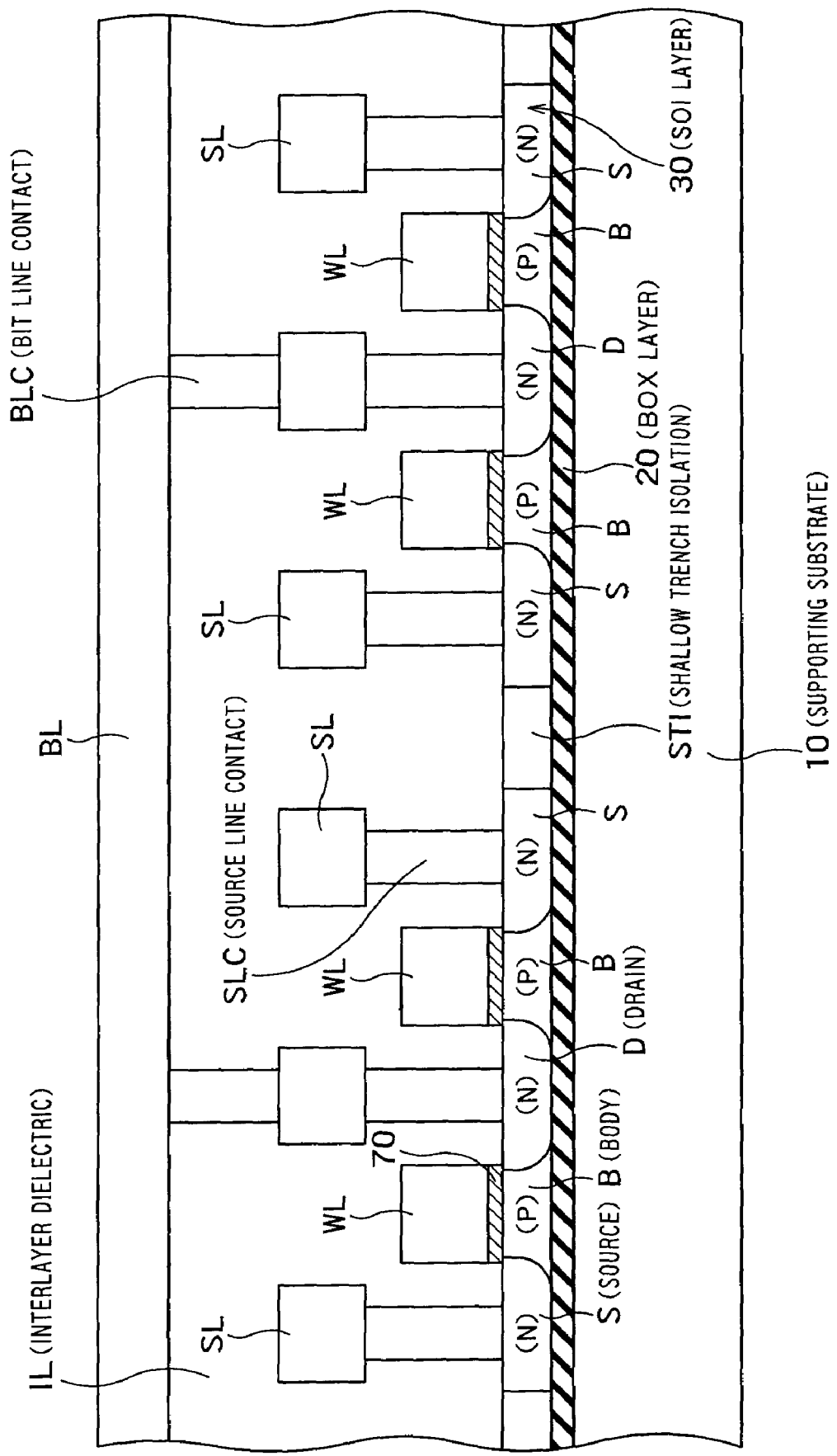
FIG. 3 is a cross-sectional view taken along a line 3-3 shown in FIG. 2.

FIG. 2 is a plan view showing eight memory cells MCs surrounded by a broken line shown in FIG. 1 in more detail. FIG. 3 is a cross-sectional view taken along a line 3-3 shown in FIG. 2. A source layer S of each memory cell MC is connected to each source line SL via a source line contact SLC. The source line contact SLC is provided per memory cell MC. Namely, the source lines SLs are provided to correspond to the respective memory cells MCs arranged in the column direction (i.e., second direction). A drain layer D of each memory cell MC is connected to each bit line BL via a bit line contact BLC. Each bit line contact BLC is connected to the two memory cells MCs adjacent in the column direction in common. It is thereby possible to decrease the number of bit line contacts BLCs and to reduce an area occupied by the memory cell arrays MCAs. The two memory cells MCs adjacent in the column direction form a pair and the paired adjacent memory cells are isolated from each other by an element isolation region STI in source regions.

The memory cells MCs are provided on an SOI substrate including a supporting substrate 10, a BOX layer 20, and an SOI layer 30. The source layer S and the drain layer D are provided in the SOI layer 30. A body B of each memory cell MC is formed in the SOI layer 30 between the source S and the drain D. The body B is made of a semiconductor opposite in conduction type to the source layer S and the drain layer D. In the first embodiment, the memory cells MCs are n-type FETs. The body B is in an electrically floating state by being surrounded by the source layer S, the drain layer D, the BOX layer 20, a gate insulating film 70, and the STI. In the FBC memory device 100, binary data (0, 1) can be stored in the memory cells MCs according to the number of majority carries accumulated in the respective bodies B. A state in which the number of majority carriers (holes) is large corresponds to the data "1" whereas a state in which the number of majority carriers (holes) is small corresponds to the data "0". Accordingly, in the first embodiment, an operation for writing binary data indicating that the number of majority carriers is small corresponds to an operation for writing data "0" to the memory cells MCs.

Figure 4:
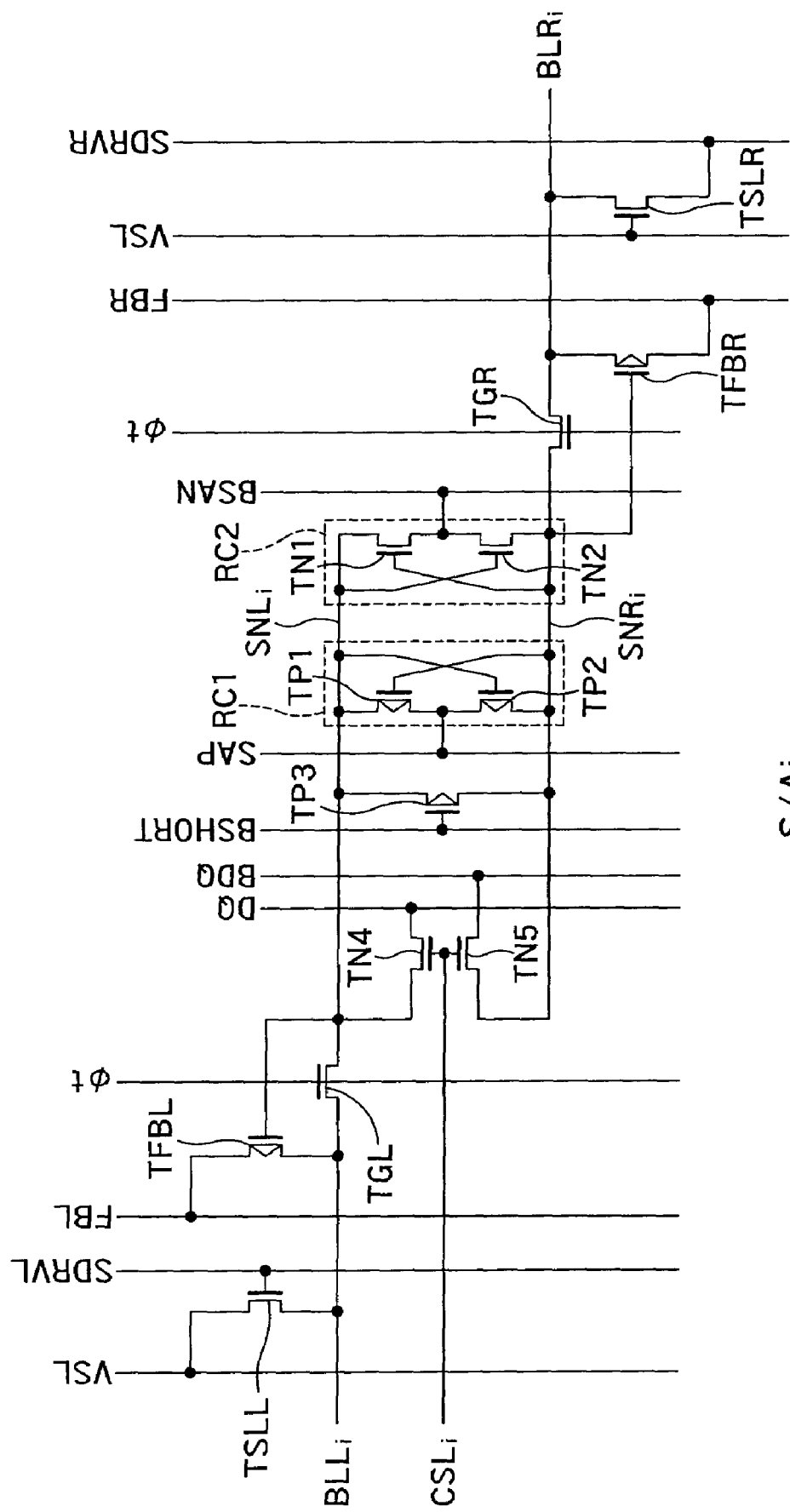
FIG. 4 is a circuit diagram showing a configuration of each of the sense amplifiers S/Ai (i=0 to 1023)

FIG. 4 is a circuit diagram showing a configuration of each of the sense amplifiers S/Ai (i=0 to 1023). Each sense amplifier S/Ai (hereinafter, "S/A") is connected to one bit line BLLi (hereinafter, also "BLL") and one bit line BLRi (hereinafter, also "BLR") arranged on the left and right of the sense amplifier S/A, respectively, and provided to correspond to each bit line pair BLLi and BLRi. In this manner, the FBC memory device 100 according to the first embodiment adopts an open bit line configuration. Therefore, during the data read operation, one of the paired bit lines BLLi and BLRi transmits data and the other bit line transmits a reference signal.

Each sense amplifier S/A includes a pair of sense nodes SNLi (hereinafter, "SNL") and SNRi (hereinafter, "SNR"). The sense node SNL is connected to one bit line BLL via a transfer gate TGL, and the sense node SNR is connected to a bit line BLR via a transfer gate TGR. The transfer gates TGL and TGR are controlled to be turned on or off by a signal Φt. The transfer gates TGL and TGR are transistors that are switched to be turned off after end of data detection and that are kept to be turned off during the data write operation.

A feedback transistor TFBL is connected between a feedback line FBL and one bit line BLL. A gate of the feedback transistor TFBL is connected to the sense node SNL. Accordingly, the feedback transistor TFBL is controlled to be turned on or off by a voltage of the sense node SNL. A feedback transistor TFBR is connected between a feedback line FBR and one bit line BLR. A gate of the feedback transistor TFBR is connected to the sense node SNR. Accordingly, the feedback transistor TFBR is controlled to be turned on or off by a voltage of the sense node SNR. The feedback transistors TFBL and TFBR are transistors switched to be turned on during the data write operation. The feedback transistors TFBL and TFBR are p-type transistors. Accordingly, if voltages of the sense nodes SNL and SNR are low, the feedback transistors TFBL and TFBR connect the feedback lines FBL and FBR, the voltages of which are high, to the bit lines BLL and BLR, respectively. Conversely, if voltages of the sense nodes SNL and SNR are high, the feedback transistors TFBL and TFBR do not connect the feedback lines FBL and FBR to the bit lines BLL and BLR, respectively. The reason is as follows.

If data "1" on the bit lines BLLs is to be detected and restored, for example, then a current which flows through each N-type memory cell MC becomes lower than a voltage generated by the reference current Iref, and a potential of the sense node SNL becomes lower than that of the sense node SNR accordingly. To write back the data "1" to each memory cell MC, it is necessary to apply a high potential to the bit lines BLL. Accordingly, if the data "1" is to be restored, the transistor TFBL needs to connect the high-voltage feedback line FBL to each bit line BLL. By doing so, the data "1" can be written back to each "1" cell. In the first embodiment, the data "0" is written to the "0" cells using not the sense amplifiers S/As but the source lines SL, as will be described later.

A transistor TSLL is connected between a source voltage line VSL and one bit line BLL whereas a transistor TSLR is connected between the source voltage line VSL and one bit line BLR. Gates of the transistors TSLL and TSLR are connected to source drive lines SDRVL and SDRVR, respectively. The transistors TSLL and TSLR are provided to avoid disturbance to unselected memory cells MCs by setting potentials of the bit lines BLL and BLR to a source potential VSL when the data "0" is written to the memory cells MCs.

Each sense amplifier S/A includes a cross-coupled dynamic latch circuits (hereinafter, "latch circuits") RC1 and RC2. The latch circuit RC1 is configured to include two p-type transistors TP1 and TP2 connected in series between the sense nodes SNL and SNR. A gate of the transistor TP1 is connected to the sense node SNR, and that of the transistor TP2 is connected to the sense node SNL. Namely, the gates of the transistors TP1 and TP2 are cross-coupled to the sense nodes SNL and SNR. The latch circuit RC2 is configured to include two n-type transistors TN1 and TN2 connected in series between the sense nodes SNL and SNR. A gate of the transistor TN1 is connected to the sense node SNR, and that of the transistor TN2 is connected to the sense node SNL. Namely, the gates of the transistors TN1 and TN2 are cross-coupled to the sense nodes SNL and SNR. The latch circuits RC1 and RC2 are driven by activating signals SAP and BSAN, respectively.

Note that "activate" means to turn on or drive an element or a circuit whereas "deactivate" means to turn off or stop an element or a circuit. It is to be noted, therefore, a HIGH (high potential level) signal serves as an activation signal at one time and a LOW (low potential level) signal serves as an activation signal at another time. For example, an NMOS transistor is activated by setting its gate HIGH whereas a PMOS transistor is activated by setting its gate LOW.

A p-type transistor TP3 is connected between the sense nodes SNL and SNR and controlled by a signal BSHORT. The transistor TP3 equalizes the sense nodes SNL and SNR to each other by shorting the sense node SNL to the sense node SNR before the data read or write operation. Alternatively, the p-type transistor TP3 can be replaced by an n-type transistor and an inverted signal SHORT of the signal BSHORT can be input to a gate of the n-type transistor.

n-type transistors TN4 and TN5 are connected between a DQ line and the sense node SNL and between a BDQ line and the sense node SNR. Gates of the transistors TN4 and TN5 are connected to a column selection line CSLi (hereinafter, "CSL"). The DQ line and the BDQ line are connected to the DQ buffer DQB shown in FIG. 1. The DQ buffer DQB is connected to an I/O circuit. During the data read operation, the DQ buffer DQB temporarily stores therein data from the memory cells MCs to output the data to the outside. During the data write operation, the DQ buffer DQB temporarily stores therein data from the outside to transmit the data to the sense amplifiers S/As. Accordingly, the column selection line CSL is selectively activated when data is read to the outside or data is written from the outside, thereby making it possible to connect the sense nodes SNL and SNR to the DQ buffer DQB.

Figure 5:
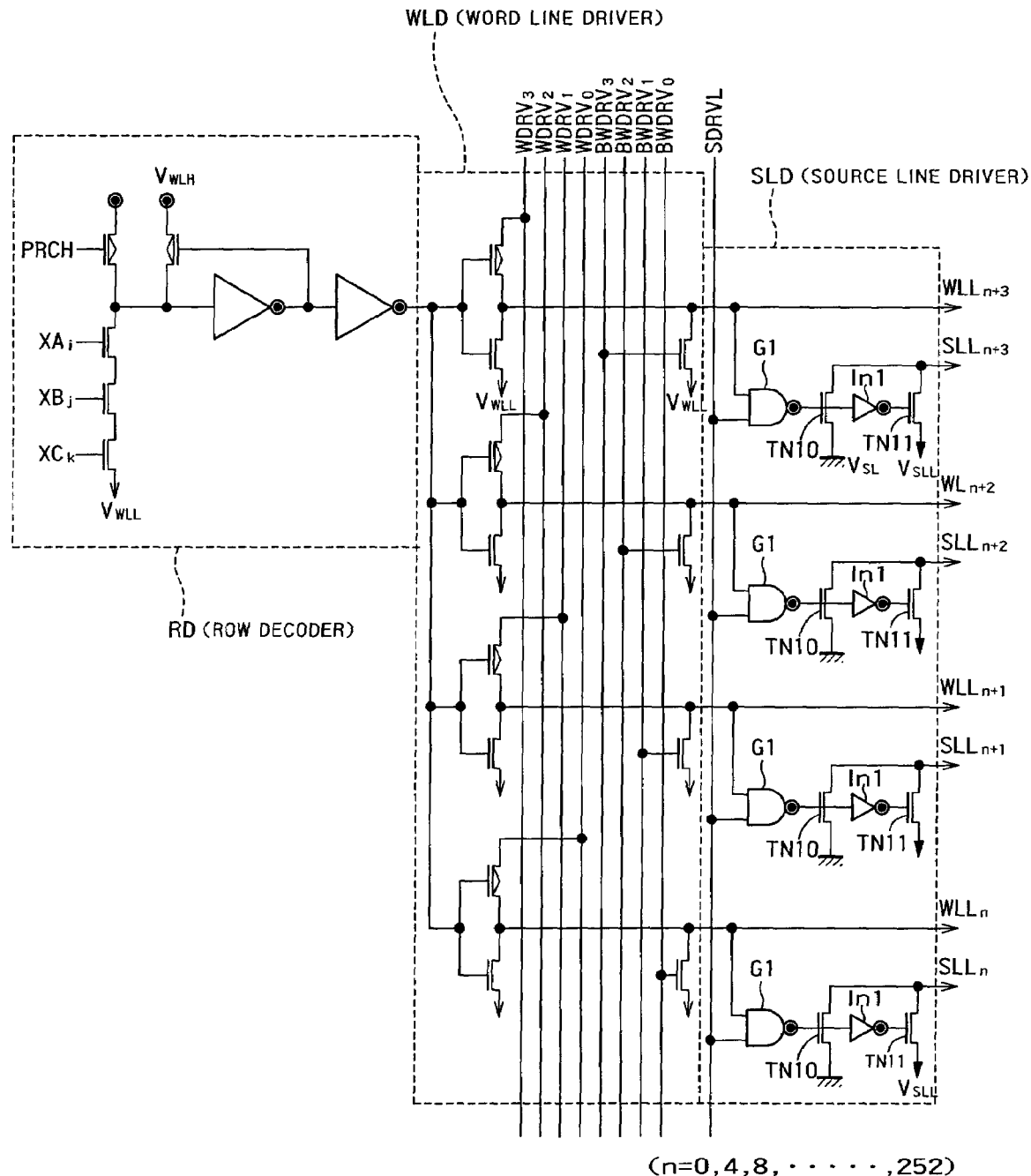
FIG. 5 is a circuit diagram showing configurations of the row decoders RD, the word line drivers WLD, and the source line drivers SLDs.

FIG. 5 is a circuit diagram showing configurations of the row decoders RD, the word line drivers WLD, and the source line drivers SLDs. The row decoder RD and the word line driver WLD can be similar in configuration to the conventional row decoder and the conventional word line driver, respectively. In the first embodiment, the source line drivers SLDs are additionally provided for the row decoder RD and the word line driver WLD. FIG. 5 shows a part of the row decoder RD, the word line driver WLD, and the source line drivers SLDs on the left of the sense amplifiers S/As. The row decoder RD, the word line driver WLD, and the source line drivers SLDs on the right of the sense amplifiers S/As are simply bilaterally symmetric to those on the left of the sense amplifiers S/As shown in FIG. 5 and obvious. Therefore, descriptions thereof will be omitted.

Each of the source line drivers SLDs includes a NAND gate G1, an inverter In1, and n-type transistors TN10 and TN11. Each of the source lines SLLs is connected to a first source voltage VSL (ground potential) via the transistor TN10, and connected to a second source voltage VSLL lower than the first source voltage VSL via the transistor TN11. A signal on the word line WLLi and that on the source drive line SDRVL are input to the corresponding NAND gate G1, and the NAND gate G1 outputs a result of a calculation of the signals. An output signal from the NAND gate G1 is input to a gate of the transistor TN10, and an inverted signal of the output signal is input to a gate of the transistor TN11. One of the transistors TN10 and TN11 corresponding to the selected word line WLL is turned on and either the power supply VSL or VSLL is connected to the selected source line SLL. In this manner, the source line driver SLD applies a voltage to the selected source line SLL corresponding to the selected word line WLL according to the voltage applied to the selected word line WLL.

The source drive line SDRVL is a signal line driven when data "0" is written to the memory cells MCs. The first source voltage VSL is a precharge potential. The second source voltage VSLL is a voltage that is applied to the source line SLL when data "0" is written to the memory cells MCs and that is lower than the first source voltage VSL.

Note that a voltage VWLH is a high-level voltage applied to the word lines WLs and a voltage VWLL is a low-level voltage applied to the word lines WLs. To normally turn on or off the transistors TN10 and TN11, it is necessary to satisfy VSL<VWLH and VSLL>VWLL.

Figure 6:
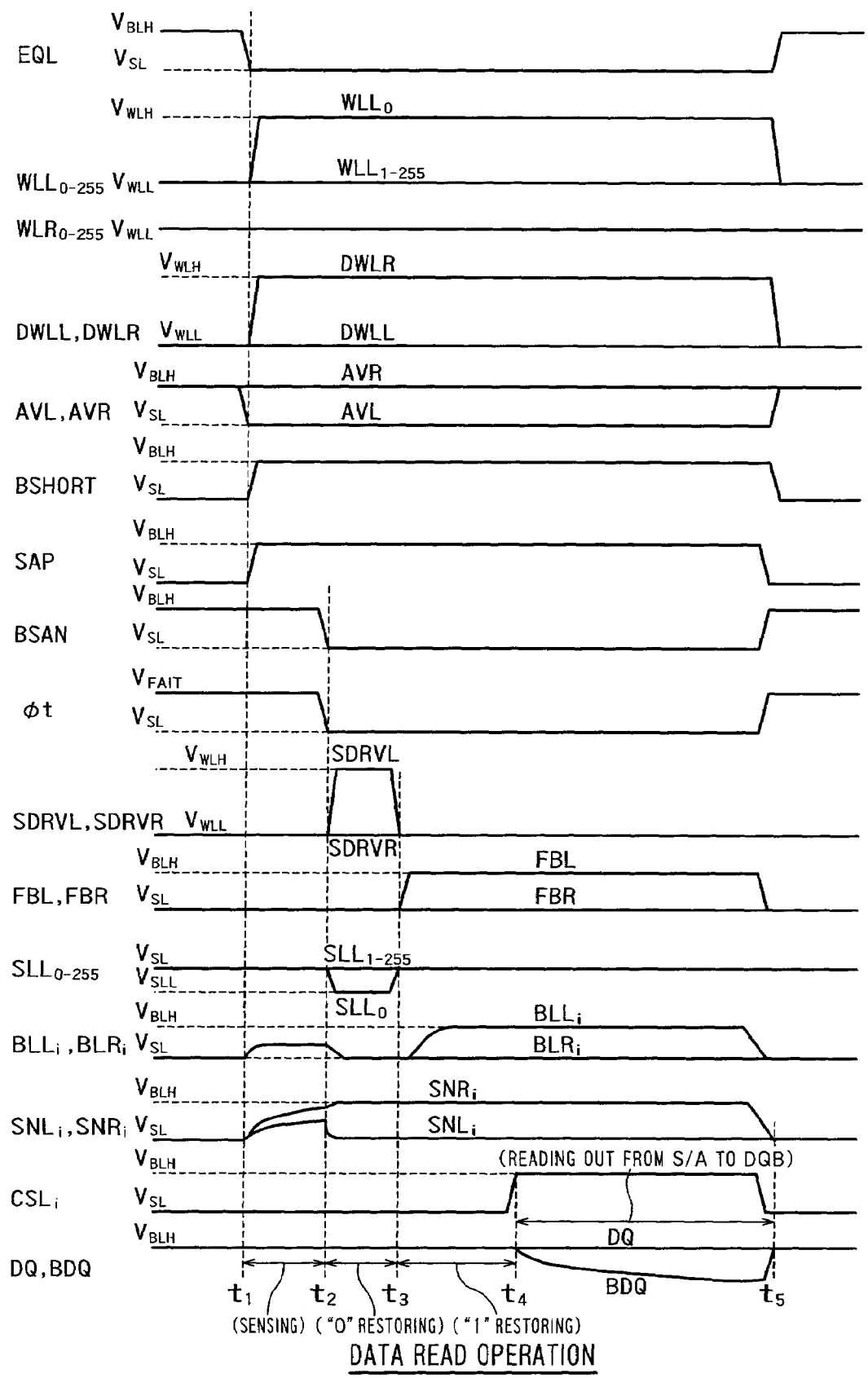
FIG. 6 is a timing diagram showing the data read operation performed by the FBC memory device according to the first embodiment.

FIG. 6 is a timing diagram showing the data read operation performed by the FBC memory device according to the first embodiment. In the first embodiment, the data read operation for causing the sense amplifiers S/As to receive a reference signal from the memory cell array MCAR and to detect data in the memory cell array MCAL will be described. Since the data read operation for causing the sense amplifiers S/As to detect data in the memory cell array MCAR is evident from that for detecting data in the memory cell array MCAL, it will not be described herein.

Before t1, the FBC memory device is in a precharge state. In the precharge state, the equalizing lines EQLs and the signal Φt are both active. Accordingly, voltages of the bit lines BLLs and BLRs and the sense nodes SNLs and SNRs are fixed to the first source voltage VSL.

At t1, the equalizing lines EQLs are deactivated and the FBC memory device moves from the precharge state to the data read operation. It is assumed that the word line WLL0 is selectively activated. At this time, the dummy word line DWLR is activated and the averaging line AVL is deactivated. In the precharge state, both the averaging lines AVL and AVR are active. Therefore, while the averaging line AVL is deactivated, only the averaging line AVR is kept active. As a result, the bit lines BLRs are shorted, a current carried across the dummy cells DCs is averaged, and the reference current Iref is generated.

Furthermore, the signal BSHORT is deactivated to high level, thus disconnecting the sense nodes SNL from the respective sense nodes SNRs. In addition, the signal SAP is activated. As a result, a high-level voltage VBLH is connected to the sense nodes SNLs and SNRs, and a load current is applied to the memory cells MCs via the bit lines BLLs and applied to the dummy cells DCs via the bit lines BLRs. As shown in FIG. 6, from t1 to t2, this load current raises potential of the sense nodes SNLs and SNRs. A potential difference (i.e., signal difference) is generated between the sense nodes SNLs and SNRs by the positive feedback of the cross-couple constituted by the transistors TP1 and TP2.

Thereafter, at the time (t2) at which the signal difference sufficiently grows between the sense nodes SNLs and SNRs, the signal Φt is deactivated to low level and the signal BSAN is activated. By deactivating the signal Φt, the sense nodes SNLs and SNRs are disconnected from the bit lines BLLs and BLRs, respectively. By activating the signal BSAN, each latch circuit RC2 amplifiers and latches the signal difference generated between the sense nodes SNL and SNR.

Right after the signal Φt is deactivated, the source drive line SDRVL is activated to high level. The source drive line SDRVL determines a timing of driving the source drivers SLD. Accordingly, by activating the source drive line SDRVL, the source line driver SLD shown in FIG. 5 is driven and each transistor TSLL shown in FIG. 4 is switched to be turned on. In FIG. 5, when the source line driver SLD is driven, the source line SLL0 corresponding to the selected word line WLL0 is connected to the low-level voltage VSLL. Unselected source lines SLLi other than the selected source line SLL0 are connected to the ground potential VSL. Namely, as shown in FIG. 6, the voltage of the selected source line SLL0 becomes lower level than the ground potential. Furthermore, in FIG. 4, if each transistor TSLL is turned on, the ground potential VSL is connected to the bit line BLLi. Namely, as shown in FIG. 6, from t2 to t3, the high-level voltage VWLH is applied to gates G of all the memory cells MCs connected to the selected word line WLL0, the negative voltage VSLL is applied to the source layers S thereof, and the ground potential VSL is applied to the drains D thereof. As a result, data "0" is written to all the memory cells MCs connected to the selected word line WLL0.

After deactivating the source drive line SDRVL, a feedback signal FBL is activated to high level from t3 to t4. Each feedback transistor TFBL shown in FIG. 4 is turned on when the sense node SNL is at low level. While the data "1" is latched as described above, the sense node SNL is at low level. Due to this, only the transistors TFBLs provided in the sense amplifiers S/As that latch the data "1" are turned on to connect the high-level feedback signal FBL to the bit lines BLLs. As a result, the data "1" is written to only the memory cells MCs that have been "1" cell before data "0" is written.

In this manner, from t2 to t4, each sense amplifier S/A writes the data "0" to all the memory cells MCs connected to the selected word line WLL0 and then writes back the data "1" to the memory cells MCs that have been "1" cell before data "0" is written. This restoration operation is performed to avoid charge pumping phenomenon. The charge pumping phenomenon is the following phenomenon. If a memory cell is an n-type FET, a part of electrons in an inversion layer present on an interface between the gate insulating film 70 and the body B are trapped into an interface state. Holes accumulated in the body B are recombined with the electrons and disappear. Accordingly, if the unselected memory cells are repeatedly turned on and off when the data is read or written to or from the selected memory cells MCs, the holes accumulated in the bodies B of the unselected memory cells MCs storing therein data "1" gradually decrease. As a result, the state in which the unselected memory cells MCs store therein data "1" is changed to the state in which the unselected memory cells MCs store therein data "0". This is referred to as "charge pumping phenomenon".

At t4, the column selection lines CSLi are selectively activated. The data latched by the sense amplifiers S/As in the selected columns is transmitted to the DQ buffer DQB. The data stored in the DQ buffer is output as output data to the outside of the FBC memory device 100.

After t5, the FBC memory device 100 returns to the precharge state.

Figure 7:
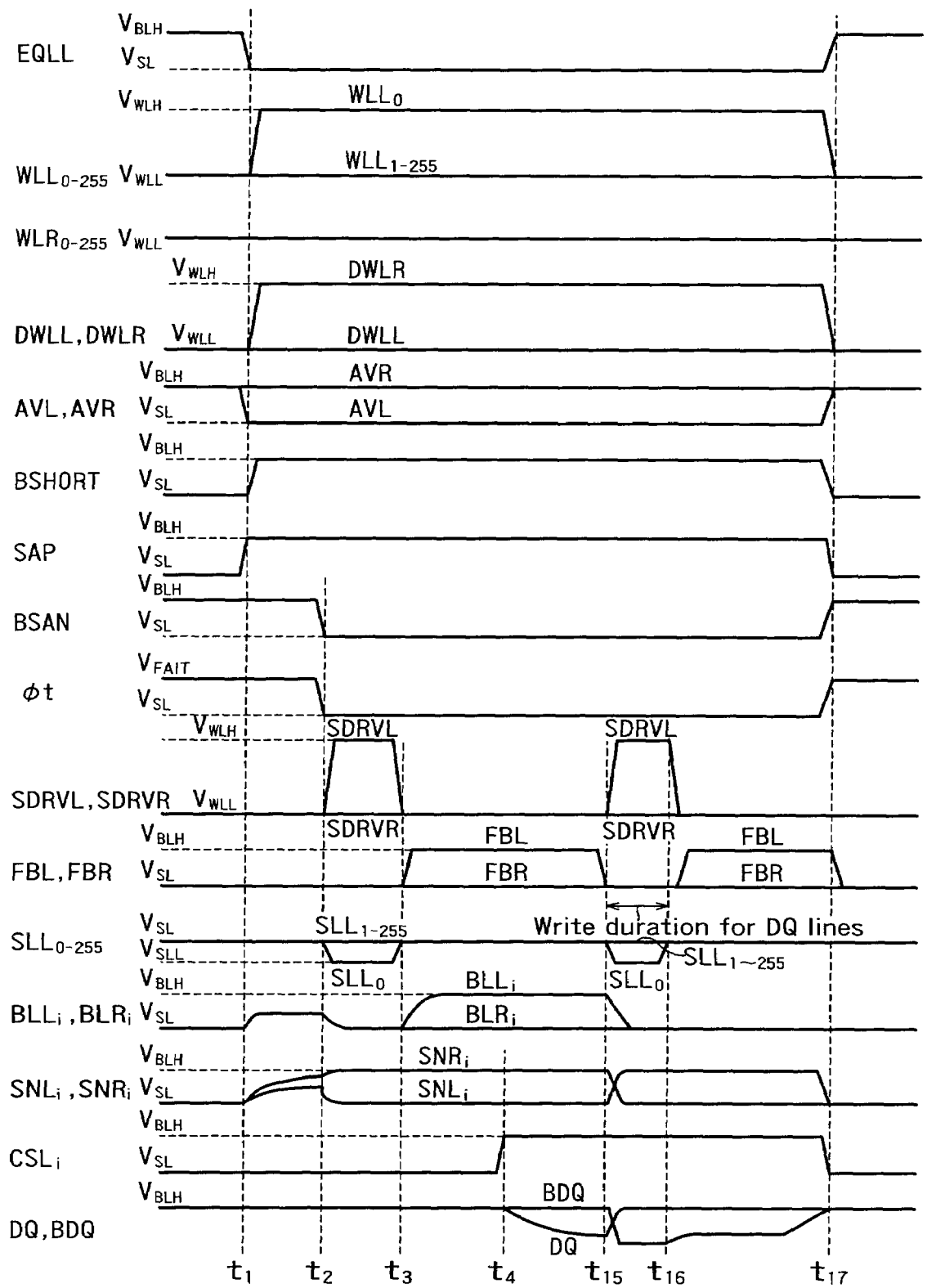
FIG. 7 is a timing diagram showing a normal data write operation performed by the FBC memory device 100 according to the first embodiment.

FIG. 7 is a timing diagram showing a normal data write operation performed by the FBC memory device 100 according to the first embodiment. In the normal data write operation, at t15, write data is input to the DQ buffer DQB from the outside. The normal data write operation from t1 to t5 is, therefore, similar to that the data read operation from t1 to t5 shown in FIG. 6.

Near t15, right after the feedback line FBL is deactivated, the source drive line SDRVL is re-activated. By deactivating the feedback line FBL, the bit lines BLLs are disconnected from the sense amplifiers S/As. By activating the source drive line SDRVL, the low-level voltage VSLL is applied to the selected source line SLL0. As a result, the sense amplifiers S/As write data "0" to all the memory cells MCs in which the data is restored from t3 to t4. From t15 to t16, since the signal Φt and the feedback line FBL are both inactive, the sense amplifiers S/As store therein the write data from the outside via the DQ buffer DQB and continue to latch the write data. Namely, the period from t15 to t16 is a data write period for writing data to the sense amplifiers S/As.

At t16, the source drive line SDRVL is deactivated and the feedback line FBL is re-activated right after deactivating the source drive line SDRVL. As a result, from t16 to t17, the write data (which is only the data "1" in the first embodiment) that has been latched by the sense amplifiers S/As is written to the memory cells MCs via the bit lines BLLs. In FIG. 7, data "0" is written to the "1" cells. As described above, the data "0" is written to the "1" cells using not the sense amplifiers S/As but the source lines SLs. Namely, the data "0" is already written to the "1" cells from t15 to t16. After t16, therefore, only the data "1" is written to the memory cells MCs and a charging operation for the bit lines BLLs is not, therefore, performed in FIG. 7.

Figure 8:
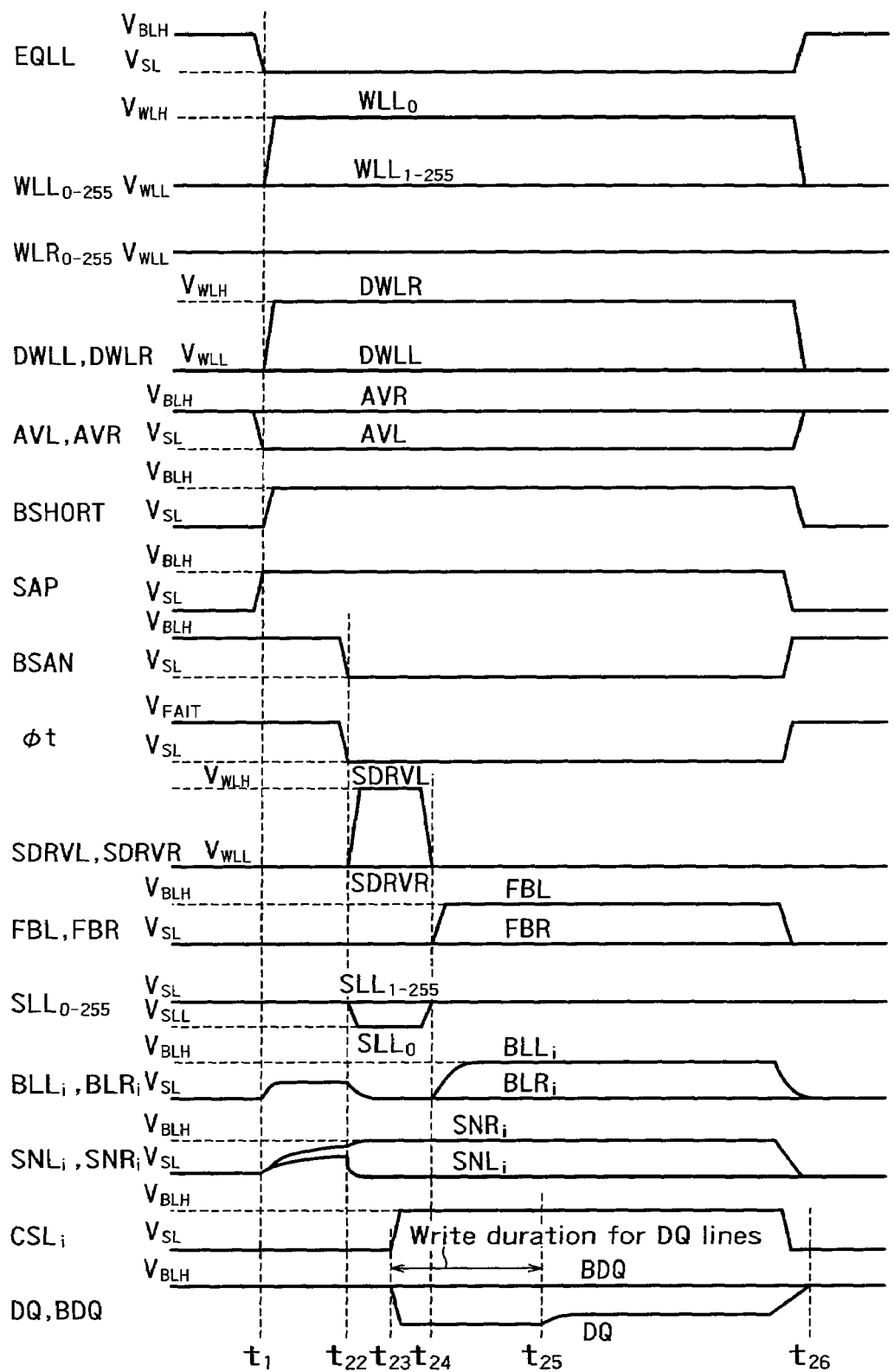
FIG. 8 is a timing diagram showing an early write operation performed by the FBC memory device 100 according to the first embodiment.

FIG. 8 is a timing diagram showing an early write operation performed by the FBC memory device 100 according to the first embodiment. In the early write operation, from t22 to t23, the column selection lines CSLi are activated while data "0" is being written and write data is input from the outside to the DQ buffer DQB. At this time, the data write operation starts. Therefore, the data write operation from t1 to t22 is similar to the data read operation from t1 to t2 shown in FIG. 6.

In the early write operation, at t23 at which the source drive line SDRVL is being activated, the column selection lines CSLi are activated. As a result, data "0" is written to all the memory cells MCs connected to the selected word line WLL0 and the selected source line SLL0. At the same time, the write data from the outside is written to the sense amplifiers S/As via the DQ buffer DQB.

Thereafter, at t24, the feedback line FBL is activated, and the sense amplifiers S/As that have latched the data "1" write the data "1" to the memory cells MCs via the bit lines BLLs.

The operation for writing the data "0" from t2 to t3 will be described in detail.

Figure 9:
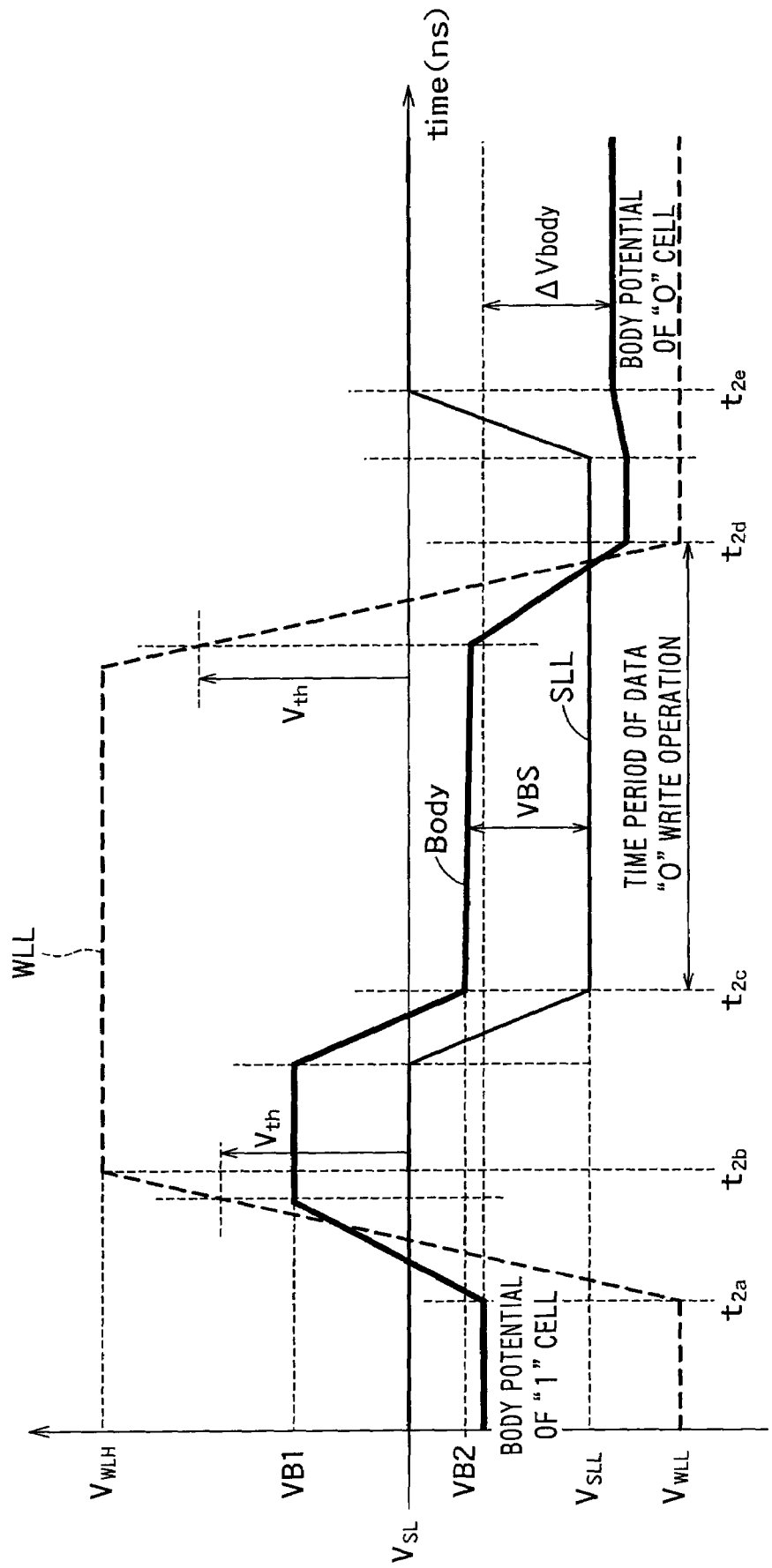
FIG. 9 is a graph showing potentials of respective elements of each memory cell MC when the data "0" is written to the memory cell MC according to the first embodiment.

FIG. 9 is a graph showing potentials of respective elements of each memory cell MC when the data "0" is written to the memory cell MC according to the first embodiment. The graph shown in FIG. 9 shows the operation for writing the data "0" to each "1" cell.

Before a period (t2a) of holding the data in the "1" cells, the voltage of the word line WLL is kept to the low-level voltage VWLL and those of the source line SLL and the bit line BLL are kept to the ground potential VSL. As a result, the potential of the body B of each memory cell MC becomes negative, so that the body B can hold holes therein.

At t2b, the word line driver WLD activates the voltage of the selected word line WLL to the high-level voltage VWLH. As a result, a channel is formed on a surface of the body B of each memory cell MC. Furthermore, the potential of the body B becomes VB1 higher than the ground potential VSL due to a capacitive coupling between the gate and the body B of the memory cell MC.

Thereafter, at t2c, the voltage of the selected source line SLL corresponding to the selected word line WLL is lowered to the low-level potential VSLL. Namely, the source line driver SLD moves the voltage of the selected source line SLL to an opposite direction to a transition direction of the voltage of the selected word line WLL. Due to this, a forward bias applied to a junction between the source S and the body B of each memory cell MC is relatively high. This forward bias discharges the holes in the body B to the source S. Namely, in the first embodiment, by setting the transition direction of the potential of the selected word line WLL opposite to that of the potential of the selected source line SLL while the data "0" is written to each of the memory cells MC, the forward bias between the source S and the body B is increased using the capacitive coupling between the source S and the body B. Note that potentials of the bit lines BLs are kept to the ground potential VSL between the high-level potential VWLH of the word line WLL and the low-level potential VSLL of the source line SLL.

After end of writing the data "0" to the memory cells MC, the potential of each word line WLL is returned to the low-level potential VWLL at t2d and that of each source line SLL is returned to the ground potential VSL at t2e. Because of sufficient discharge of the holes from the body B, the potential of the body B of each "0" cell is kept to low level. In other words, because of high potential (VWLH) of the word lines WLL at the time of writing the data "0" to the memory cells MC, the potential of the body B is reduced by the capacitive coupling between the gate and the body B of each memory cell MC when the potential of the word line WLL is returned to the low-level potential VWLL. Therefore, in the first embodiment, the different (i.e., signal difference) ΔVbody between the potential of the body B of each "1" cell and that of the body B of each "0" cell can be increased. Moreover, by increasing the forward bias, it is possible to sufficiently discharge the holes from the body B and to reduce the period for writing the data "0" to the memory cells MCs.

Generally, the capacitive coupling between the gate and the body B is large whereas that between the drain D and the body B and that between the source S and the body B are far smaller than that between the gate and the body B. In the first embodiment, therefore, the forward bias can be increased by setting the transition direction of the potential of the selected word line WLL opposite to that of the potential of the selected source line SLL. Namely, in the first embodiment, the forward bias is increased using not only the large capacitive coupling between the gate and the body B but also the small capacitive coupling between the source S and the body B.

Figure 10:
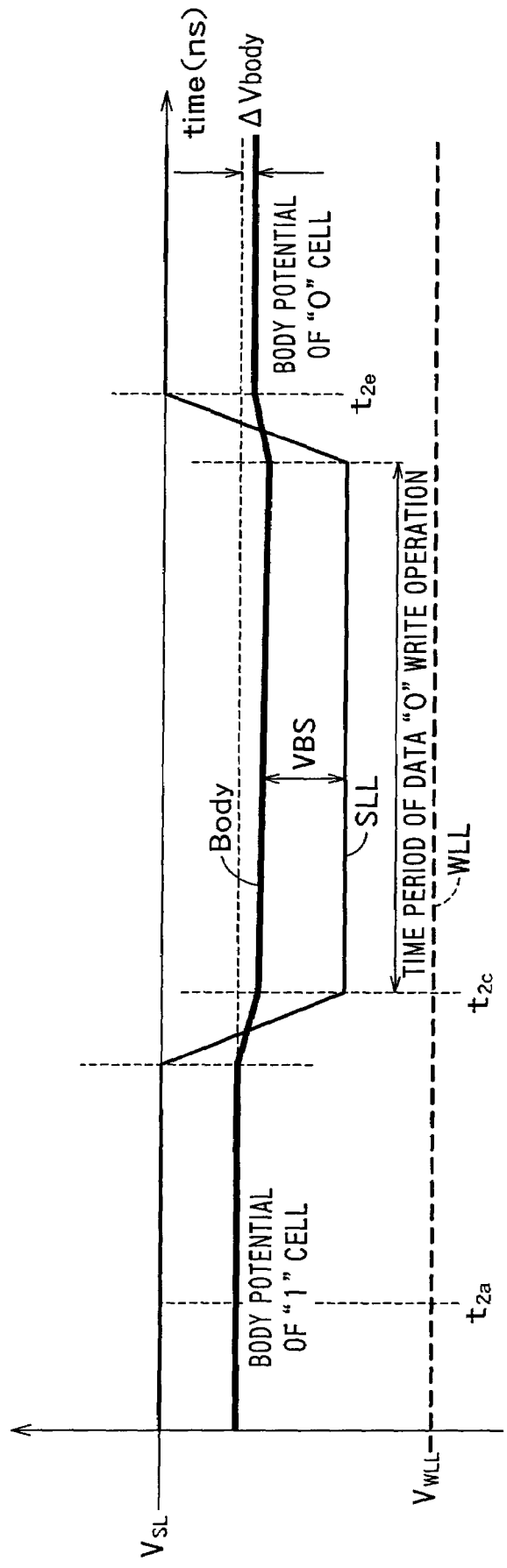
FIGS. 10 and 11 are graphs showing potentials of the respective elements of each memory cell MC at the time of writing data "0" to each memory cell MC according to Non-Patent Documents 1 and 2.
Figure 11:
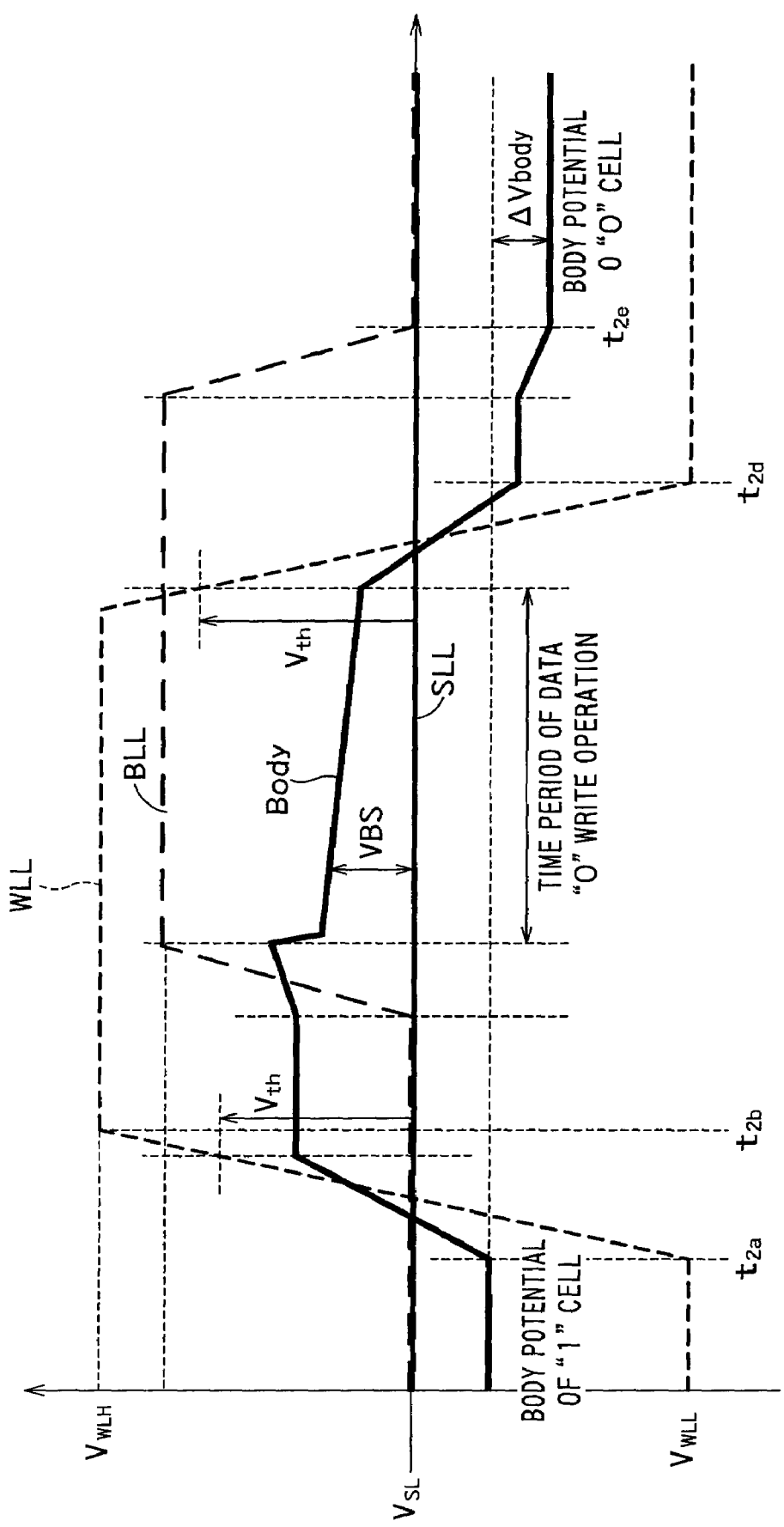

FIGS. 10 and 11 are graphs showing potentials of the respective elements of each memory cell MC at the time of writing data "0" to each memory cell MC according to Non-Patent Documents 1 and 2. In FIG. 10, during the period of writing the data "0", the potential of each word line WLL is kept to the low-level potential VWLL. Since the capacitive coupling between the gate and the body B of each memory cell MC is not used, the forward bias is relatively low. Due to this, it takes long time to discharge holes from the body B. Alternatively, the quantity of holes discharged from the body B is small. In other words, at the time of writing the data "0", the potential of the selected word line WLL is kept to the low-level potential VWLL. Due to this, after writing the data "0" to each memory cell MC, the potential of the body B cannot be reduced using the capacitive coupling between the gate and the body B. As a result, after writing the data "0", the difference ΔVbody between the potential of the body B of each "0" cell and that of the body B of each "1" cell is relatively small.

In FIG. 11, the potentials of the selected word line WLL and the bit lines BLLs are set to high level while keeping the potential of the selected source line SLL to the ground potential VSL, thereby writing data "0" to each memory cell MC. As described above, while the capacitive coupling between the gate and the body B is large, that between the drain D and the body B and that between the source S and the body B are far smaller than that between the gate and the body B. Due to this, if the potential of selected source line SLL is kept to the ground potential VSL, the forward bias cannot be large even by setting the potentials of the selected word line WLL and the bit lines BLLs to high level. As a result, after writing the data "0" to each memory cell MC, the difference ΔVbody between the potential of the body B of each "0" cell and that of the body B of each "1" cell is relatively small similarly to the example of FIG. 10. If the potential of the selected source line SLL is reduced to the negative potential during the period of writing the data "0" to each memory cell MC shown in FIG. 11, the memory cell MC turns into a saturation region, in which state flow of a large amount of current and generation of holes disadvantageously occur.

Figure 12:
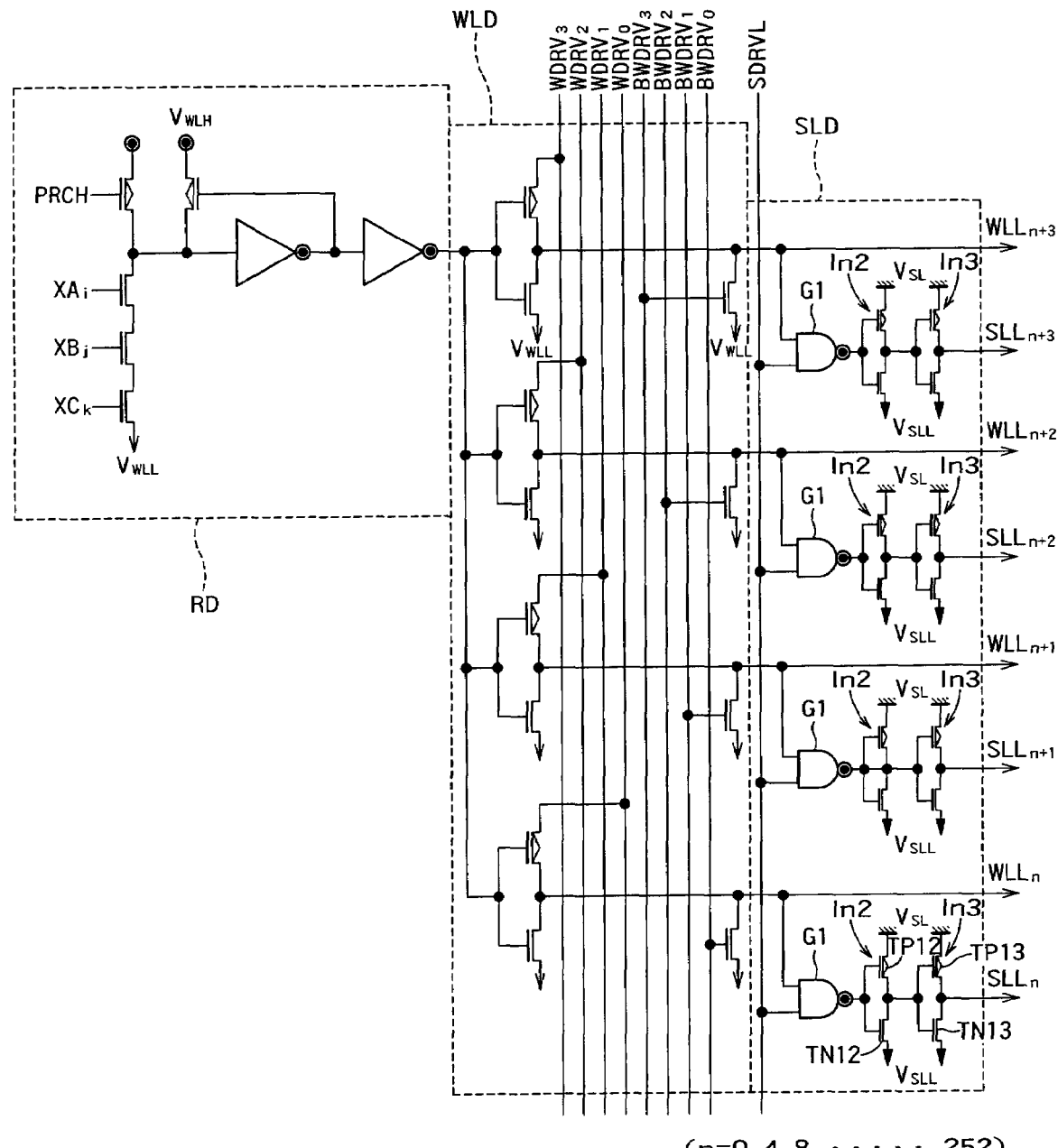
FIG. 12 is a circuit diagram showing a configuration of the source line drivers SLDs other than those shown in FIG. 5.

FIG. 12 is a circuit diagram showing a configuration of the source line drivers SLDs other than those shown in FIG. 5. The row decoder RD and the word line driver WLD shown in FIG. 12 are similar in configuration to those shown in FIG. 5, respectively. Each of the source line drivers SLDs shown in FIG. 12 includes inverters In2 and In3 connected between each source line SLL and the NAND gate G1. The inverter In2 includes an n-type transistor TN12 and a p-type transistor TP12 connected in series between the first source voltage VSL (i.e., ground potential) and the second source voltage VSLL. The inverter In3 includes an n-type transistor TN13 and a p-type transistor TP13 connected in series between the first source voltage VSL (i.e., ground potential) and the second source voltage VSLL. Gates of the n-type transistor TN12 and the p-type transistor TP12 are connected to an output of each gate G1 in common. Gates of the n-type transistor TN13 and the p-type transistor TP13 are connected to a node between the n-type transistor TN12 and the p-type transistor TP12 in common. A node between the n-type transistor TN13 and the p-type transistor TP13 is connected to each source line SLL. Since the operation performed by the source line driver SLD shown in FIG. 12 is similar to that performed by the source line driver SLD shown in FIG. 5, descriptions thereof will be omitted.

In each of the source line drivers SLDs shown in FIGS. 5 and 12, it is necessary to satisfy VSL<VWLH and VSLL>VWLL for the following reasons. Power supply voltages of each gate G1 and each inverter In1 shown in FIG. 5 are VWLH and VWLL, respectively. If the first source voltage VSL is higher than the high-level voltage VWLH, the transistor TN10 is not normally turned on. If the second source voltage VSLL is lower than the low-level voltage VWLL, the transistor TN11 is not normally turned off. Likewise, power supply voltages of each gate G1 and each inverter In1 shown in FIG. 12 are VWLH and VWLL, respectively. If the first source voltage VSL is higher than the high-level voltage VWLH, the transistor TP12 is not normally turned off. If the second source voltage VSLL is lower than the low-level voltage VWLL, the transistor TN12 is not normally turned off. That is why it is necessary to satisfy VWLL<VSLL<VSL<VWLH.

Figure 13:
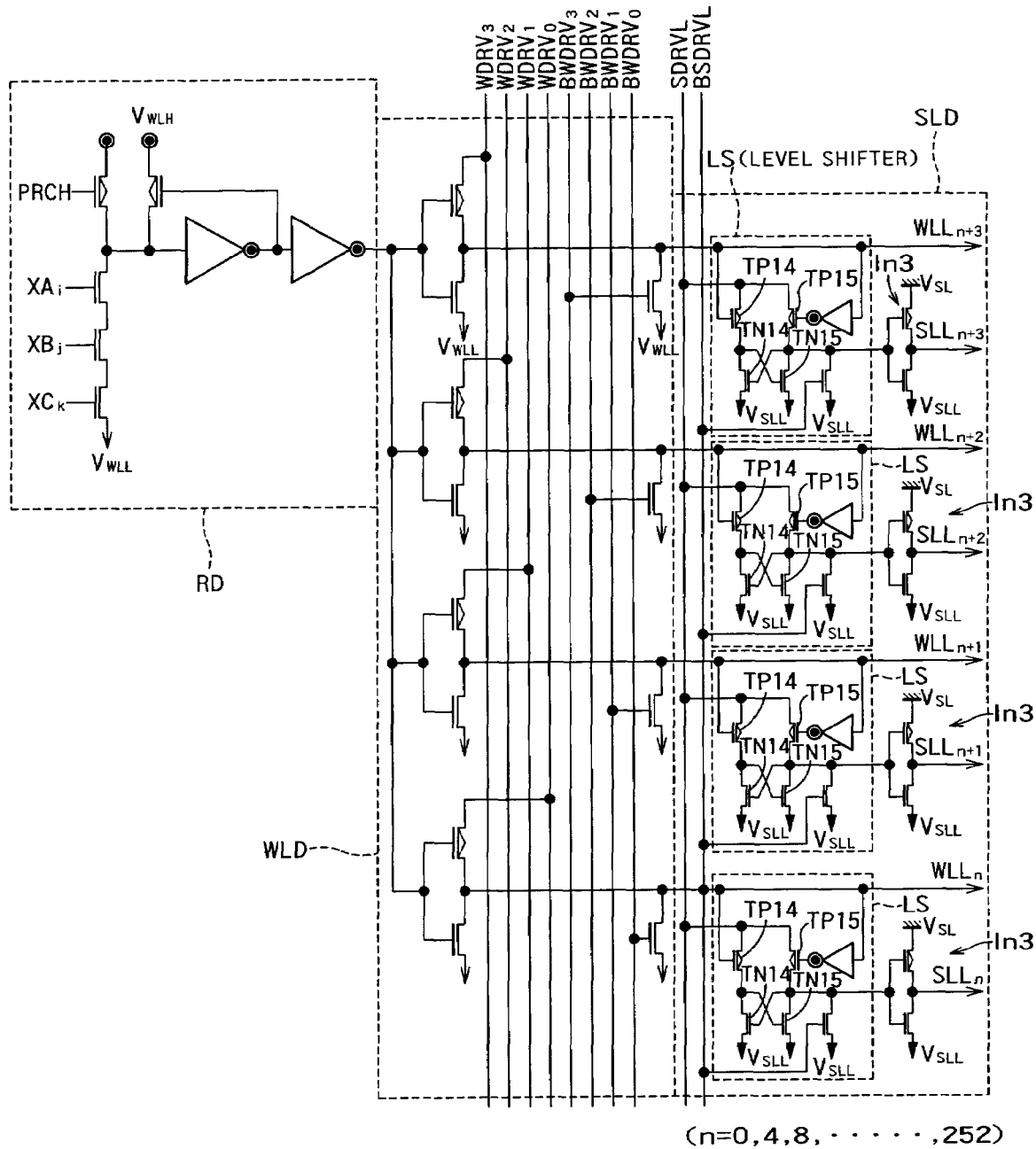
FIG. 13 is a circuit diagram showing a configuration of the source line drivers SLDs other than those shown in FIGS. 5 and 12.

If VSLL<VWLL, for example, it is necessary to add level shifters LSs shown in FIG. 13. The row decoder RD and the word line driver WLD shown in FIG. 13 are similar to those shown in FIG. 5, respectively. Each of the source line drivers SLDs shown in FIG. 13 includes a level shifter LS and an inverter In3. The level shifters LSs is configured to convert the potential VWLL into the potential VSLL and to transmit the potential VSLL to the inverter In3 if the potential of the selected word line WLL is VWLL. The level shifter LS includes a p-type transistor TP14 and an n-type transistor TN14 connected in series between the source drive line SDRVL and the second source voltage VSLL, and a p-type transistor TP15 and an n-type transistor TN connected in series between the source drive line SDRVL and the second source voltage VSLL. A gate of the transistor TP14 is connected to each word line WLL. A gate of the transistor TP15 receives an inverted signal of the signal on the word line WLL. A gate of the transistor TN14 is connected between the transistors TP15 and TN15, and a gate of the transistor TN15 is connected to a node between the transistors TP14 and TN14. By so configuring, if the potential of the selected word line WLL is VWLH, the level shifter LS outputs the voltage of the source drive line SDRVL (which is the high-level voltage VWLH during a selection operation) to the inverter In3. If the potential of the selected word line WLL is the low-level voltage VWLL, the level shifter LS outputs the second source voltage VSLL to the inverter In3. In this manner, even if the second source voltage VSLL is lower than the low-level voltage VWLL, the source lines SL can be normally driven by using the source line driver SLD shown in FIG. 13.

Furthermore, if VSL>VWLH, the level shifters SLs shown in FIG. 13 can be applied. Since a configuration of each of the applied level shifters SLs is obvious from that of the level shifters SLs shown in FIG. 13, descriptions thereof will be omitted. Moreover, the row decoder RD, the word line driver WLD, and the source line drivers SLDs connected to the word lines WLLs and the source lines SLLs on the left of the sense amplifiers S/As have been described. Likewise, the row decoder RD, the word line driver WLD, and the source line drivers SLDs similar to those described above are connected to the word lines WLRs and the source lines SLRs on the right of the sense amplifiers S/As. In this case, source drive lines SDRVR and BSDRVR are used in place of the source drive lines SDRVL and BSDRVL, respectively.

FIGS. 14 to 17 are layout diagrams showing positional relationships among the memory cell array MCAL, the row decoder RD, the word line driver WLD, and the source line driver SLD. Positional relationships among the memory cell array MCAR, the row decoder RD, the word line driver WLD, and the source line driver SLD are shown in FIGS. 14 to 17 except for replacing the memory cell array MCAL by the memory cell array MCAR. Therefore, the positional relationships among the memory cell array MCAR, the row decoder RD, the word line driver WLD, and the source line driver SLD will not be described herein. It is to be noted, however, the layouts shown in FIGS. 14 to 17 are only examples and various other layouts can be adopted.

Figure 14:
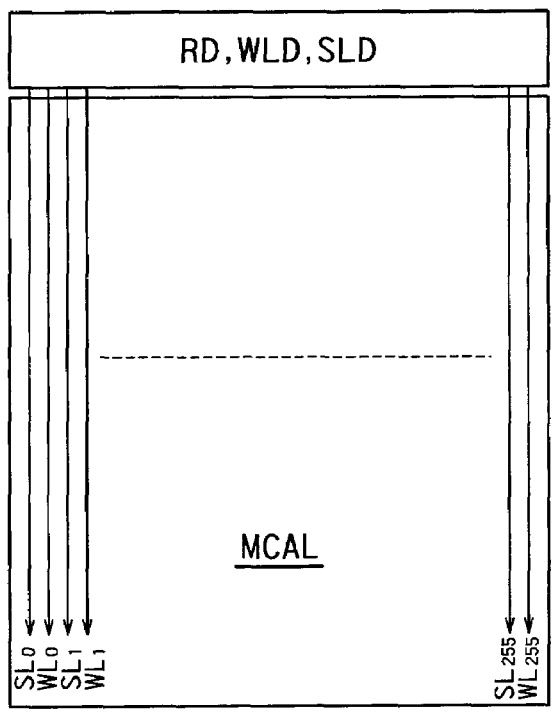
FIGS. 14 to 17 are layout diagrams showing positional relationships among the memory cell array MCAL, the row decoder RD, the word line driver WLD, and the source line driver SLD.

In FIG. 14, the row decoder RD, the word line driver WLD, and the source line driver SLD are arranged on one side of the memory cell array MCAL. In this case, the circuits shown in FIGS. 5 and 12 can be applied as they are.

Figure 15:
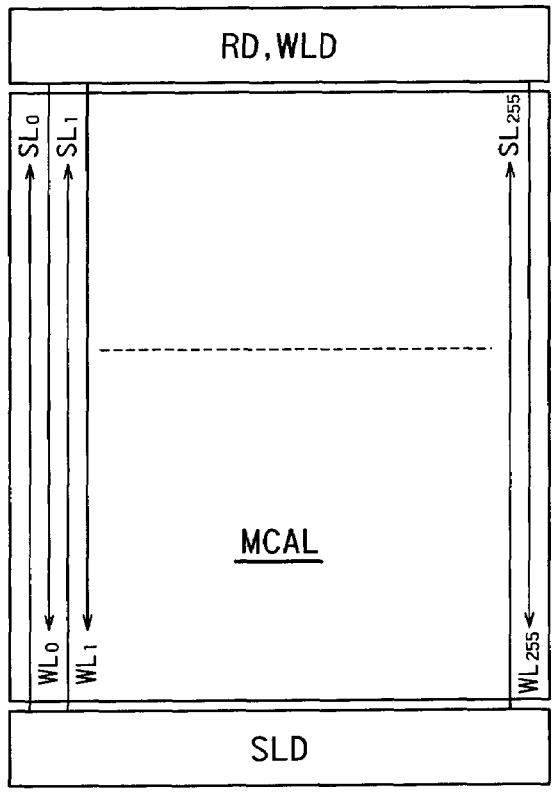

In FIG. 15, the row decoder RD and the word line driver WLD are arranged on one side of the memory cell array MCAL whereas the source line driver SLD is arranged on the opposite side thereof. In the layout shown in FIG. 15, the source lines SLLs are driven from the opposite side to the word lines WLLs in relation to the memory cell array MCAL.

Figure 16:
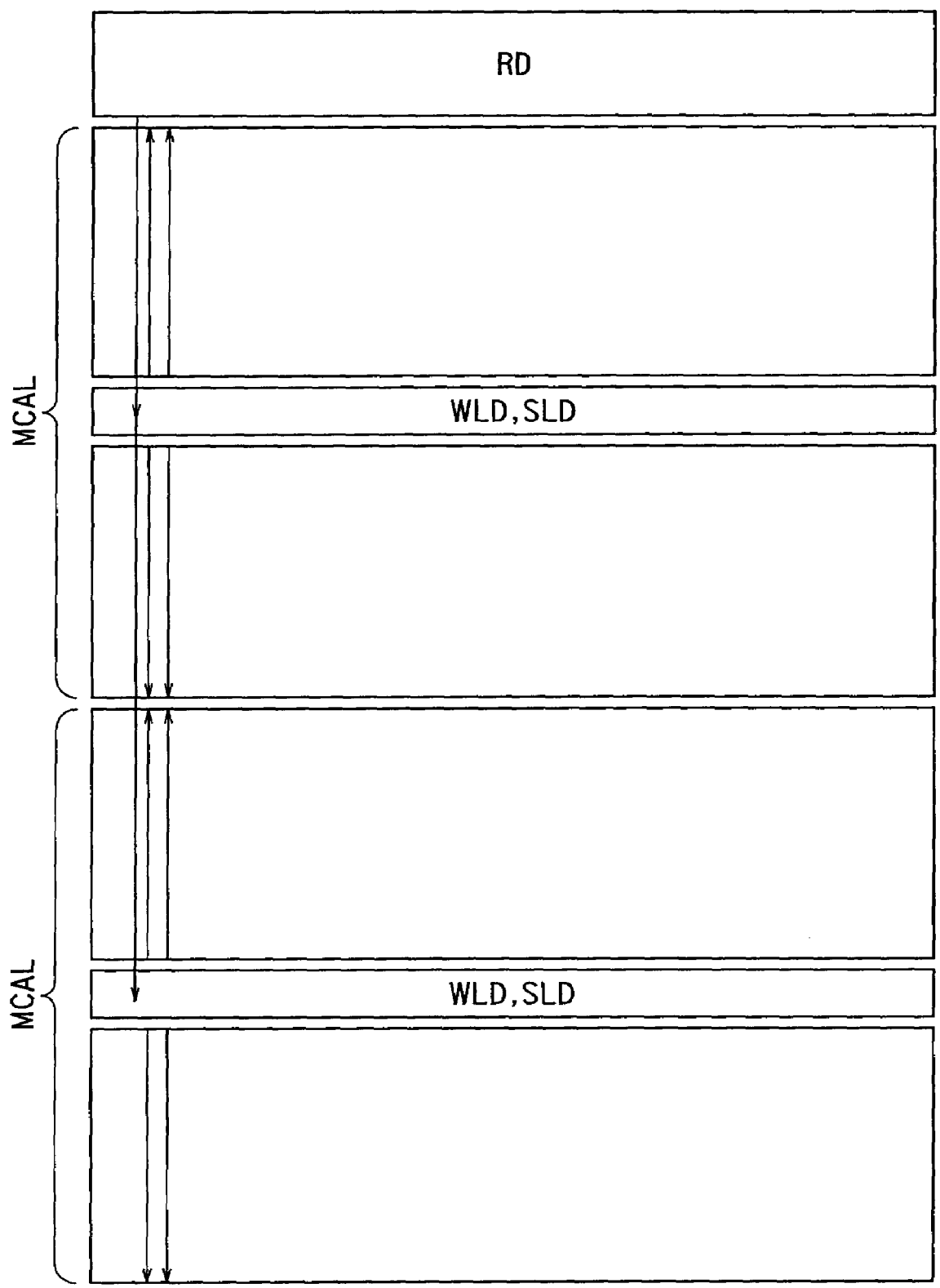

In FIG. 16, the row decoder RD is used in common for a plurality of memory cells arrays MCALs arranged in the row direction, and the word line driver WLD and the source line driver SLD are arranged at the center of each of the memory cells arrays MCALs. The common row decoder RD is connected to a plurality of word line drivers WLDs and a plurality of source line drivers SLDs.

Figure 17:
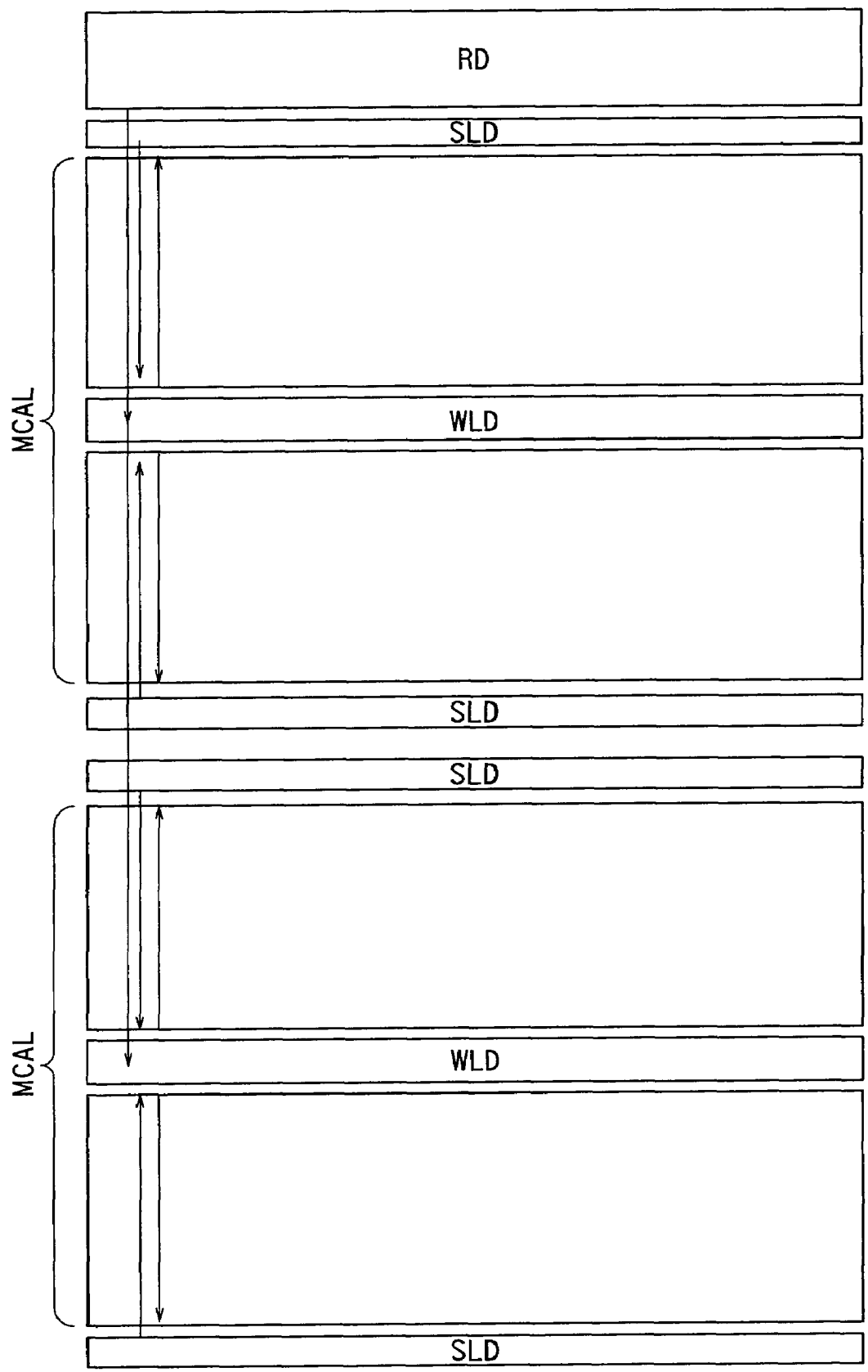

In FIG. 17, the layout is similar to that shown in FIG. 16 except that the source line drivers SLDs are arranged on both sides of each of the memory cells arrays MCALs. In the layout shown in FIG. 17, the source lines SLs are driven from the opposite side to the word lines WLs with respect to the memory cell array MCAL.

In FIGS. 16 and 17, the two memory cell arrays MCALs are arranged in the row direction. Alternatively, three or more memory cell arrays MCALs can be arranged in the row direction. In this alternative, the row decoder RD is used in common similarly to FIGS. 16 and 17 except that the word line drivers WLDs and the source line drivers SLDs are provided to correspond to the respective memory cell arrays MCALs.

Second Embodiment

Figure 18:
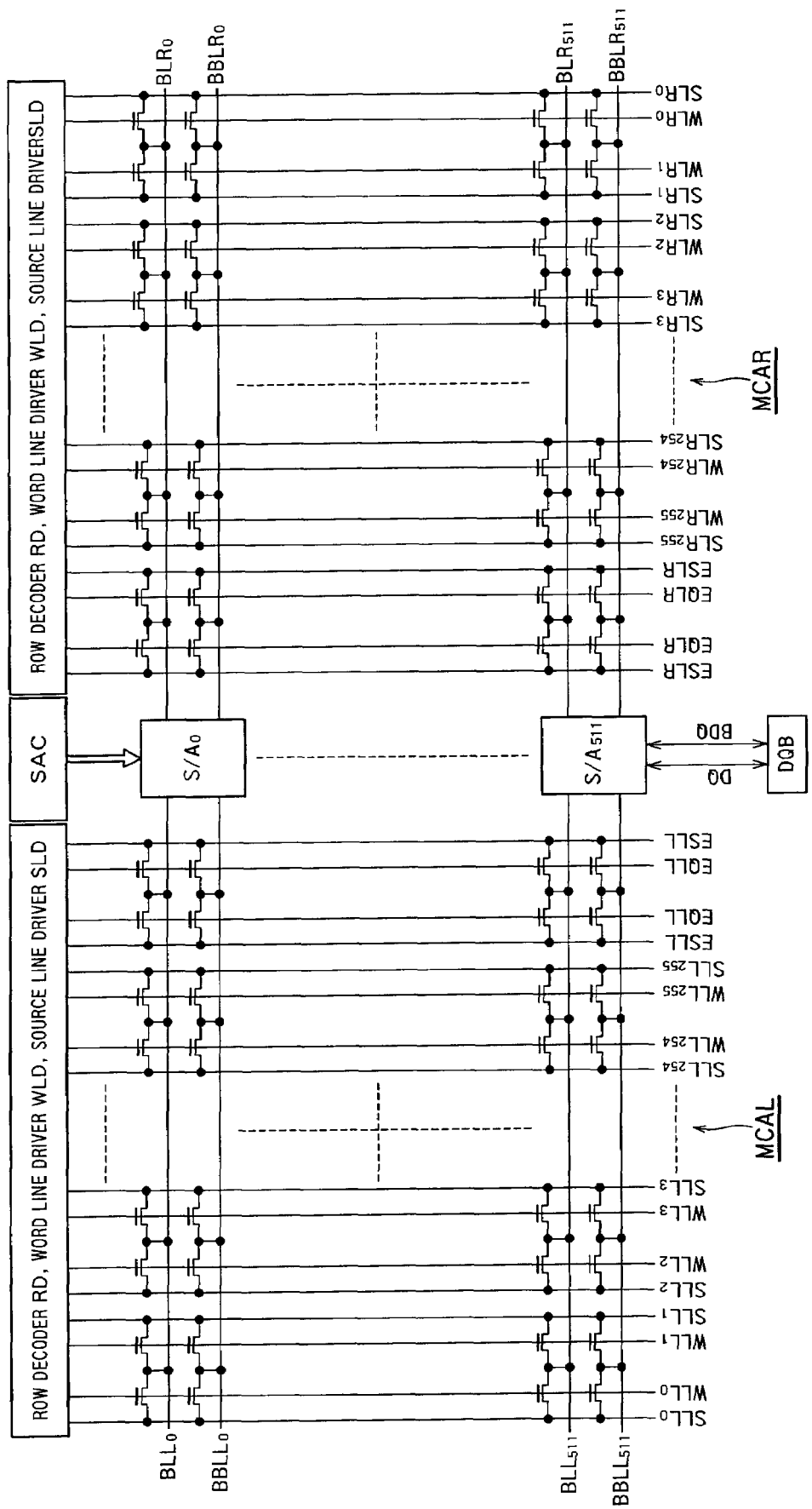
FIG. 18 shows a configuration of an FBC memory device according to a second embodiment of the present invention.

FIG. 18 shows a configuration of an FBC memory device according to a second embodiment of the present invention. The FBC memory device shown in FIG. 18 has a so-called 2 cell/bit configuration. Namely, two adjacent bit lines BLL and BBLL, which serve as one bit line pair (hereinafter, "paired bit lines"), are connected to one sense amplifier S/A. Paired bit lines BLR and BBLR corresponding to the paired bit lines BLL and BBLL are connected to the same sense amplifier S/A. The paired bit lines BLL and BBLL and the paired bit lines BLR and BBLR are connected to a pair of cells which store therein one-bit data, respectively. Using one of the paired bit lines BLL and BBLL as a reference, each sense amplifier S/A detects the data stored in the pair of cells. Alternatively, using one of the paired bit lines BLR and BBLR as a reference, each sense amplifier S/A detects the data stored in the cell connected to the other bit line. Therefore, the paired bit lines BLL and BBLL transmit data having reversed polarities with respect to each other, and the paired bit lines BLR and BBLR transmit data having reversed polarities with respect to each other. The data having reversed polarities mean data (complementary data) opposite in logic value such as data "1" and "0". Two memory cells MCs arranged at cross points between one word line WLL and the paired bit lines BLR and BBLR, respectively store therein data having reversed polarities with respect to each other. Namely, the two memory cells MCs store therein one-bit data. Since each sense amplifier S/A uses one of the paired bit lines BLL and BBLL as a reference and detects the data stored in the other bit line, it is possible to dispense with dummy cells DCs, dummy word lines DWLs, averaging transistors TAVs, and averaging lines AVL and AVR in the FBC memory device according to the second embodiment. Other configurations of the FBC memory device according to the second embodiment are similar to those of the FBC memory device according to the first embodiment.

Figure 19:
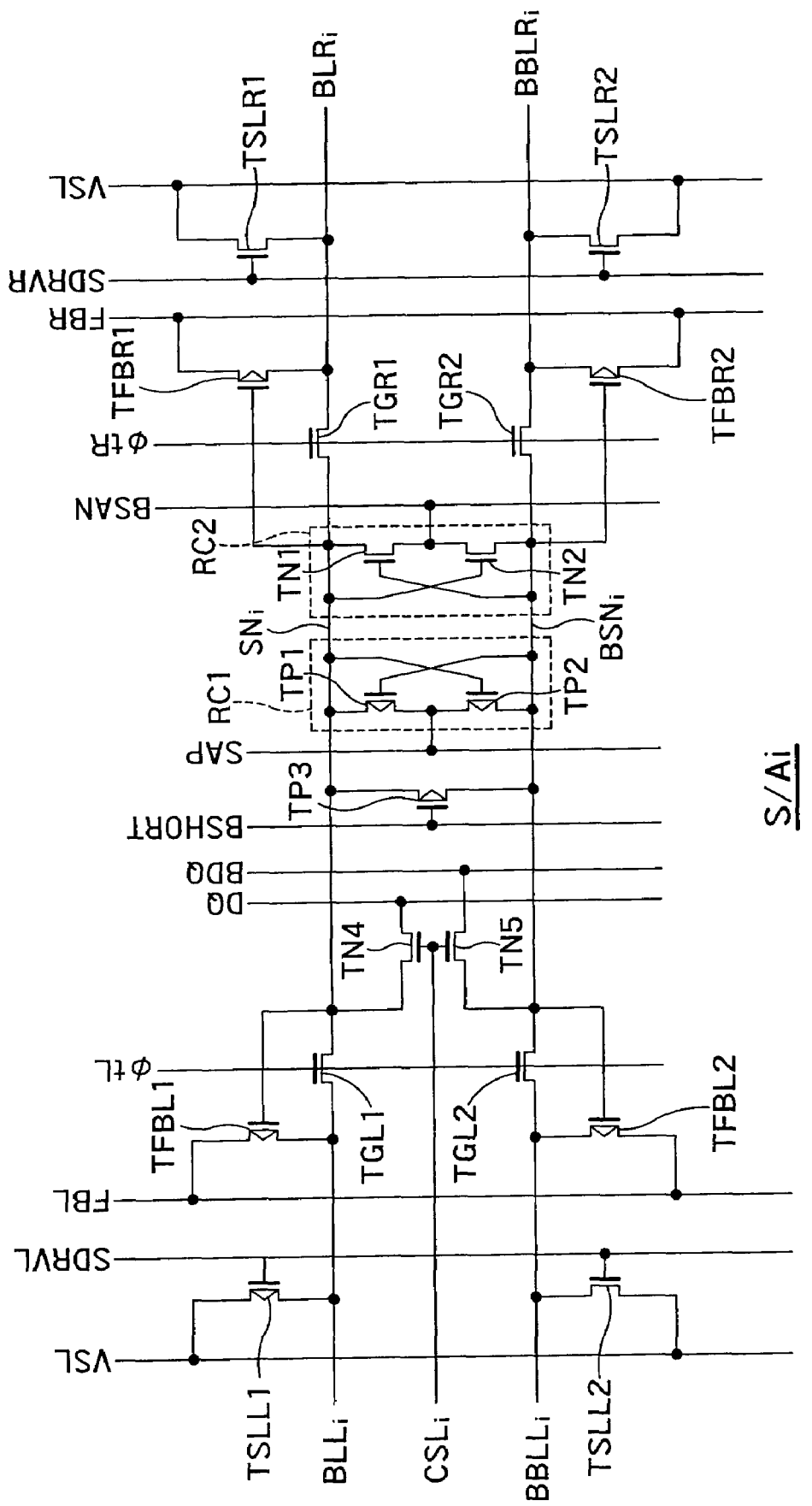

FIG. 19 is a circuit diagram showing a configuration of each of the sense amplifiers S/As. Each sense amplifier S/A includes paired sense nodes SNi (hereinafter, also "SN") and BSNi (hereinafter, also "BSN") corresponding to the paired bit lines BLLi and BBLLi, respectively. Latch circuits RC1 and RC2 and a transistor TP3 connected between the paired sense nodes SNi and BSNi can be similar in configuration to those according to the first embodiment, respectively. The constituent elements of the sense amplifier S/A other than the latch circuits RC1 and RC2 and the transistor TP3 are almost bilaterally symmetric. Accordingly, the configuration of the sense amplifier S/A on the paired bit lines BLL and BBLL will be described herein while that on the paired bit lines BLR and BBLR will not be described herein.

The sense node SN is connected to the bit line BLL via a transfer gate TGL1. The sense node BSN is connected to the bit line BBLL via a transfer gate TGL2. The transfer gates TGL1 and TGL2 are controlled to be turned on or off by a signal ΦtL. The transfer gates TGL1 and TGL2 are switched to be turned off after end of detecting data and kept to be turned off during a data write operation.

A feedback transistor TFBL1 is connected between a feedback line FBL and one bit line BLL. A feedback transistor TFBL2 is connected between the feedback line FBL and one bit line BBLL. Gates of the feedback transistors TFBL1 and TFBL2 are connected to the sense nodes SN and BSN, respectively. The feedback transistors TFBL1 and TFBL2 are transistors switched to be turned on during the data write operation. The feedback transistors TFBL1 and TFBL2 are p-type transistors. The reason is the same as that described in the first embodiment.

A transistor TSLL1 is connected between a source voltage line VSL and one bit line BLL whereas a transistor TSLL2 is connected between the source voltage line VSL and one bit line BBLR. Gates of the transistors TSLL1 and TSLL2 are connected to a source drive line SDRVL. The transistors TSLL1 and TSLL2 are provided to avoid disturbance to unselected memory cells MCs by setting potentials of the bit lines BLL and BBLL to a source potential VSL when the data "0" is written to the memory cells MCs.

Row decoders RDs, word line drivers WLDs, and source line drivers SLDs can be similar in configuration to those according to the first embodiment, respectively.

Figure 20:
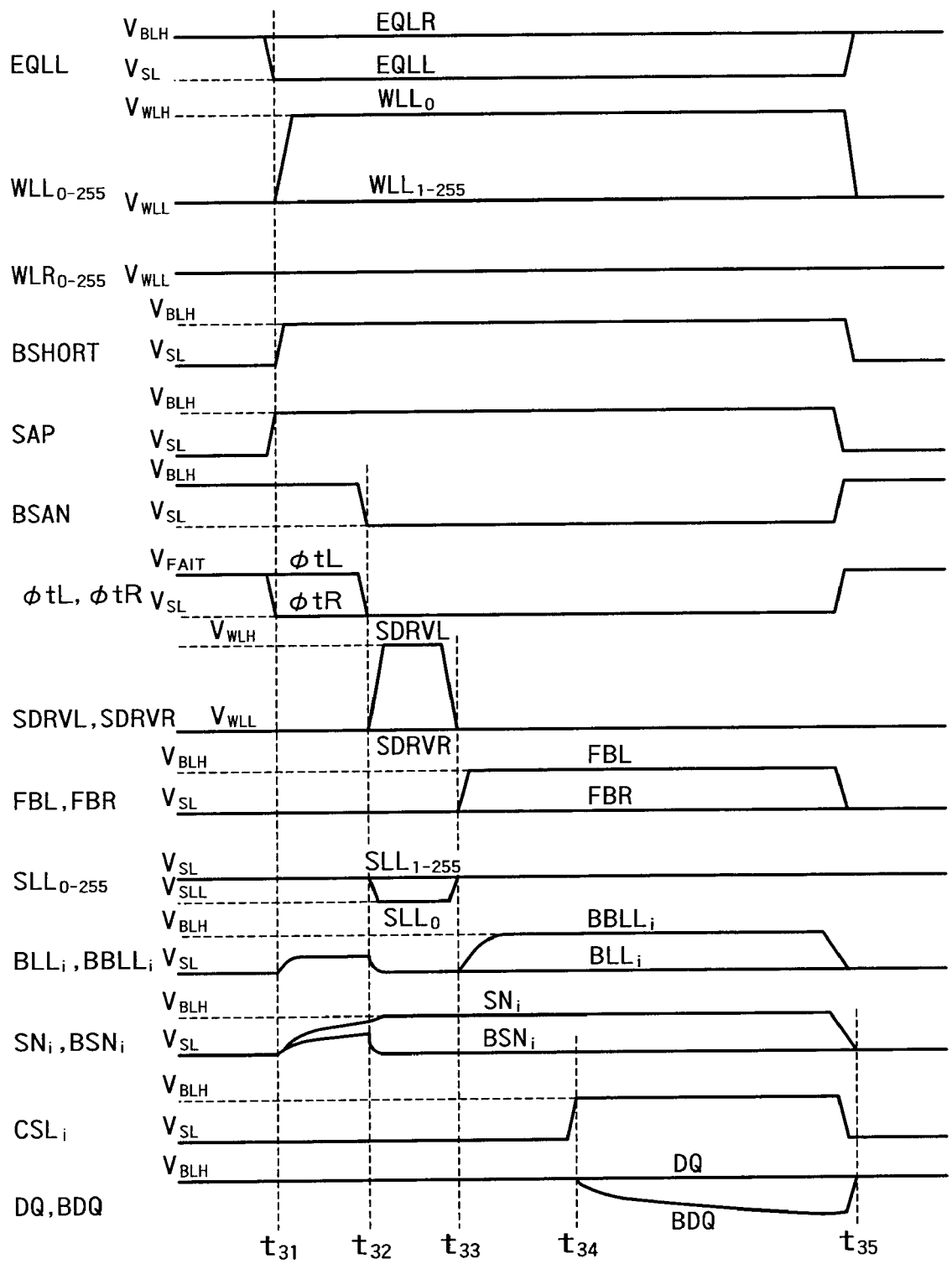
FIG. 20 is a timing diagram showing the data read operation performed by the FBC memory device according to the second embodiment.

FIG. 20 is a timing diagram showing the data read operation performed by the FBC memory device according to the second embodiment. In the second embodiment, the sense amplifiers S/As detect data in the memory cell array MCAL. Since an operation for detecting the data in the memory cell array MCAR is evident from that for detecting data in the memory cell array MCAL, descriptions thereof will be omitted.

Before t31, the FBC memory device is in a precharge state. In the precharge state, equalizing lines EQLLs and EQLRs and signals ΦtL and ΦtR are all active. Accordingly, voltages of the paired bit lines BLLs and BBLLs, the paired bit lines BLRs and BBLRs, and the paired sense nodes SNs and BNs are fixed to a first source voltage VSL.

At t31, the equalizing lines EQLLs are deactivated and the FBC memory device moves from the precharge state to the data read operation. It is assumed that a word line WLL0 is selectively activated. At this time, the signal ΦtR is deactivated, and the paired bit lines BBRs and BBLRs are disconnected from the sense amplifiers S/As. Furthermore, a signal BSHORT is deactivated to high level, thus disconnecting the sense nodes SNs from the respective sense nodes BSNs. In addition, a signal SAP is activated. As a result, a high-level voltage VBLH is connected to the sense nodes SNs and BSNs, and a load current is applied to the memory cells MCs via the bit lines BLLs and BBLLs. As shown in the timing diagram of FIG. 20, from t31 to t32, this load current raises potential of the sense nodes SNs and BSNs. A potential difference (i.e., signal difference) is generated between the sense nodes SNs and BSNs by the positive feedback of the latch circuits RC1.

Thereafter, at the time (t32) at which the signal difference sufficiently grows between the sense nodes SNs and BSNs, the signal ΦtL is deactivated to low level and the signal BSAN is activated. By deactivating the signal ΦtL, the paired sense nodes SNs and BSNs are disconnected from the bit lines BLLs and BBLLs, respectively. By activating the signal BSAN, each latch circuit RC2 amplifiers and latches the signal difference generated between the sense nodes SN and BSN.

Right after the signal ΦtL is deactivated, the source drive line SDRVL is activated to high level. The source drive line SDRVL determines a timing of driving the source drivers SLD. Accordingly, by activating the source drive line SDRVL, the source line drivers SLDs are driven and each of the transistors TSLL1 and TSLL2 shown in FIG. 19 is switched to be turned on. When the source line driver SLD is driven, a selected source line SLL0 is connected to the low-level voltage VSLL. Further, in FIG. 19, when each of the transistors TSLL1 and TSLL2 is turned on, the ground potential VSL is connected to the paired bit lines BLL and BBLL. Namely, from t32 to t33, the high-level voltage VWLH is applied to the gates G of all the memory cells MCs connected to the selected word line WWL0, a negative voltage VSLL is applied to source layers S thereof, and the ground potential VSL is applied to drains D thereof. As a result, data "0" is written to all the memory cells MCs connected to the selected word line WWL0.

After deactivating the source drive line SDRVL, a feedback signal FBL is activated to high level from t33 to t34. Each of the feedback transistors TFBL1 and TFBL2 shown in FIG. 19 is turned on when the sense nodes SN and BSN are at low level, respectively. Since the sense nodes SNs and BSNs latch the data having reversed polarities with respect to each other, one of the feedback transistors TFBL1 and TFBL2 is turned on. If the sense nodes SNs latch the data "1" and the sense nodes BSNs latch the data "0", the sense nodes SNs are at low level and the sense nodes BSNs are at high level. Due to this, only the transistors TFBL1s are turned on to connect the high-level feedback signal FBL to the bit lines BLLs. As a result, the data "1" is written to only the memory cells MCs that have been "1" cell before data "0" is written. In this manner, from t32 to t34, the sense amplifiers S/As restore data in the memory cells MCs. The subsequent operation from t34 to t35 is similar to that from t4 to t5 shown in FIG. 6.

Figure 21:
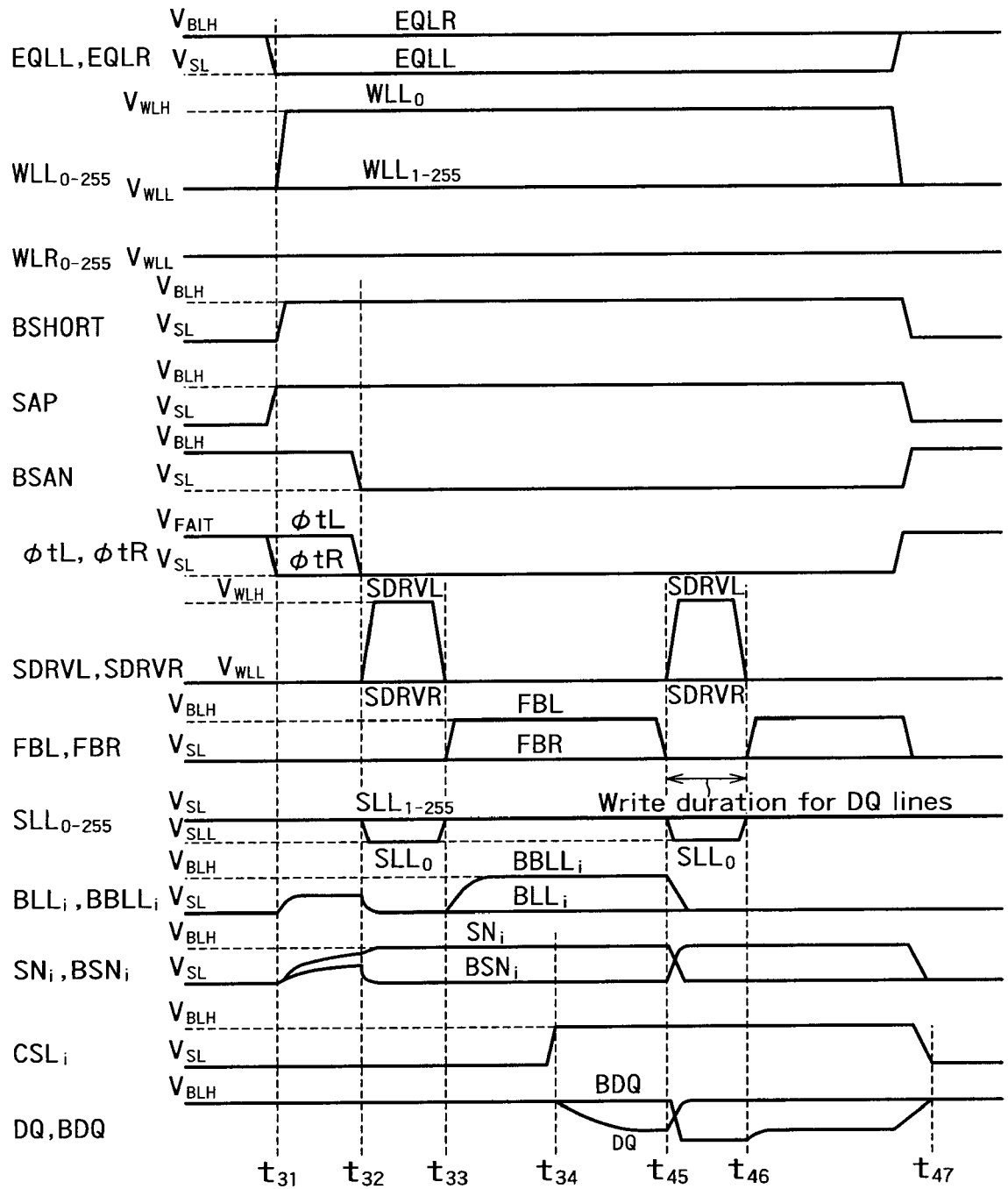
FIG. 21 is a timing diagram showing a normal data write operation performed by the FBC memory device according to the second embodiment.

FIG. 21 is a timing diagram showing a normal data write operation performed by the FBC memory device according to the second embodiment. In the normal data write operation, at t45, write data is input to the DQ buffer DQB from the outside. The normal data write operation from t31 to t45 is, therefore, similar to that the data read operation from t31 to t35 shown in FIG. 20. Moreover, the normal data write operation from t45 to t47 is similar to that the normal data write operation from t15 to t17 shown in FIG. 17.

Figure 22:
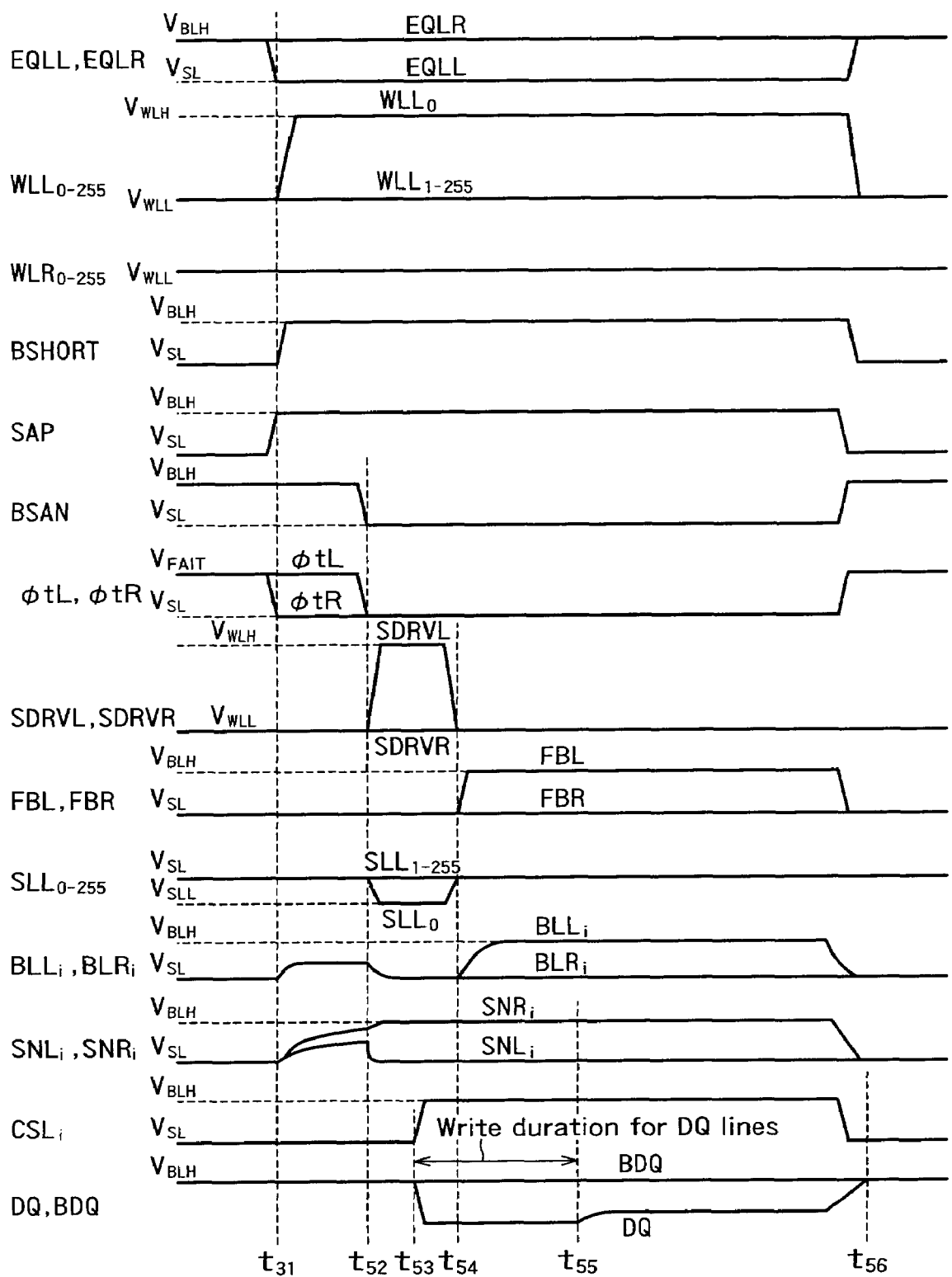
FIG. 22 is a timing diagram showing an early write operation performed by the FBC memory device according to the second embodiment.

FIG. 22 is a timing diagram showing an early write operation performed by the FBC memory device according to the second embodiment. In the early write operation, from t52 to t53, the column selection lines CSLi are activated while data "0" is being written to the memory cell MCs and write data is input from the outside to the DQ buffer DQB. Therefore, the data write operation from t31 to t52 is similar to the data read operation from t31 to t32 shown in FIG. 20. Moreover, the data write operation from t52 to t56 is similar to the data write operation from t25 to t26 shown in FIG. 8. In this manner, the present invention is applicable to the 2 cell/bit FBC memory device.

Third Embodiment

In the first and second embodiments, the two adjacent memory cells MCs share the drain D therebetween. The source S is provided per memory cell MC, and the source line contact SLC is provided per memory cell MC, accordingly. In a third embodiment of the present invention, two adjacent memory cells MCs share a source S and a source line SL therebetween. Accordingly, a source line contact SLC is shared between two adjacent memory cells MCs.

Figure 23:
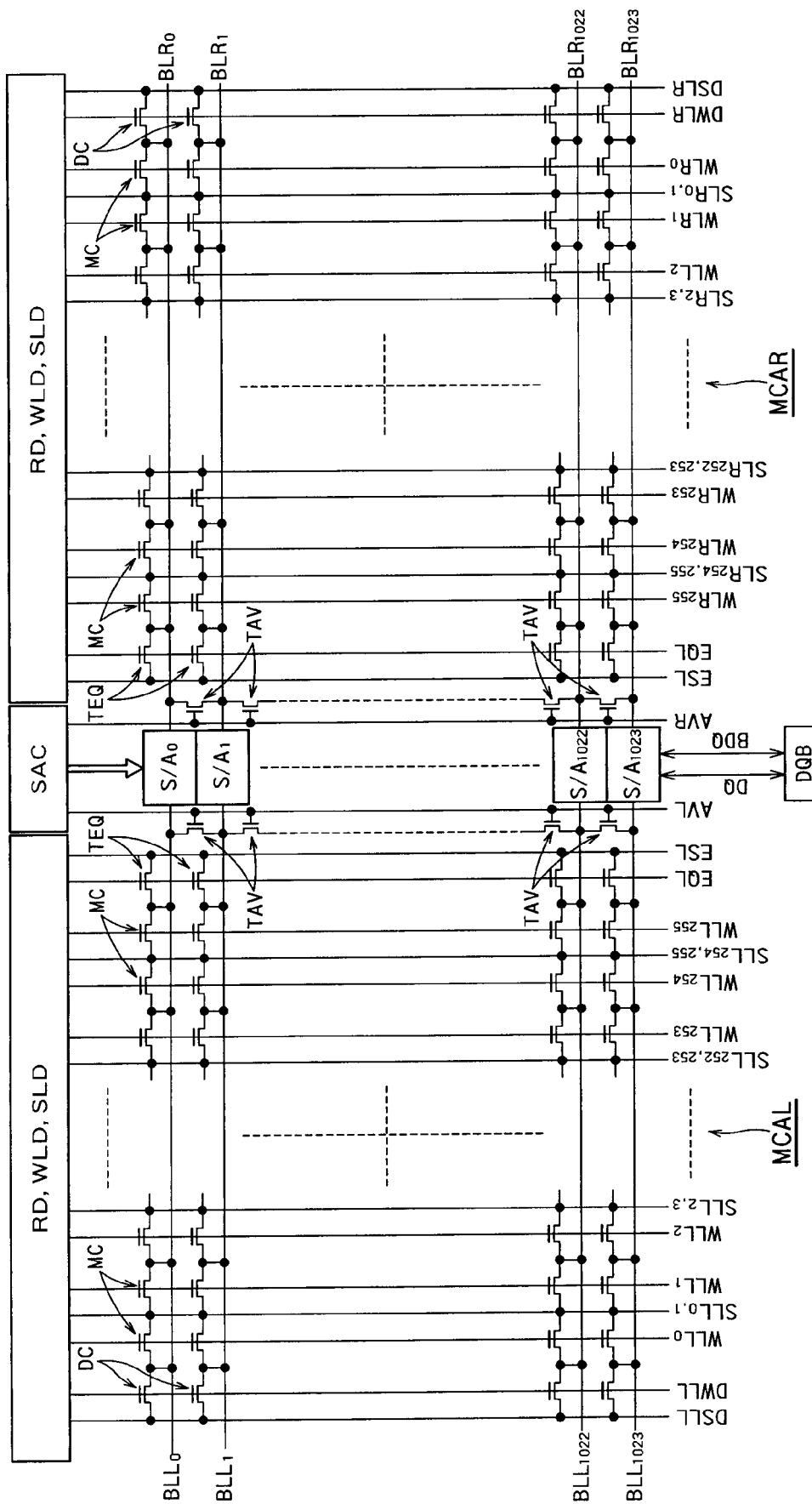
FIG. 23 shows a configuration of an FBC memory device according to the third embodiment.

FIG. 23 shows a configuration of an FBC memory device according to the third embodiment. In the third embodiment, two adjacent memory cells MCs share a source line SL therebetween. Other configurations of the FBC memory device according to the third embodiment can be similar to those of the FBC memory device according to the first embodiment shown in FIG. 1. Dummy cells DCs and equalizing transistors TEQs can be arranged on an arbitrary end of each memory cell arrays MCAs.

Figure 24:
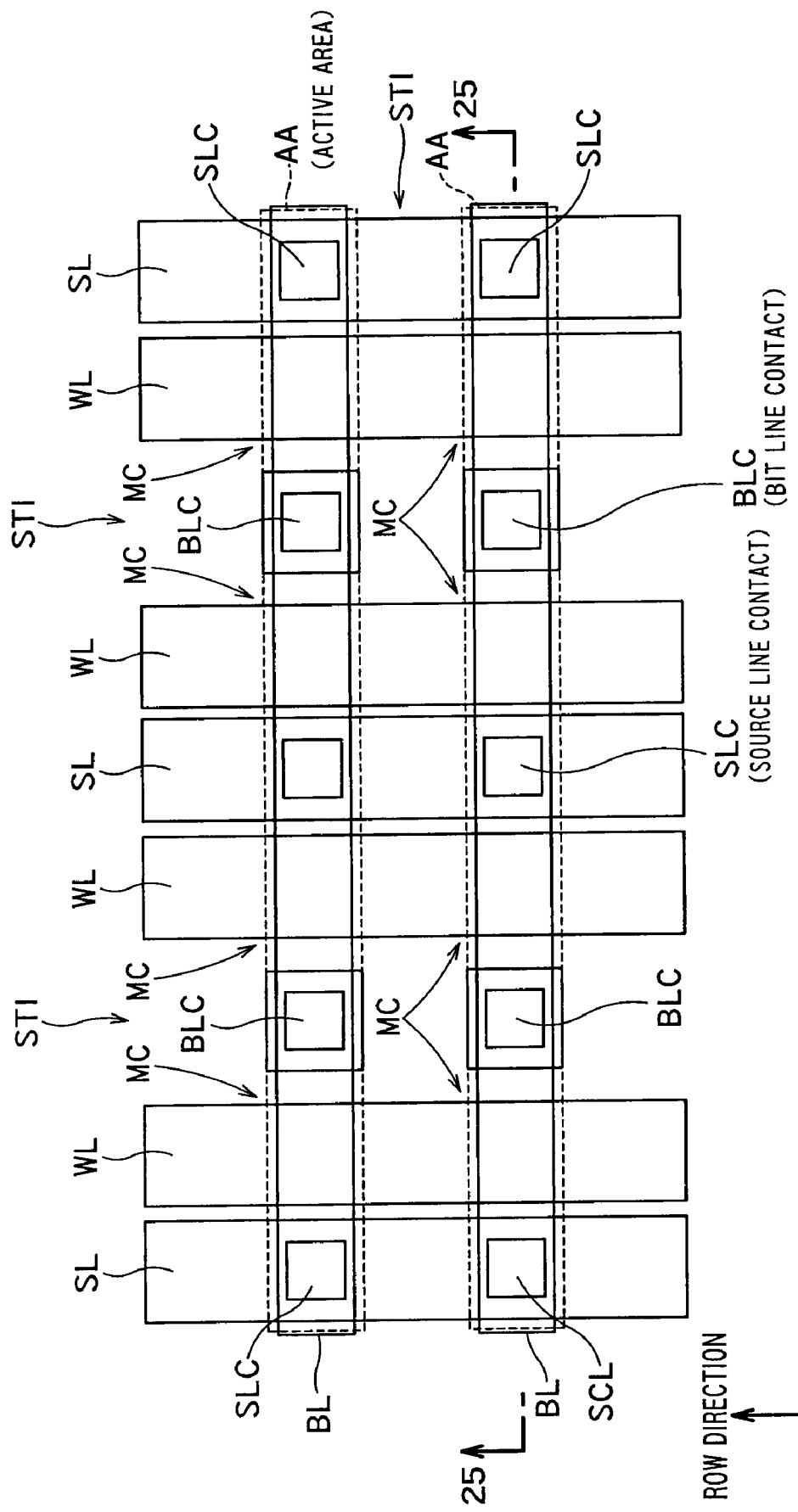
FIG. 24 is a plan view showing eight memory cells MCs in more detail.
Figure 25:
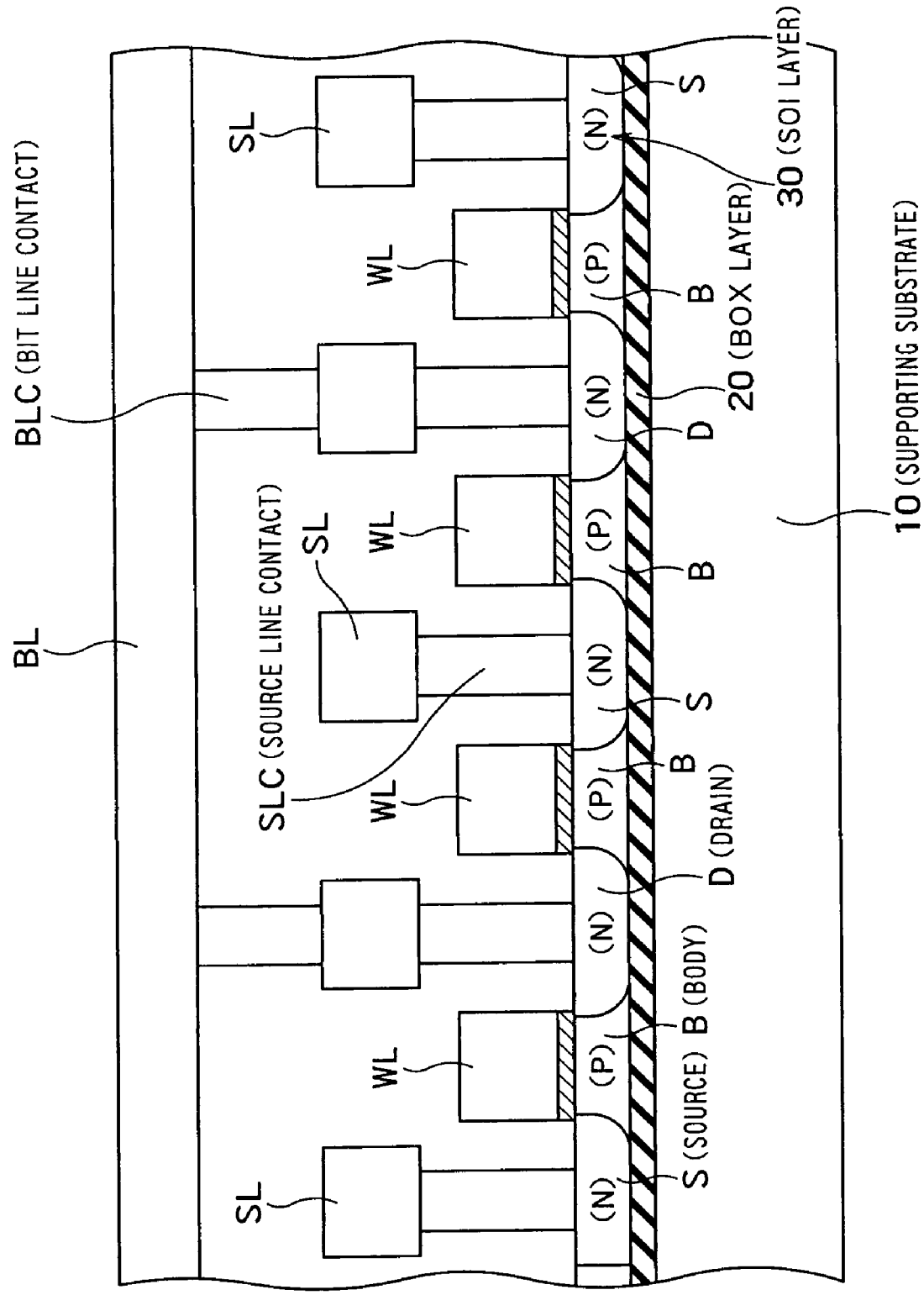
FIG. 25 is a cross-sectional view taken along a line 25-25 shown in FIG. 24.

FIG. 24 is a plan view showing eight memory cells MCs in more detail. FIG. 25 is a cross-sectional view taken along a line 25-25 shown in FIG. 24. A drain layer D of each of the memory cells MCs is connected to one bit line BL via a bit line contact BLC. The bit line contact BLC is shared between two memory cells MCs adjacent in a column direction. A source layer S of each of the memory cells MCs is connected to one source line SL via a source line contact SLC. The source line contact SLC is shared between two memory cells MCs adjacent in the column direction similarly to the bit line contact BLC. Due to this, as shown in FIG. 25, an element isolation region STI does not appear in a cross section taken along the bit line BL. Other configurations of each memory cell MC are similar to those described with reference to FIG. 3.

With the technique disclosed in the Non-Patent Document 1, the potential of the selected source line is lowered while keeping potentials of all word lines to the negative potential. In this case, if common source lines are used, holes are extracted from adjacent unselected memory cells. It is, therefore, required to provide an element isolation region between sources of adjacent memory cells and to separately arrange source lines.

In the third embodiment, by contrast, a potential of a selected word line WLL is raised to a high-level potential VWLH. Potentials of unselected word lines remain low-level potential VWLL. Therefore, even if a selected source line SLL is common to two memory cells MCs adjacent in the column direction, a potential of a body of each selected memory cell MC is higher than that of a body of each unselected memory cell MC. As a result, even if the source line SLL is common to two memory cells MCs adjacent in the column direction, data "0" can be selectively written to one of the memory cells MCs.

In the third embodiment, since there is no need to provide the element isolation region STI between the source layers S of the adjacent memory cells MCs, a size of each memory cell MC can be made small accordingly. Furthermore, since the source lines SL are common to the adjacent memory cells MCs, the number of source lines SL can be decreased accordingly. The FBC memory device according to the third embodiment can, therefore, realize higher density.

Figure 26:
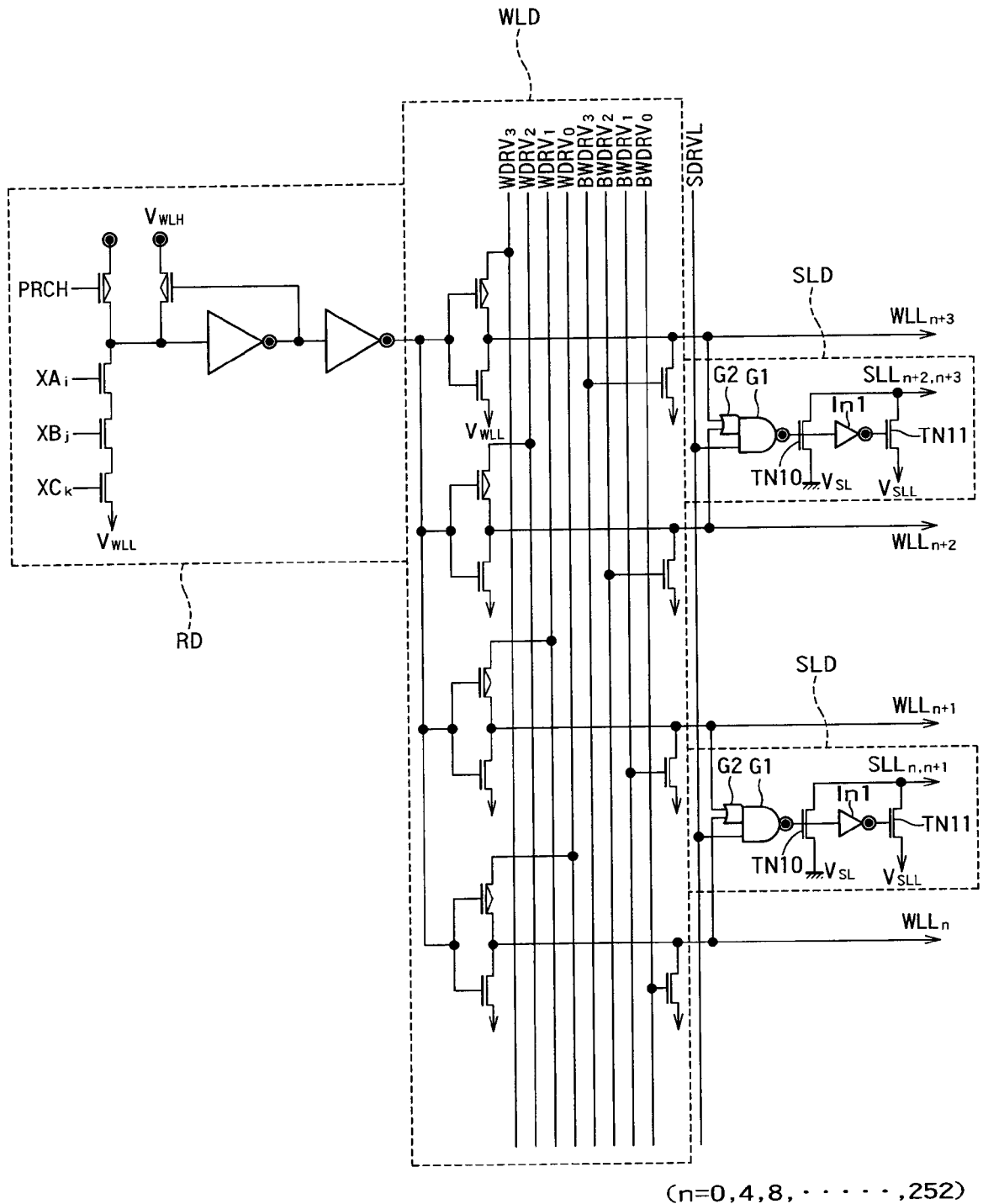
FIG. 26 is a circuit diagram showing a configuration of source line drivers SLDs according to the third embodiment.

FIG. 26 is a circuit diagram showing a configuration of source line drivers SLDs according to the third embodiment. A row decoder RD and a word line driver WLD shown in FIG. 26 can be similar to those shown in FIG. 5, respectively. The source line drivers SLDs are alternately arranged between two adjacent word lines WLs. In FIG. 26, the source line drivers SLDs are connected between word lines WLLn and WLLn+1 and between the word lines WLLn+2 and WLLn+3, respectively.

Each source line driver SLD include an OR gate G2 to which signals on the two adjacent word lines WLs are input and which outputs an OR operation result to a gate G1. Other constituent elements of the source line driver SLD can be similar to those shown in FIG. 5. By so configuring the source line drivers SLDs, when one of the adjacent word lines WLs is activated, the source line SL present between the adjacent word lines WLs is activated.

Alternatively, the constituent elements of the source line driver SLD other than the OR gate G2 can be similar to those of the source line driver SLD shown in FIG. 12. Further, if level shifter LS shown in FIG. 13 is applied to the third embodiment, an output of the OR gate G2 can be applied to a gate of a transistor TP4 and an inverted output of the transistor TP4 can be applied to a gate of a transistor TP5.

Figure 27:
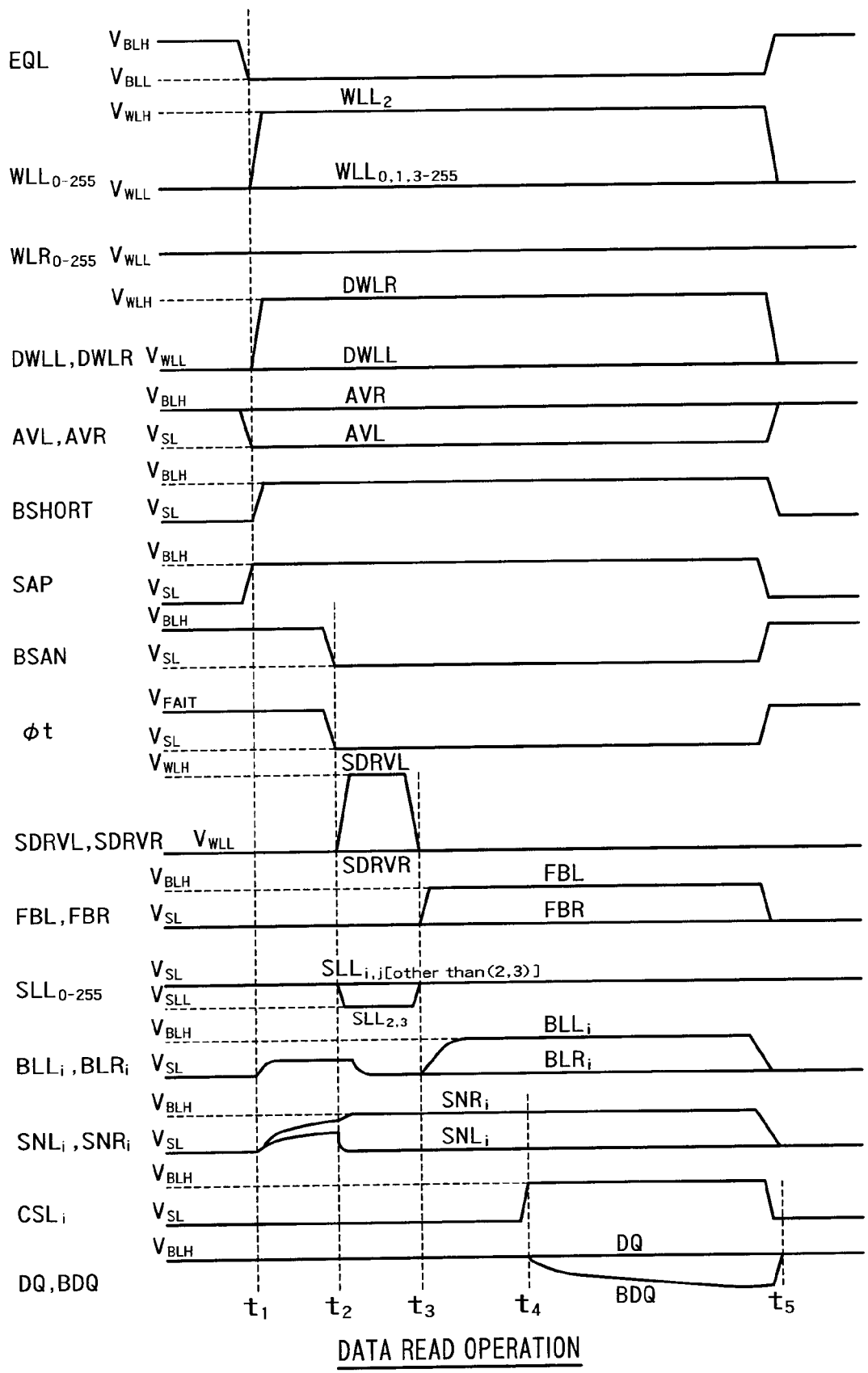
FIG. 27 is a timing diagram showing a data read operation performed by the FBC memory device according to the third embodiment.

FIG. 27 is a timing diagram showing a data read operation performed by the FBC memory device according to the third embodiment. In the third embodiment, a word line WLL2 is selected. Accordingly, from t2 to t3, a source line SLL2, 3 common to adjacent word lines WLL2 and WLL3 is selected. The other data read operation according to the third embodiment is similar to that shown in FIG. 6.

Figure 28:
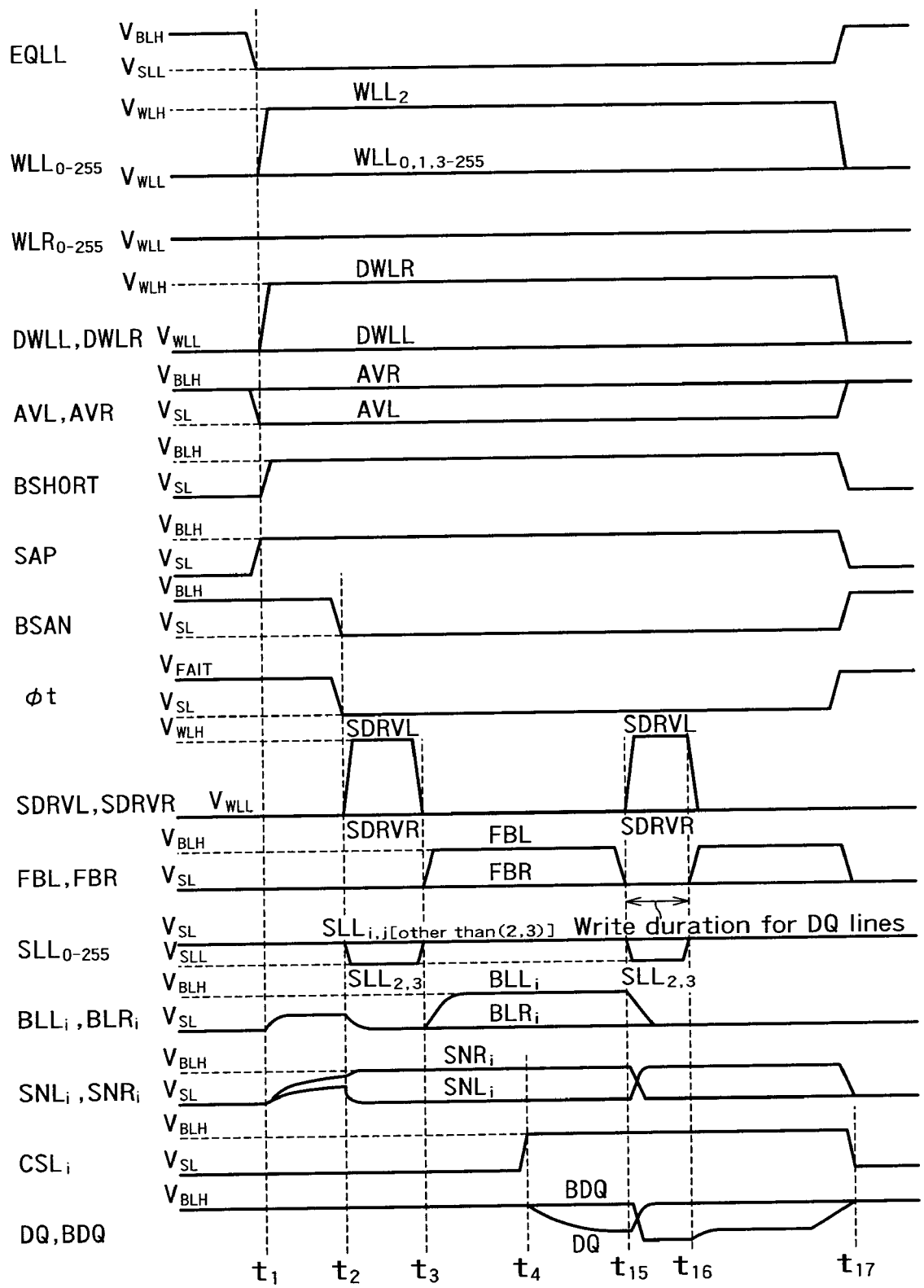
FIG. 28 is a timing diagram showing a normal data write operation performed by the FBC memory device according to the third embodiment.

FIG. 28 is a timing diagram showing a normal data write operation performed by the FBC memory device according to the third embodiment. In the normal data write operation, similarly to the data read operation, from t2 to t3, the source line SLL2, 3 common to the adjacent word lines WLL2 and WLL3 is selected. The other normal data write operation according to the third embodiment is similar to that shown in FIG. 7.

Figure 29:
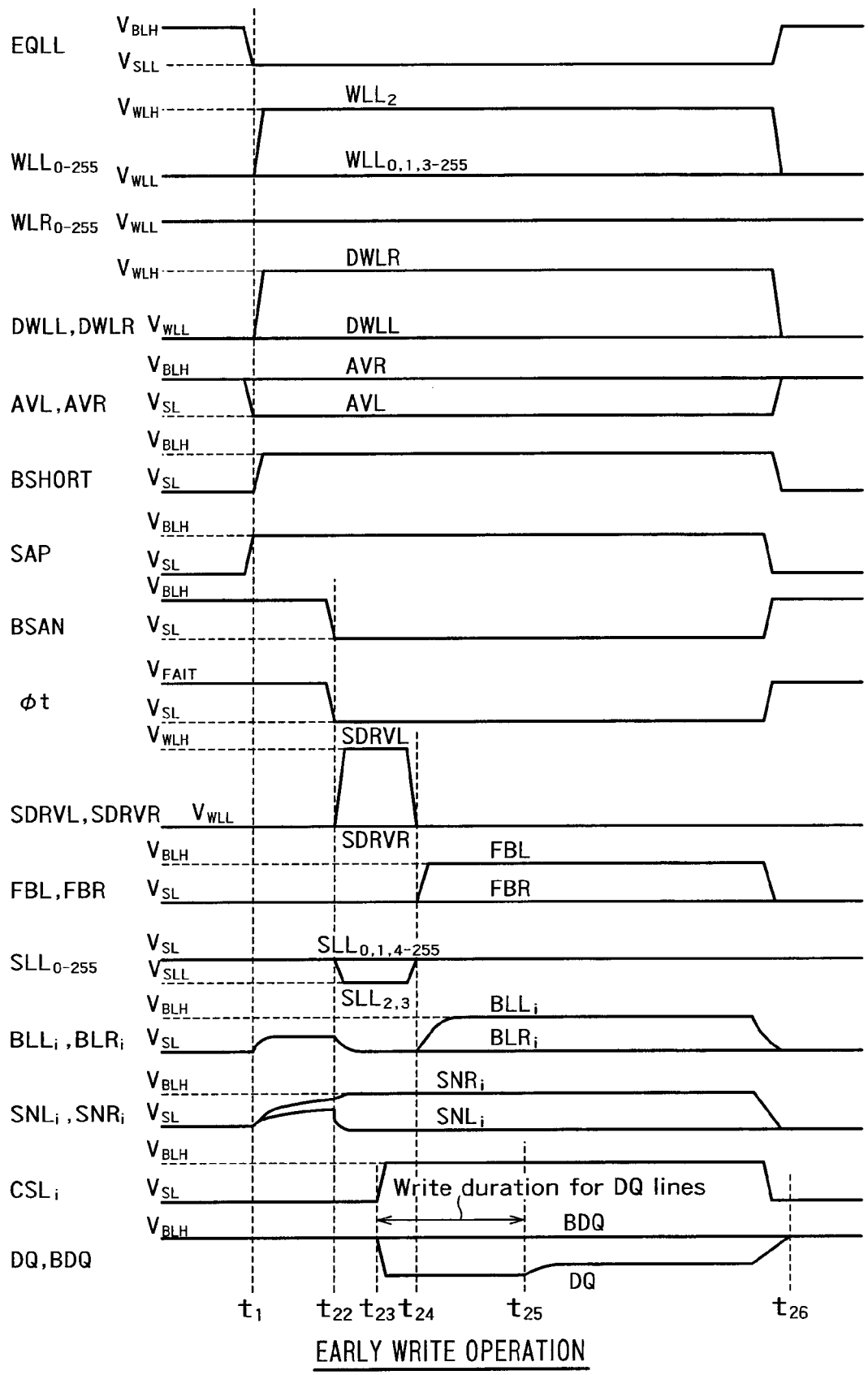
FIG. 29 is a timing diagram showing an early write operation performed by the FBC memory device according to the third embodiment.

FIG. 29 is a timing diagram showing an early write operation performed by the FBC memory device according to the third embodiment. In the early write operation, similarly to the data read operation and the normal data write operation, from t2 to t3, the source line SLL2, 3 common to the adjacent word lines WLL2 and WLL3 is selected. The other early write operation according to the third embodiment is similar to that shown in FIG. 8.

Modification of Third Embodiment

In the third embodiment, the unselected word line WLL3 sharing the source line SLL2, 3 with the selected word line WLL2 is kept equal in potential (i.e., data holding potential)

to the other unselected word lines WLL0, WLL1, and WLL4 to WLL255. If the potential of the unselected word lines WLLs is set to VWLM higher than VWLL, the memory cells MCs connected to the unselected word line WLL3 are often disturbed. In a modification of the third embodiment, the potential of the unselected word line WLL3 sharing the source line SLL2, 3 with the selected word line WLL2 is set lower than that of the other unselected word lines WLLs. Due to this, an FBC memory device according to the modification of the third embodiment includes a driving circuit for word drive lines WDRV0 to WDRV3 different from the conventional techniques.

The memory cell array in this modification is similar in configuration to those shown in FIG. 23.

Figure 30:
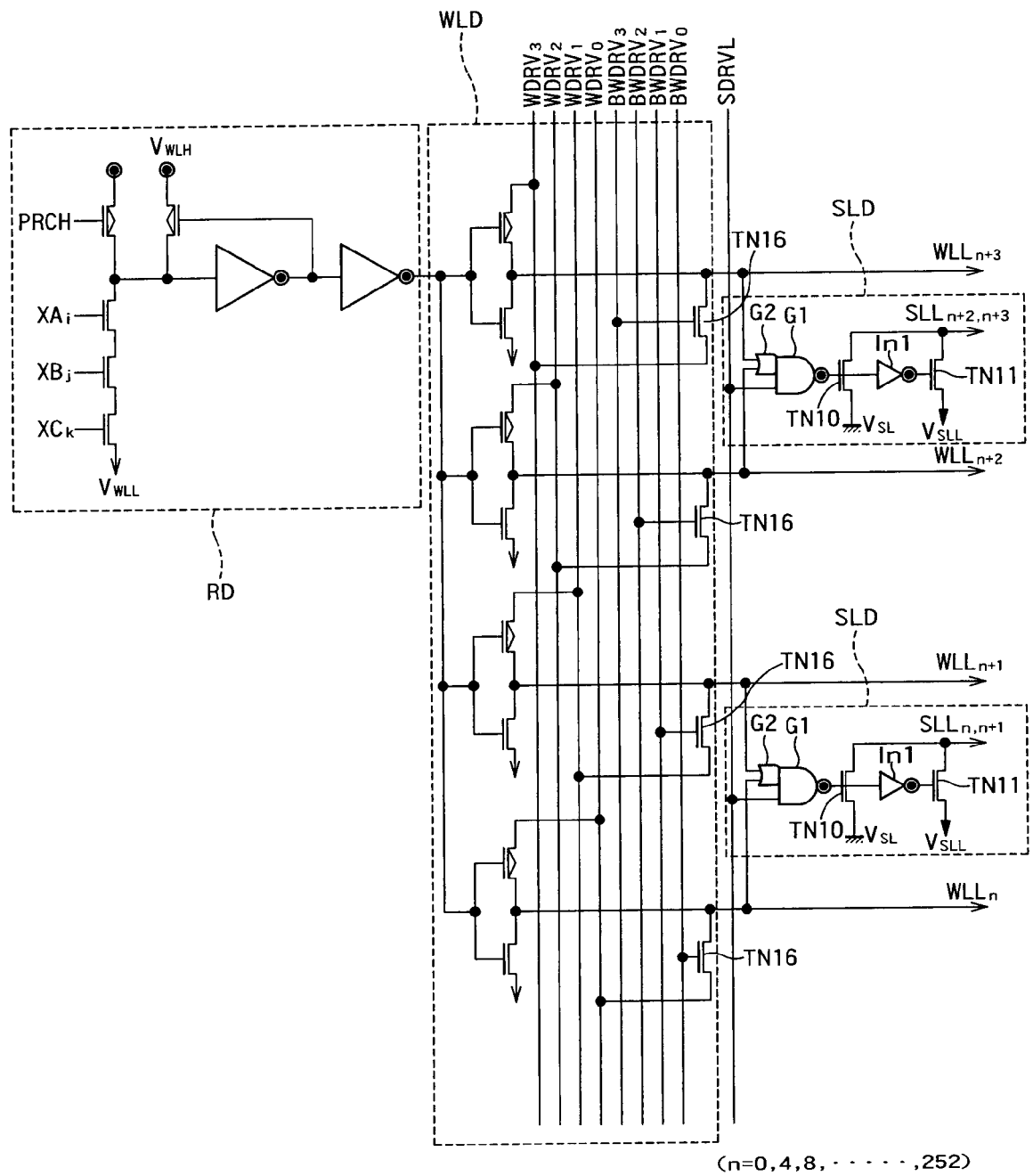
FIG. 30 is a circuit diagram showing configurations of a row decoder RD, a word line driver WLD, and source line drivers SLDs according to the modification.

FIG. 30 is a circuit diagram showing configurations of a row decoder RD, a word line driver WLD, and source line drivers SLDs according to the modification. In the word line driver WLD, a source of an n-type transistor TN16 having a gate to which an inverted signal BWDRVi of a signal on each word drive line WDRV is input is connected not to VWLL but to the word drive line WDRVi. As a result, among four word lines WLLs related to a decoder and selected by addresses XAi, XBj, and XCk, levels of three unselected word lines WLLs are controlled to be equal to a voltage level of the word drive line WDRVi.

The source line drivers SLDs can be similar in configuration to those according to the third embodiment.

Figure 31:
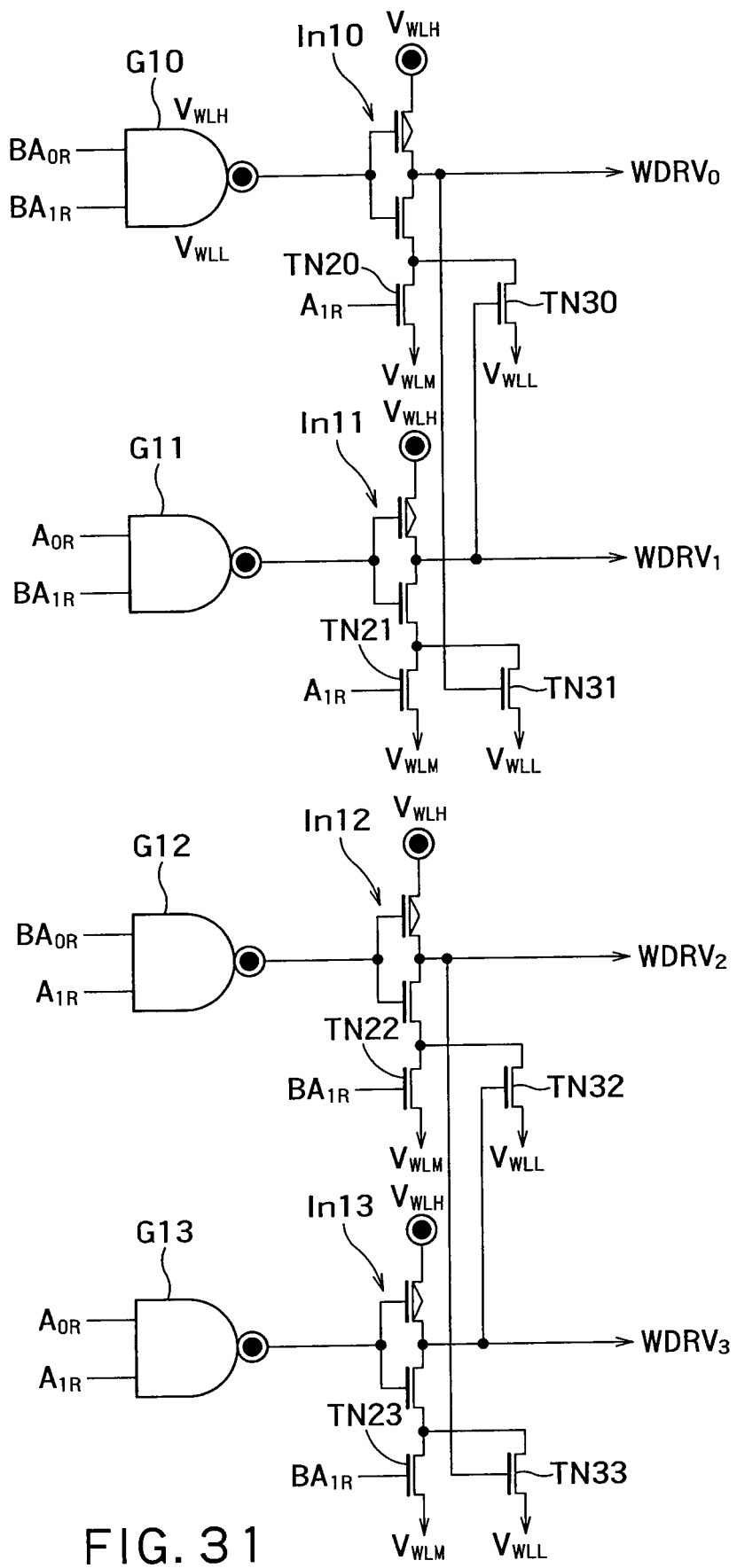
FIG. 31 is a circuit diagram showing the driving circuit for the word drive lines WDRV0 to WDRV3. A0R and A1R are addresses for selecting one of the four word lines WLs connected to one row decoder RD.

FIG. 31 is a circuit diagram showing the driving circuit for the word drive lines WDRV0 to WDRV3. A0R and A1R are addresses for selecting one of the four word lines WLs connected to one row decoder RD. If (A0R, A1R) is (0, 0), (1, 0), (0, 1) or (1, 1), for example, the word drive line WDRV0, WDRV1, WDRV2 or WDRV3 is activated, respectively.

The driving circuit for the word drive lines WDRV0 to WDRV3 includes NAND gates G10 to G13 to each of which two addresses out of A0R, A1R, BA0R, and BA1R are input and each of which outputs a NAND operation result, and inverters In10 to In13 inverting outputs of the NAND gates G10 to G13 and transmitting inverted outputs to the word drive lines WDRV0 to WDRV3, respectively. The inverters In10 to In13 are connected to a high-level word line potential VWLH (i.e., a potential of unselected word lines WLs) as a high potential power supply. The inverters In10 to In13 are also connected to a first low potential VWLL as a low potential power supply via n-type transistors TN30 to TN33 and to a second low potential VWLM via n-type transistors TN20 to TN23, respectively. The second low potential VWLM is far lower than high potential VWLH and slightly higher than the first low potential VWLL.

The address signal A1R or the inverted address signal BA1R of the address signal A1R for selecting paired word lines WLn and WLn+1 between which a source is shared is applied to a gate of each of the transistors TN20 to TN23. As a result, the transistors TN20 and TN21 (or TN22 and TN23) corresponding to the selected paired word lines WLn and WLn+1 are turned off, and transistors TNTN22 and TN23 (or TN20 and TN21) responding to the unselected paired word lines are turned on. The second low potential VWLM is, therefore, applied to the unselected paired word lines.

Gates of the transistors TN30 to TN33 are connected to the word drive lines WDRVs paired with those corresponding to the transistors TN30 to TN33, respectively. The first low potential VWLL is thereby applied to the unselected word line sharing the source line SLL with the selected word line. Namely, the driving circuit applies the high potential VWLH to the selected word line, the first low potential VWLL to the unselected word line sharing the source with the selected word line, and the second low potential VWLM to the other unselected word lines.

It suffices that the driving circuit for the word drive lines WDRV0 to WDRV3 is configured to lower the potential of the unselected word line sharing the source with the selected word line from the ordinary data holding potential. The configuration of the driving circuit is not, therefore, limited to that shown in FIG. 31.

When data "0" is written to the memory cells MCs, the data holding potential of the adjacent unselected word line sharing the source line with the selected word line falls from VWLM to VWLL. Due to this, even if "1" cells are connected to this unselected word line, a strong forward bias is not applied to pn junctions between sources and bodies of the "1" cells because potentials of bodies of the "1" cells are reduced by the capacitive coupling between the gate and the body of each "1" cell. As a result, it is possible to avoid disturbance to the adjacent memory cells MCs due to writing of data "0" to the memory cells MCs.

Figure 32:
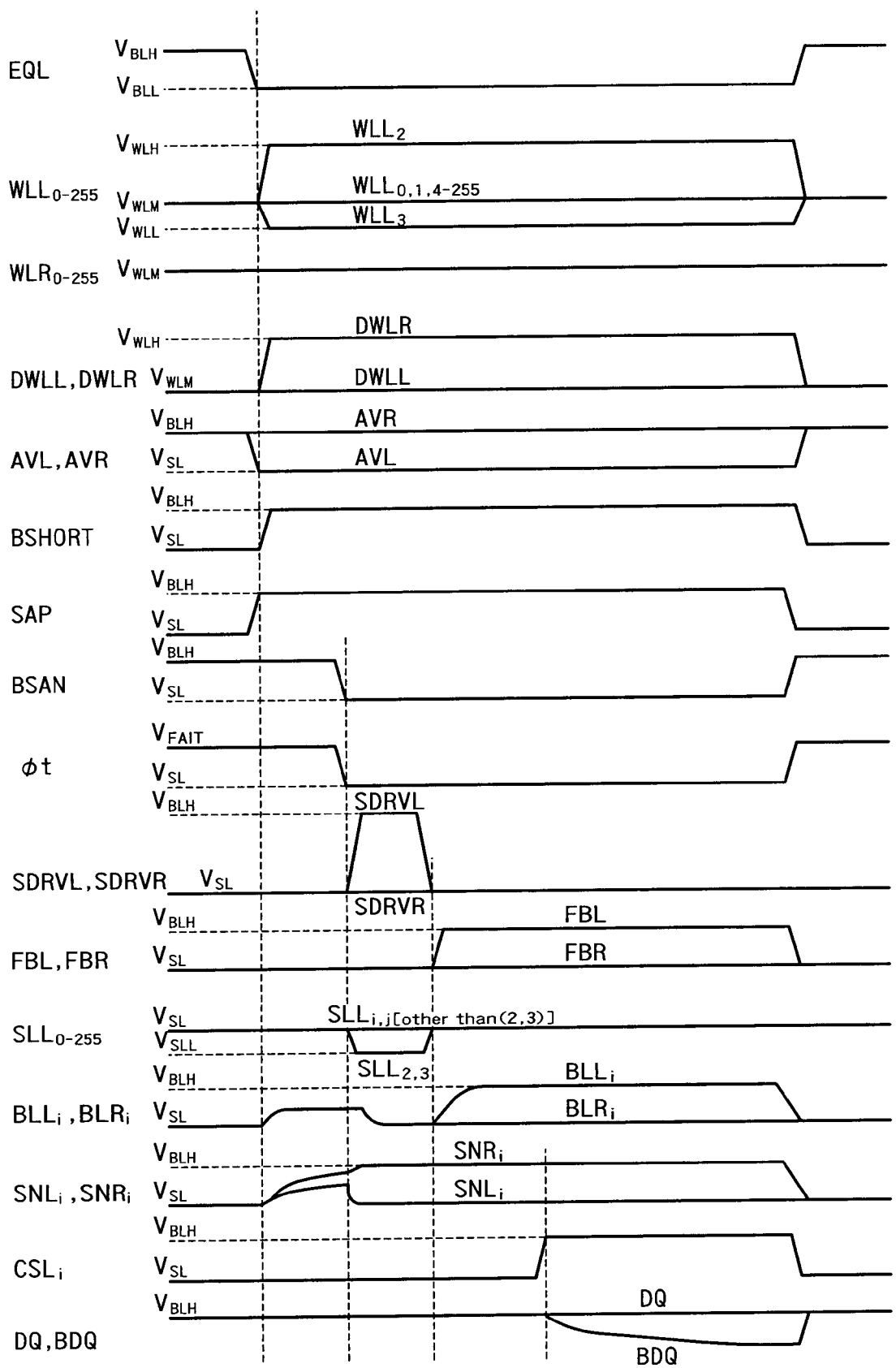
FIGS. 32 to 34 are timing diagrams showing a data read operation, a normal data write operation, and an early write operation performed by the FBC memory device according to the modification of the third embodiment, respectively.
Figure 33:
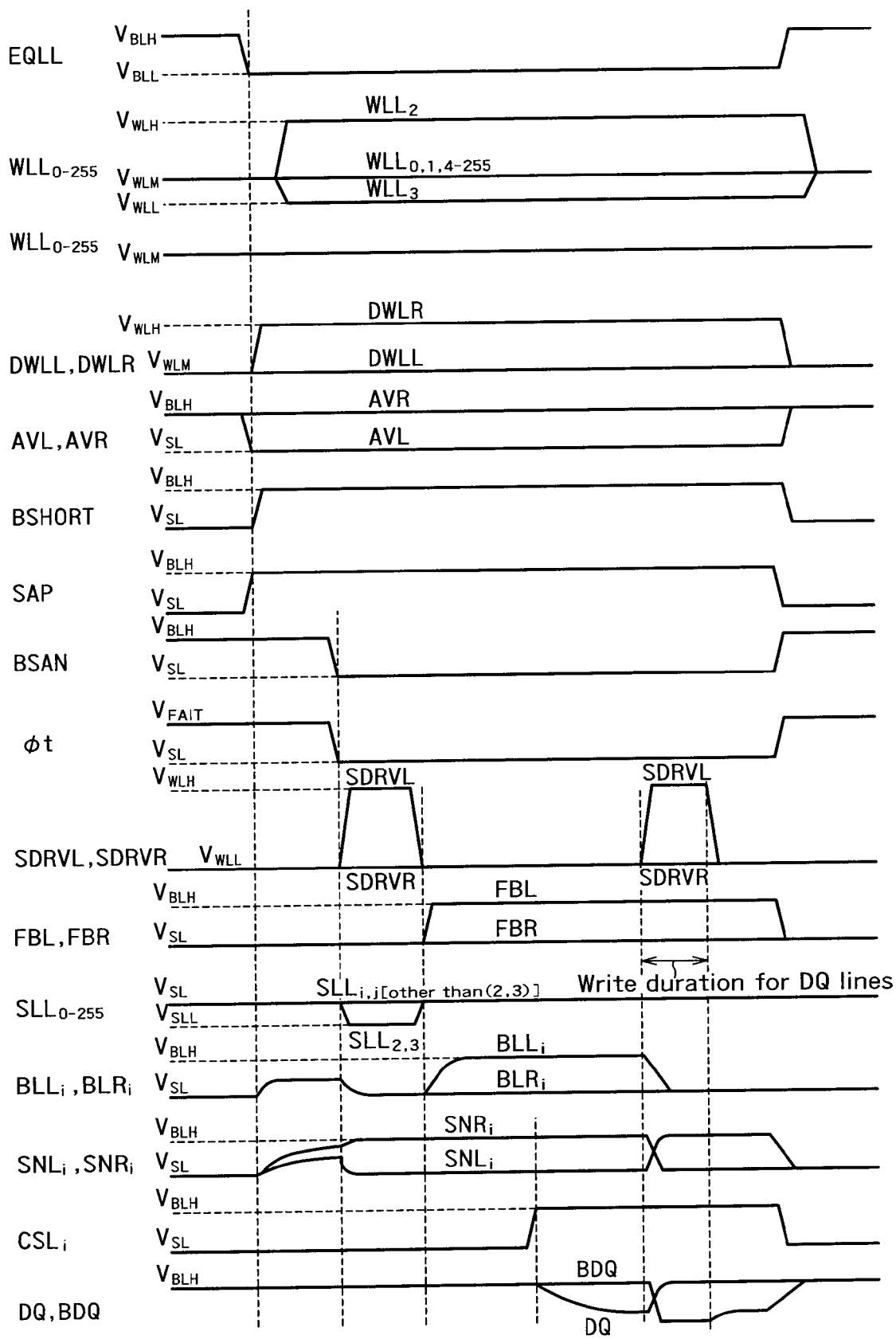
Figure 34:
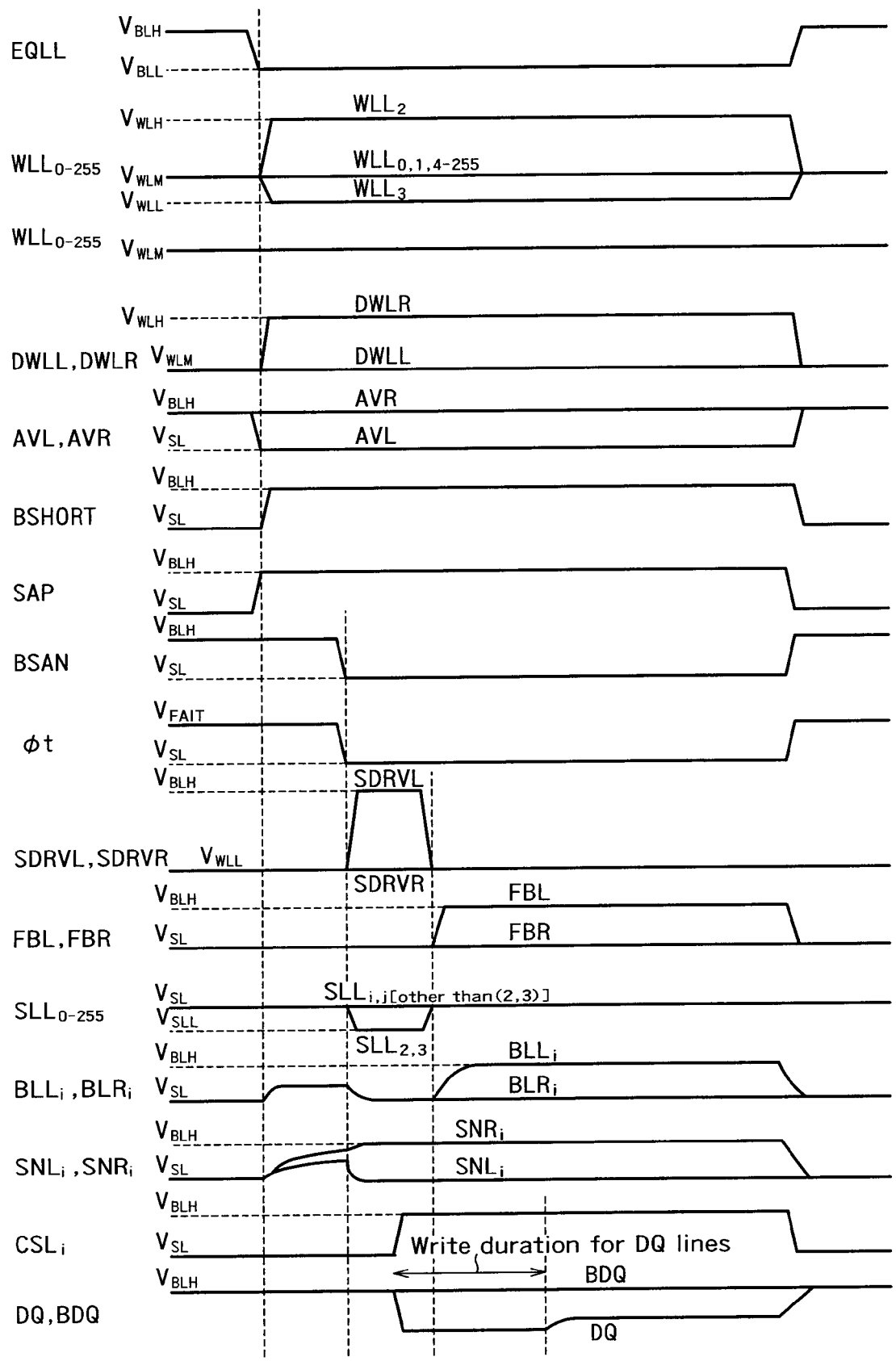

FIGS. 32 to 34 are timing diagrams showing a data read operation, a normal data write operation, and an early write operation performed by the FBC memory device according to the modification of the third embodiment, respectively. The data read operation, the normal data write operation, and the early write operation are basically similar to those shown in FIGS. 27 to 29, respectively. However, the data read operation, the normal data write operation, and the early write operation differ from those shown in FIGS. 27 to 29 in that the first low potential VWLL is applied to the unselected word line WLL3 sharing the source SLL2, 3 with the selected word line WLL2 and the second low potential VWLM is applied to the other unselected word lines WLL0, WLL1, and WLL4 to WLL255.

Fourth Embodiment

Figure 35:
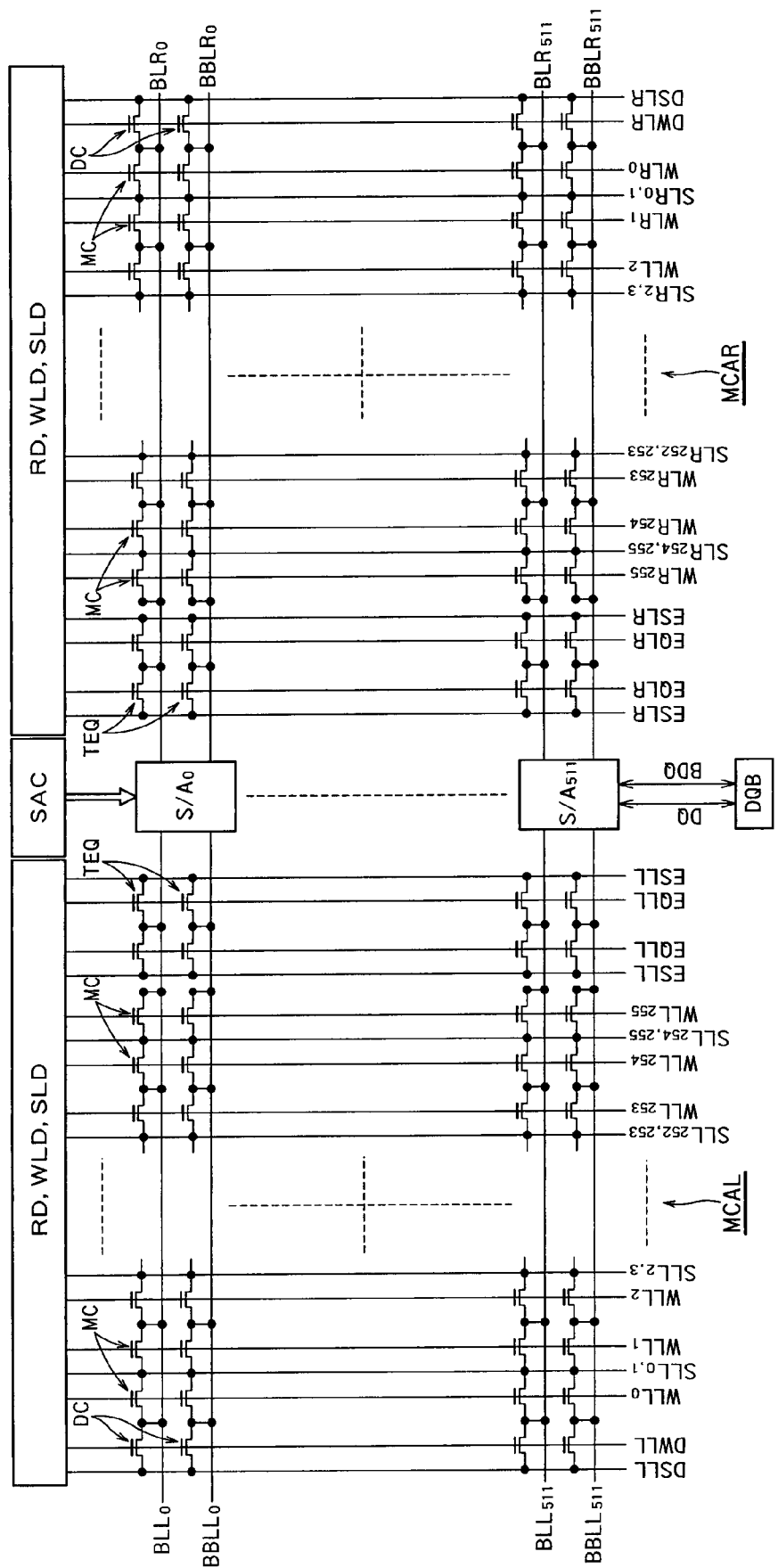
FIG. 35 is a circuit diagram showing a configuration of an FBC memory device according to a fourth embodiment of the present invention.

FIG. 35 is a circuit diagram showing a configuration of an FBC memory device according to a fourth embodiment of the present invention. The FBC memory device shown in FIG. 35 is obtained by applying the so-called 2 cell/bit configuration to the FBC memory device according to the third embodiment. Namely, the fourth embodiment is a combination of the third embodiment and the second embodiment. Therefore, two adjacent bit lines BLL and BBLL, serving as paired bit lines, are connected to one sense amplifier S/A. The sense amplifier S/A uses one of the paired bit lines BLL and BBLL as a reference and detects data stored in the cell connected to the other bit line. Alternatively, the sense amplifier S/A uses one of paired bit lines BLR and BBLR as a reference and detects data stored in the cell connected to the other bit line. The FBC memory device according to the fourth embodiment can, therefore, dispense with dummy cells DCs, dummy word lines DWLs, averaging transistors TAVs, and averaging lines AVL and AVR. Other configurations of the FBC memory device according to the fourth embodiment can be similar to those according to the third embodiment.

Figure 36:
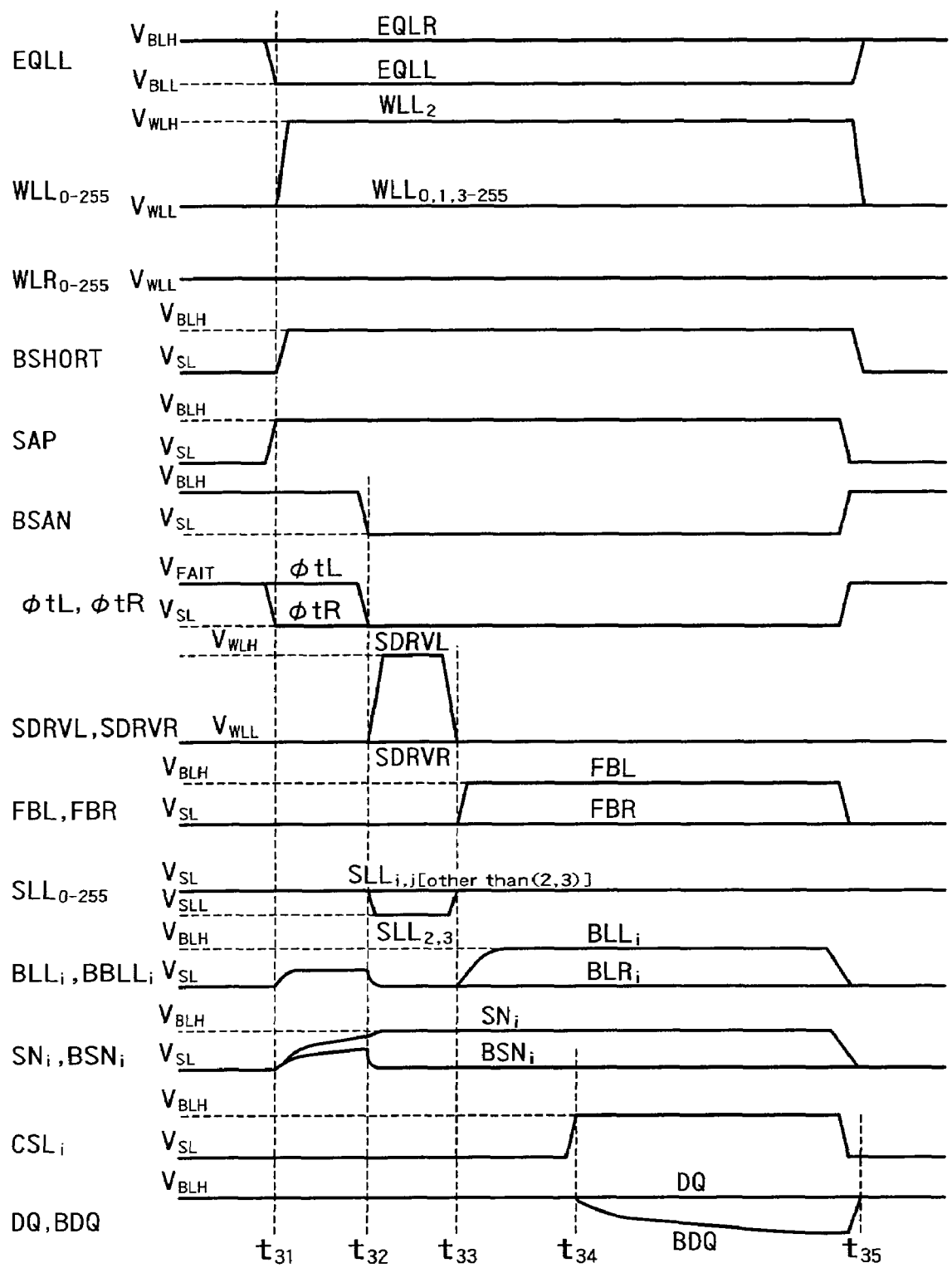
FIGS. 36 to 38 are timing diagrams showing a data read operation, a normal data write operation, and an early write operation performed by the FBC memory device according to the fourth embodiment, respectively.
Figure 37:
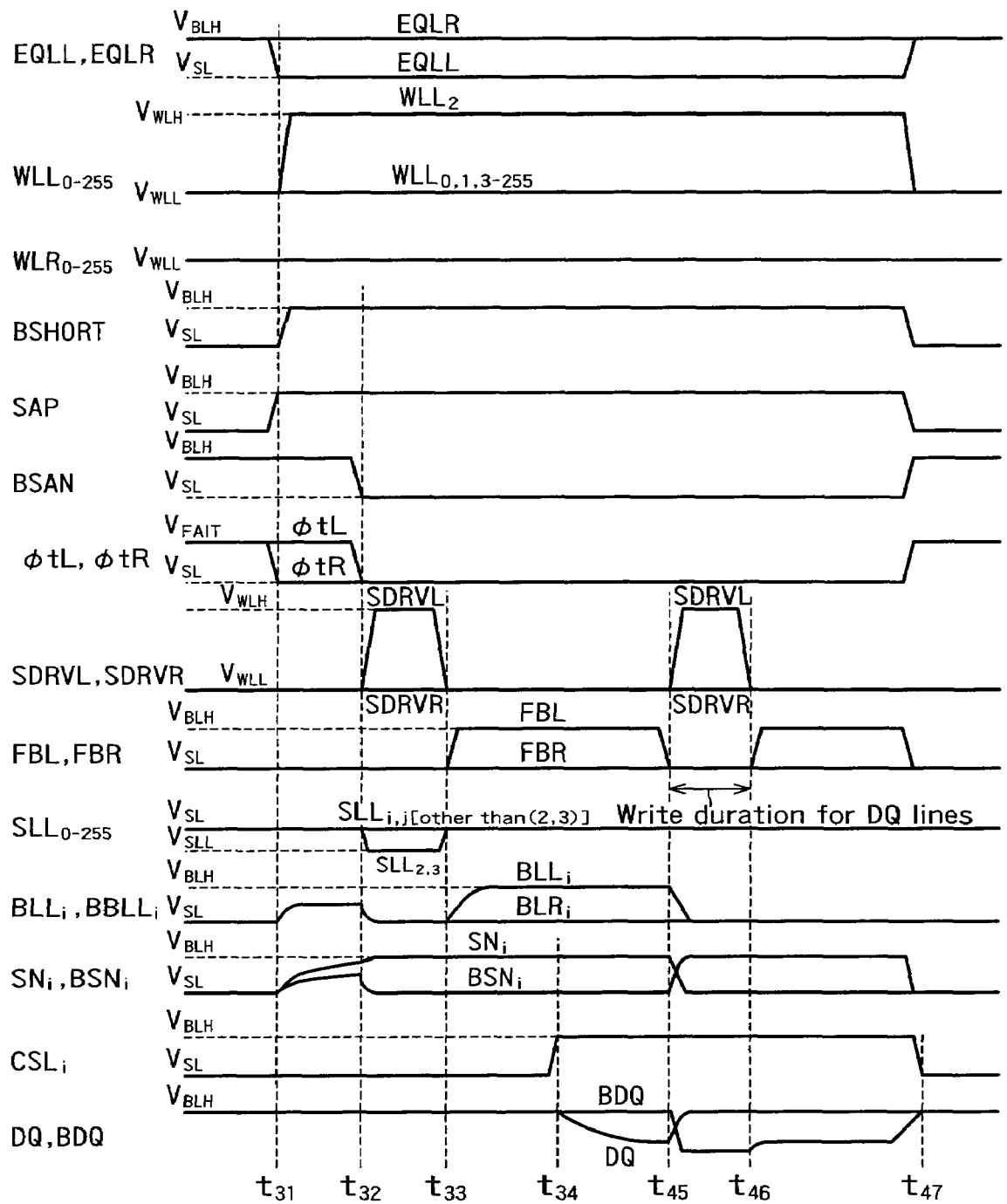
Figure 38:
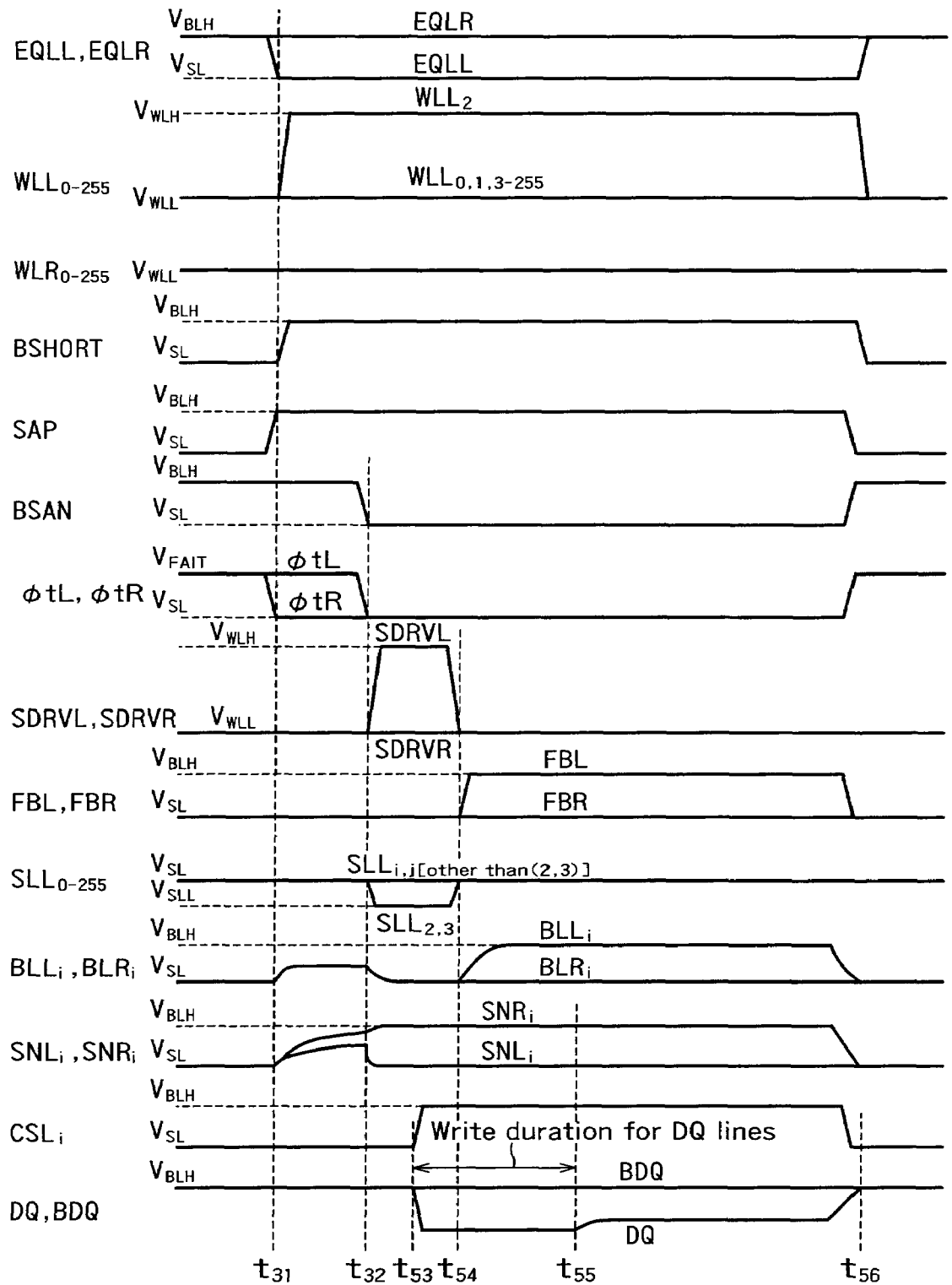

FIGS. 36 to 38 are timing diagrams showing a data read operation, a normal data write operation, and an early write operation performed by the FBC memory device according to the fourth embodiment, respectively. The data read operation, the normal data write operation, and the early write operation are basically similar to those shown in FIGS. 20 to 22, respectively. However, from t32 to t33, similarly to from t2 to t3 shown in FIG. 27, a source line SLL2, 3 common to the selected word line WLL2 and the unselected word line WLL3 adjacent to the selected word line WLL2 is driven to low level SLL.

The fourth embodiment exhibits both of the effects of the second and third embodiments.

Modification of Fourth Embodiment

In the fourth embodiment, the unselected word line WLL3 sharing the source line SLL2, 3 with the selected word line WLL2 is kept equal in potential to the other unselected word lines WLL0, WLL1, and WLL4 to WLL255. If the potential of the unselected word lines WLLs is set to VWLM higher than VWLL, the memory cells MCs connected to the unselected word line WLL3 are often disturbed. In a modification of the fourth embodiment, the potential of the unselected word line WLL3 sharing the source line SLL2, 3 with the selected word line WLL2 is set lower than that of the other unselected word lines WLLs. Namely, an FBC memory device according to the modification of the fourth embodiment is obtained by applying the so-called 2 cell/bit configuration to the FBC memory device according to the modification of the third embodiment.

Therefore, sense amplifiers S/As according to the modification of the fourth embodiment are similar in configuration to those shown in FIG. 35, and other configurations of the FBC memory device according to the modification of the fourth embodiment are similar to those of the FBC memory device according to the modification of the third embodiment. Namely, a row decoder RD, a word line driver WLD, and source line drivers SLDs according to the modification of the fourth embodiment are similar to those shown in the circuit diagram of FIG. 30, respectively. Moreover, the FBC memory device according to the modification of the fourth embodiment includes a driving circuit for word drive lines WDRV0 to WDRV3 shown in FIG. 31.

Figure 39:
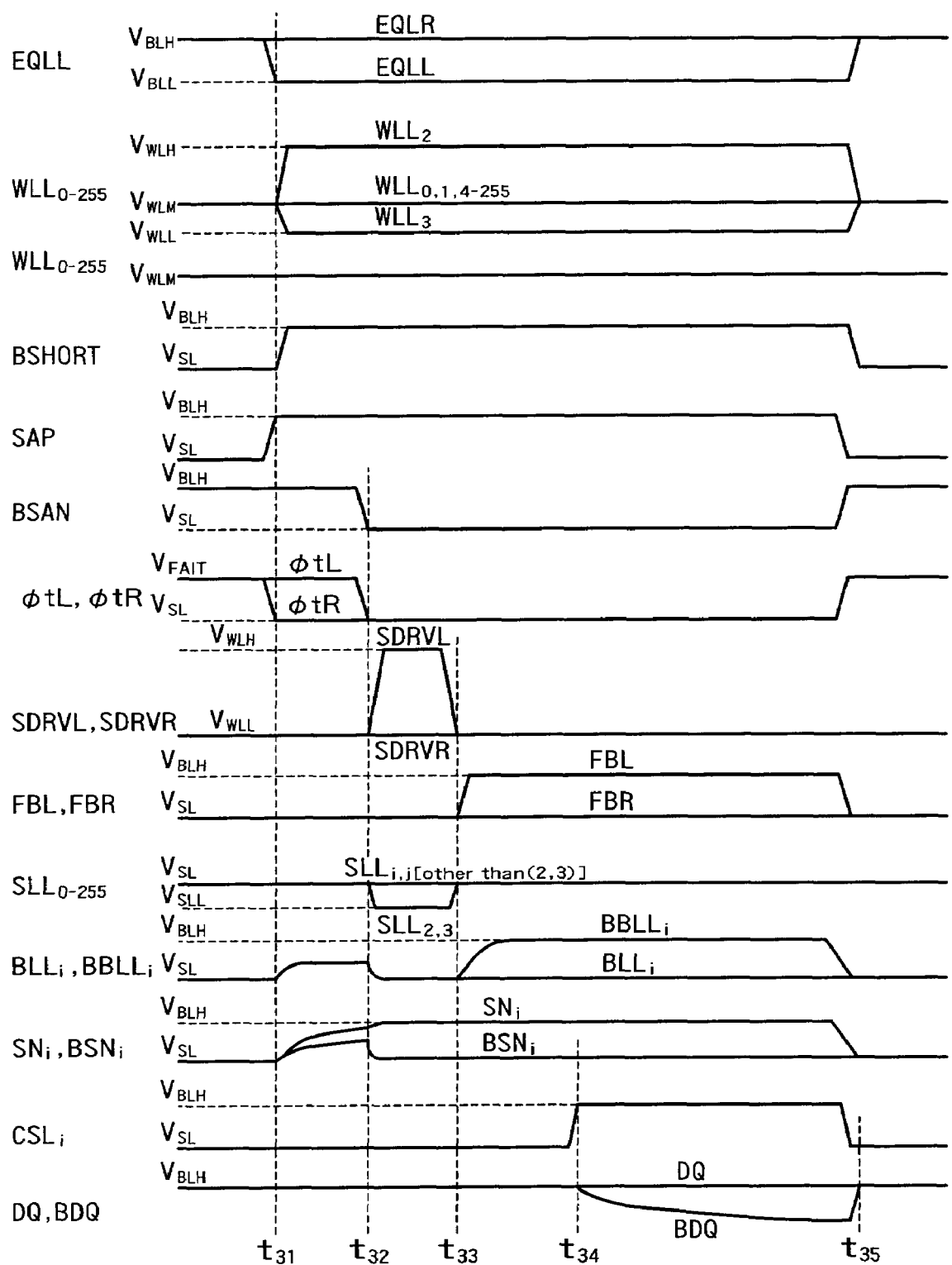
FIGS. 39 to 41 are timing diagrams showing a data read operation, a normal data write operation, and an early write operation performed by the FBC memory device according to the modification of the fourth embodiment, respectively.
Figure 40:
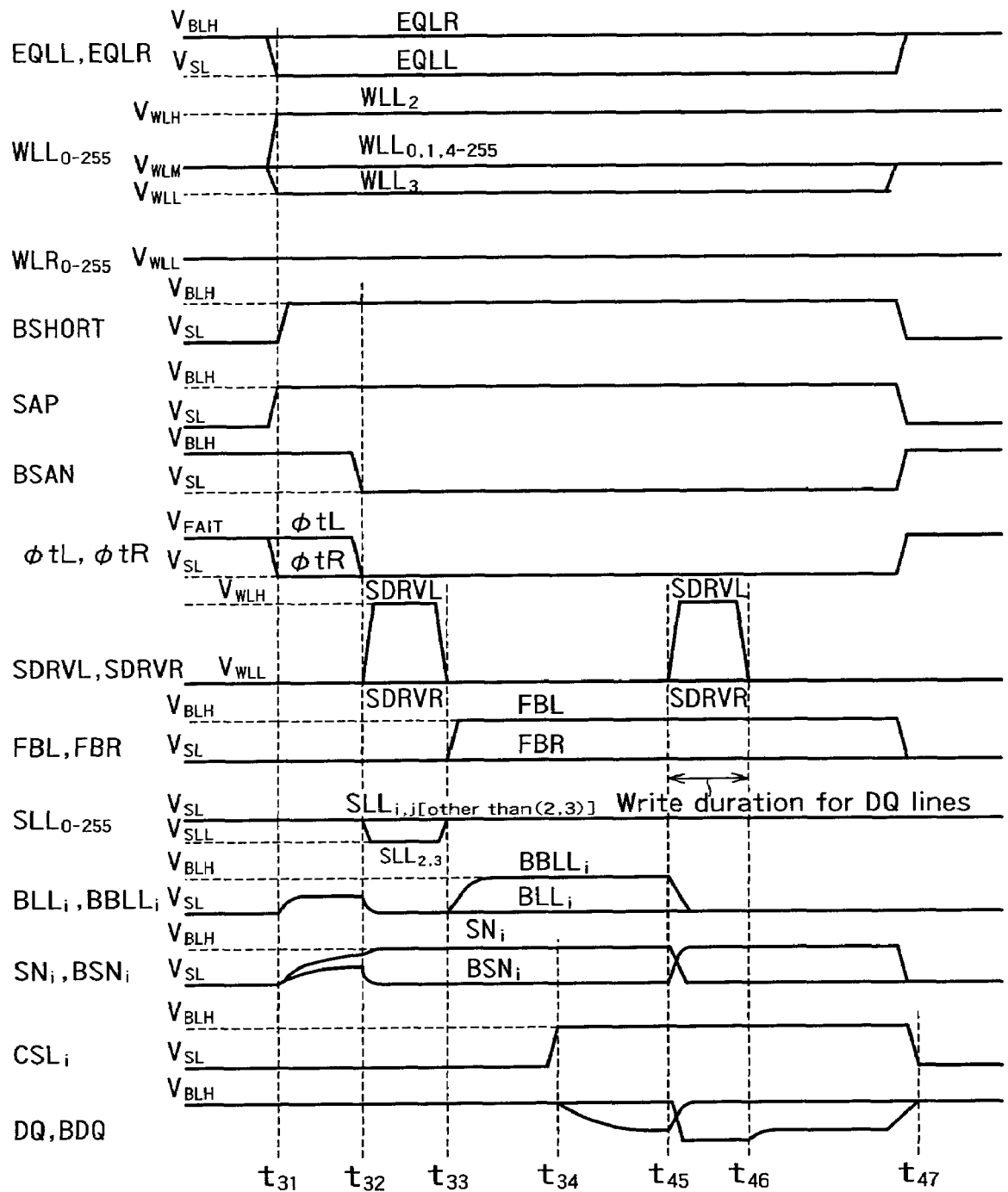
Figure 41:
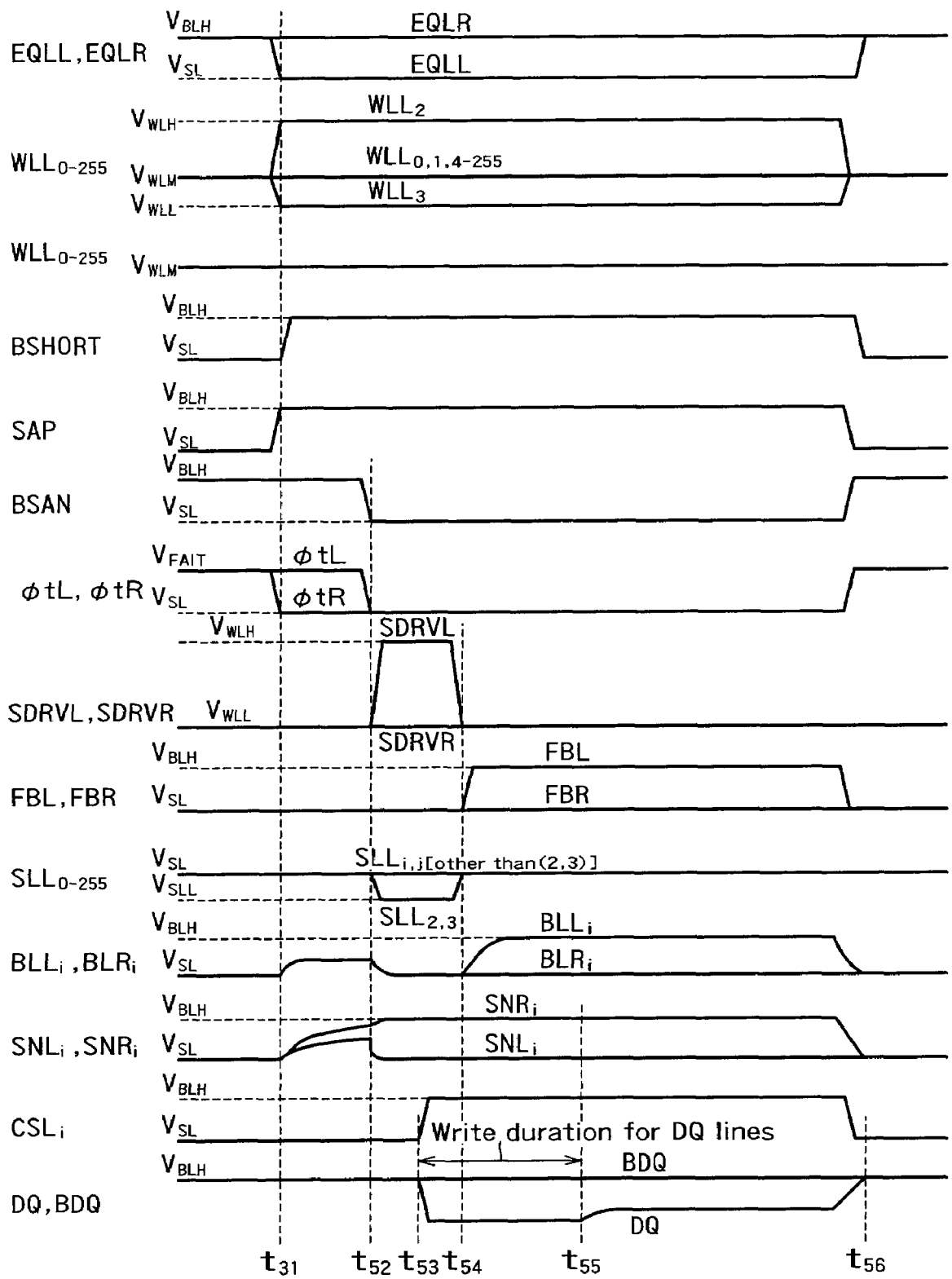

FIGS. 39 to 41 are timing diagrams showing a data read operation, a normal data write operation, and an early write operation performed by the FBC memory device according to the modification of the fourth embodiment, respectively. The data read operation, the normal data write operation, and the early write operation are basically similar to those shown in FIGS. 36 to 38, respectively. However, the data read operation, the normal data write operation, and the early write operation differ from those shown in FIGS. 36 to 38 in that the first low potential VWLL is applied to the unselected word line WLL3 sharing the source SLL2, 3 with the selected word line WLL2 and the second low potential VWLM is applied to the other unselected word lines WLL0, WLL1, and WLL4 to WLL255.

Fifth Embodiment

In an FBC memory device according to a fifth embodiment of the present invention, data "1" is written to each memory cell MC not by impact ionization but by using so-called GIDL (Gate Induced Drain Leakage). The FBC memory device according to the fifth embodiment can be similar in configuration to that according to the first embodiment.

Figure 42:
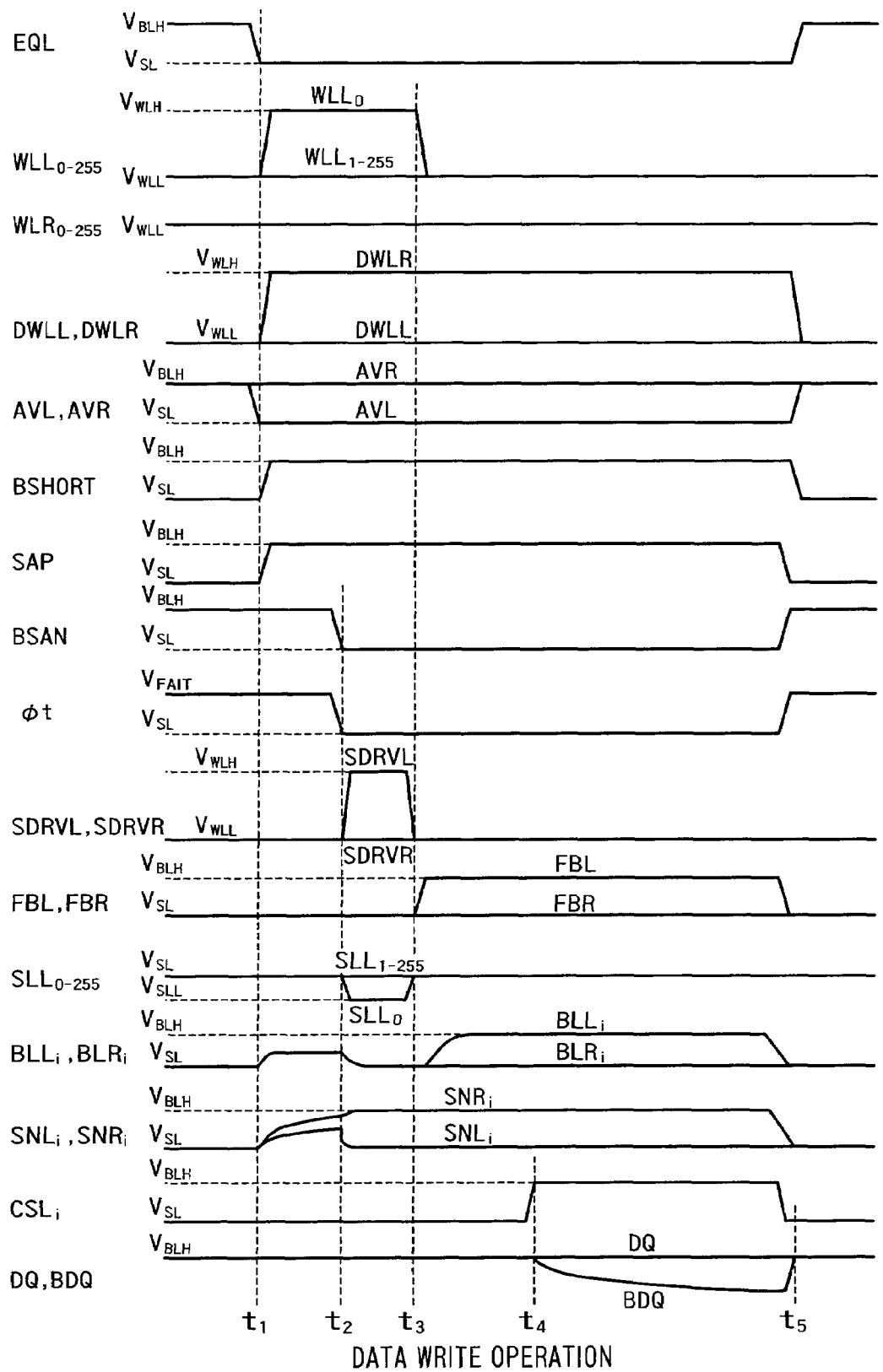
FIG. 42 is a timing diagram showing a data read operation performed by the FBC memory device according to the fifth embodiment.

FIG. 42 is a timing diagram showing a data read operation performed by the FBC memory device according to the fifth embodiment. The operation from t1 to t3 is similar to that from t1 to t3 shown in FIG. 6. Thereafter, if data "1" is to be written back, then a potential of a word line WLL0 is lowered to a low-level potential VWLL, and a potential of the selected bit line BLLi is raised to a high-level potential VBLH right after reduction of the potential of the word line WLL0. By doing so, a potential of a gate of each selected memory cell MC is set largely in a negative direction with reference to a potential of a drain of each selected memory cell MC. As a result, only a current (band-to-band tunneling current) by the GIDL is applied only to the selected memory cells MCs and data "1" is restored in the selected memory cells MCs. In this manner, the present invention is applicable to the FBC memory device in which data "1" is written to the memory cells MCs by the GIDL.

Sixth Embodiment

An FBC memory device according to a sixth embodiment of the present invention executes a fast and random data read cycle.

Figure 43:
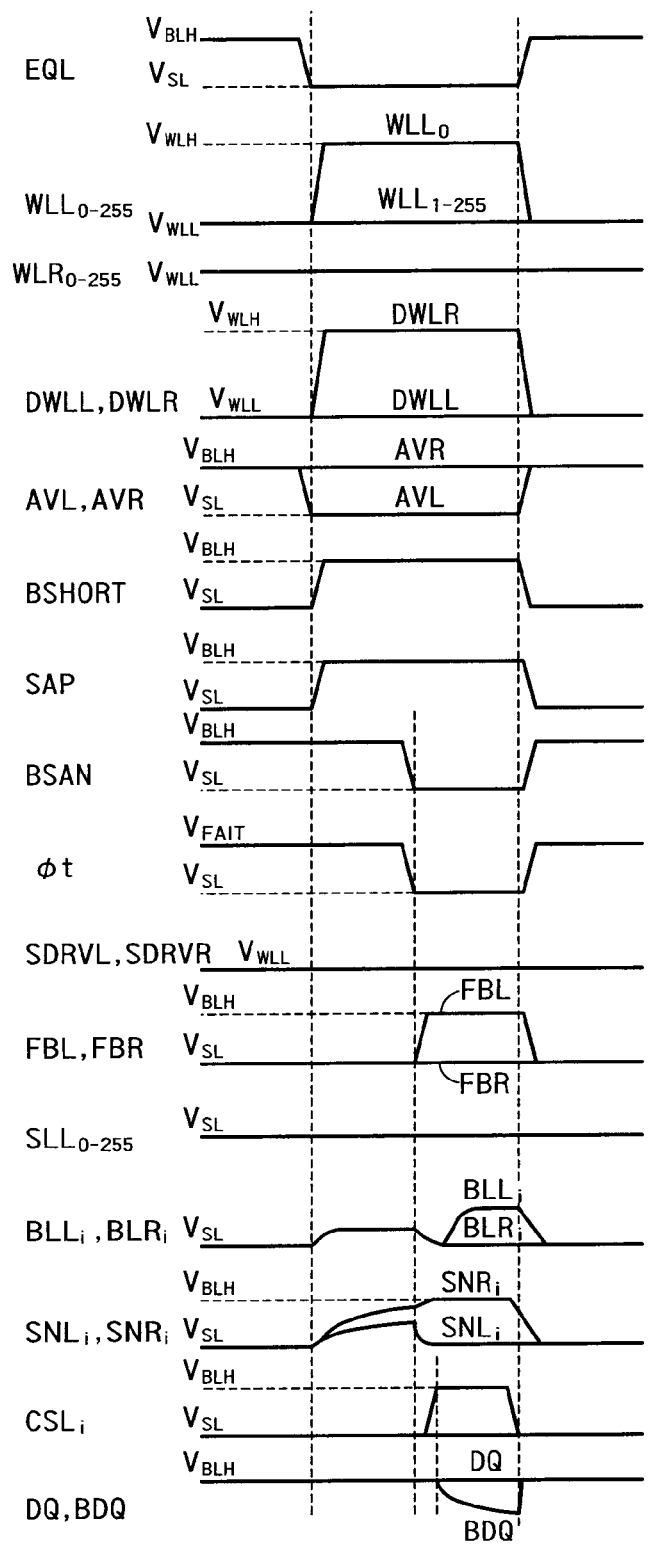
FIG. 43 is a timing diagram showing a fast cycle read operation performed by the FBC memory device according to the sixth embodiment.

FIG. 43 is a timing diagram showing a fast cycle read operation performed by the FBC memory device according to the sixth embodiment. Generally, a data restoration operation in the read cycle suffices to supply a few holes to each "1" cell by as much as holes lost by the charge pumping phenomenon. Therefore, in the sixth embodiment, a feedback line FBL is activated only for short time and a potential of a selected bit line BLL is set to a high-level potential VBLH only for short time. This time can be a period necessary to supply a few holes to each "1" cell. Moreover, since "0" cells are not subjected to the charge pumping operation, there is no need to activate source drive lines SDRVL. Namely, there is no need to drive source lines to low level. This is quite advantageous for acceleration of the data read cycle. In a data write cycle, it is still necessary to drive the source lines to low level. Nevertheless, if the FBC memory device is applied to a cache or the like of a microprocessor, the fast random data read cycle is quite advantageous because the data read cycle is executed frequently.

A data write operation performed by the FBC memory device according to the sixth embodiment can be similar to those according to the preceding embodiments. In this manner, the present invention is applicable to the FBC memory device performing the fast data cycle read operation.

Figure 44:
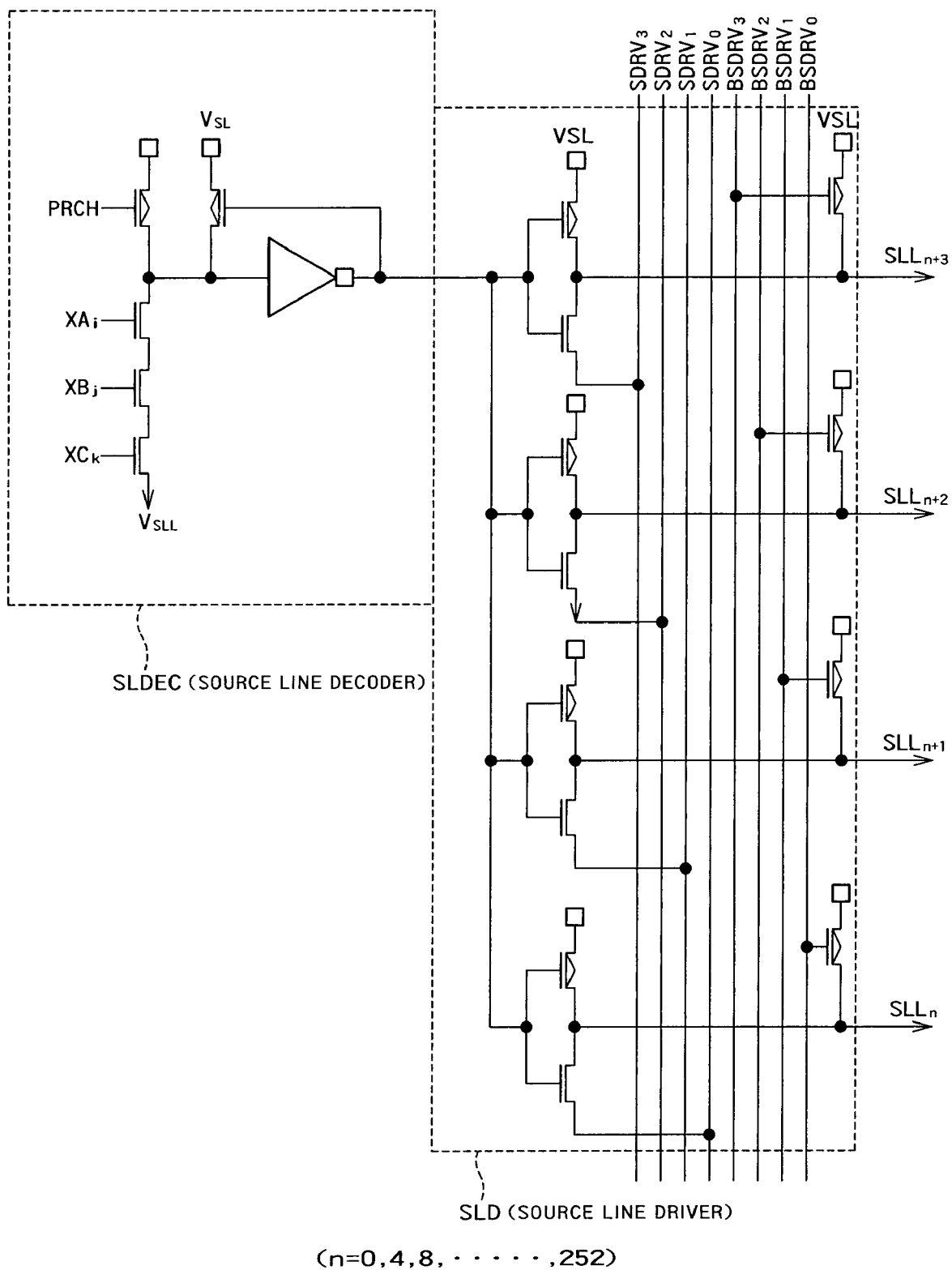
FIG. 44 shows an example of the source line decoder SLDEC.
Figure 45:
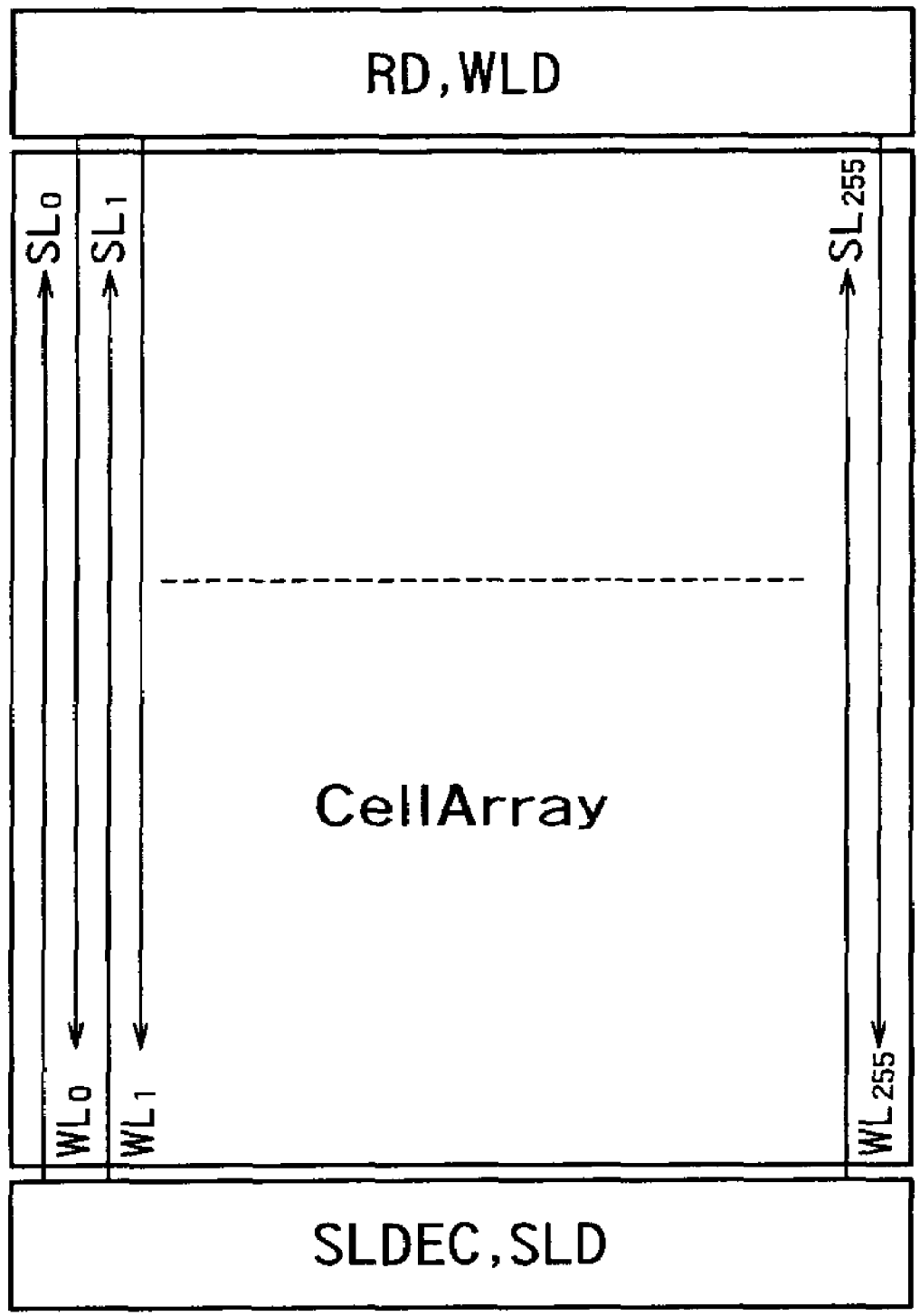
FIG. 45 is a layout diagram showing a positional relationship among the memory cell array MCAL, the row decoder RD, the word line driver WLD, and the source line driver SLD.

In the first to sixth embodiments, the source line drivers SLDs and the word line driver WLD are connected to the common row decoder RD. Alternatively, the FBC memory device may include not only the row decoders RDs but also source line decoders SLDEC dedicated to source line drivers SLDs. FIG. 44 shows an example of the source line decoder SLDEC. The source line decoder SLDEC uses the source line potentials VSL and VSLL as power supplies, irrespectively of the potentials VWLL and VWLH of the word lines WLs. Accordingly, by providing the source line decoders SLDEC dedicated to the source line drivers SLDs, there is no need to provide the level shifters LSs shown in FIG. 13 irrespectively of the magnitude relationship among the word line potentials VWLL and VWLH and the source potentials VSL and VSLL. In other words, flexibility for setting of the source potentials VSL and VSLL is increased.

Figure 46:
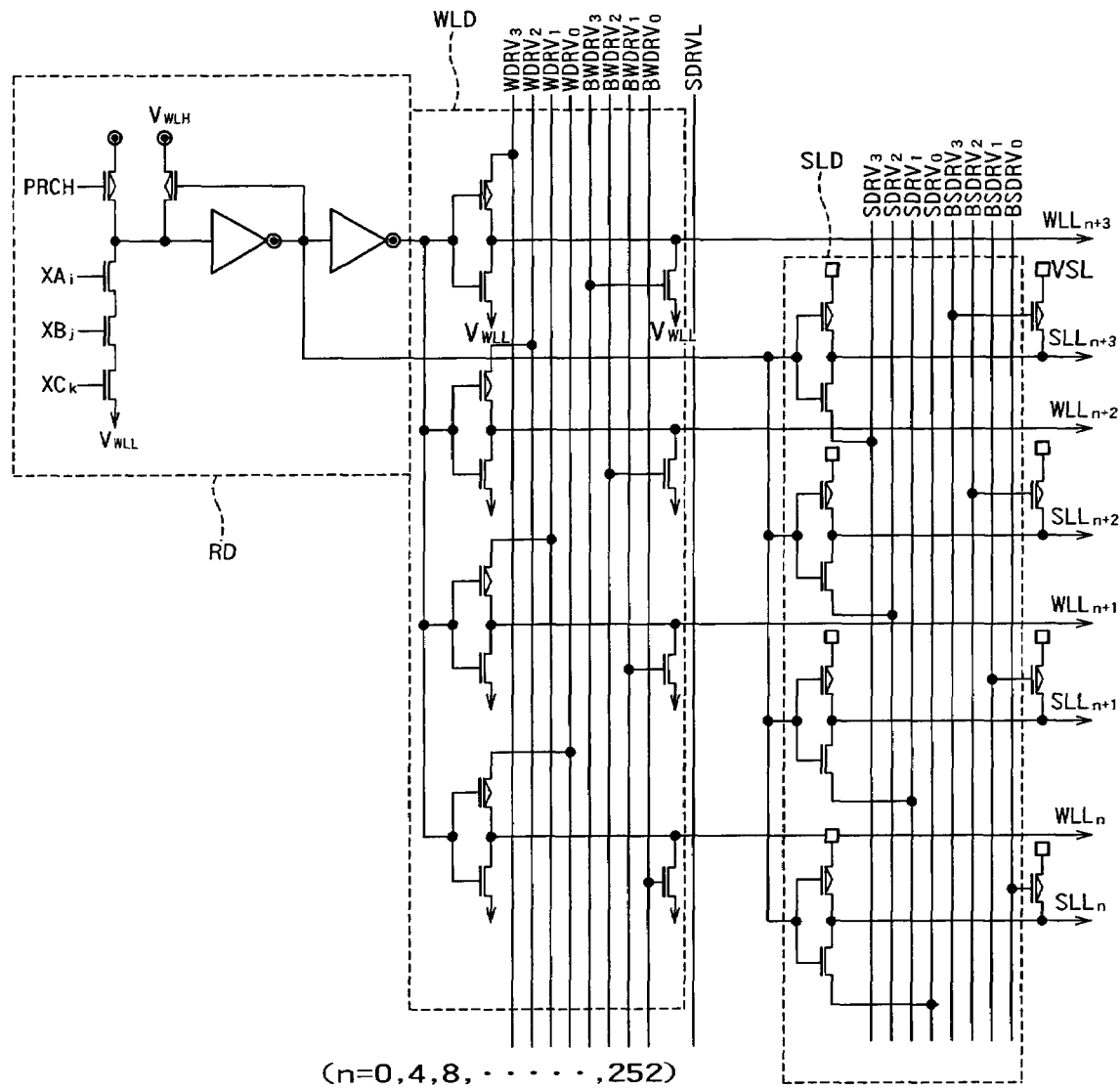
FIGS. 46 and 47 are circuit diagrams showing configurations of a row decoder RD, a word line driver WLD, and a source line driver SLD.

Furthermore, in the first to sixth embodiments, each of the source line drivers SLDs is connected to one word lines WLL and operates based on a drive signal for the word line WLL. Alternatively, as shown in FIG. 46, one source line driver SLD can be configured to be connected to the row decoder RD in parallel to the word line driver WLD and to drive the source lines SLLs in response to a signal from the row decoder RD. In this case, the source line driver SLD drives each source line SLLs based on a source drive line SDRVi different from a word drive line WDRVi.

In FIG. 46, output nodes of the row decoder RD differ between the word line driver WLD and the source line driver SLD. Alternatively, as shown in FIG. 47, an output node N1 of the row decoder RD can be common to the word line driver WLD and the source line driver SLD.

Figure 47:
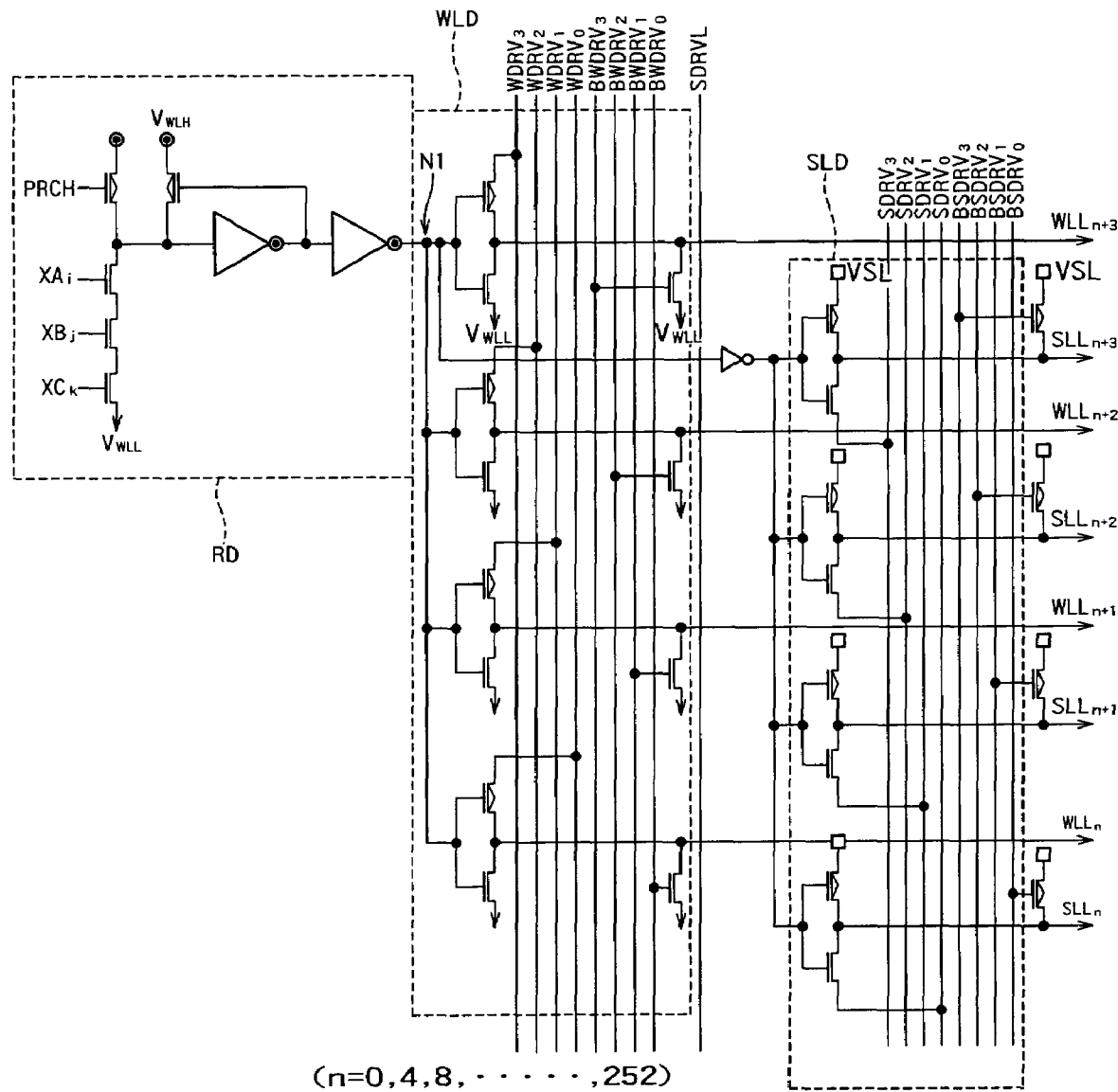
Figure 48A:
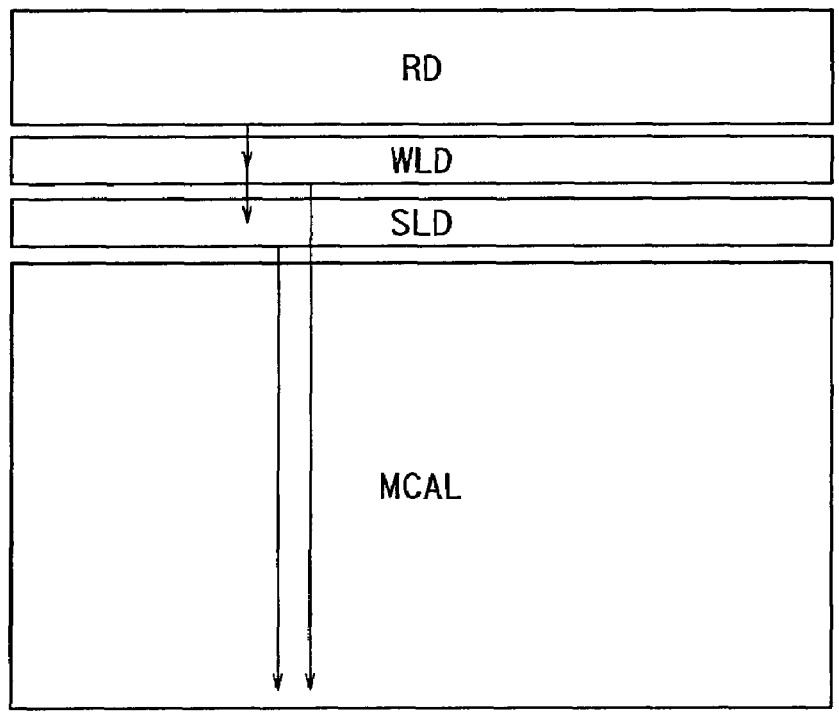
FIGS. 48A and 48B are layout diagrams showing the memory cell array, the row decoder RD, the word line driver WLD, and the source line driver SLD.
Figure 48B:
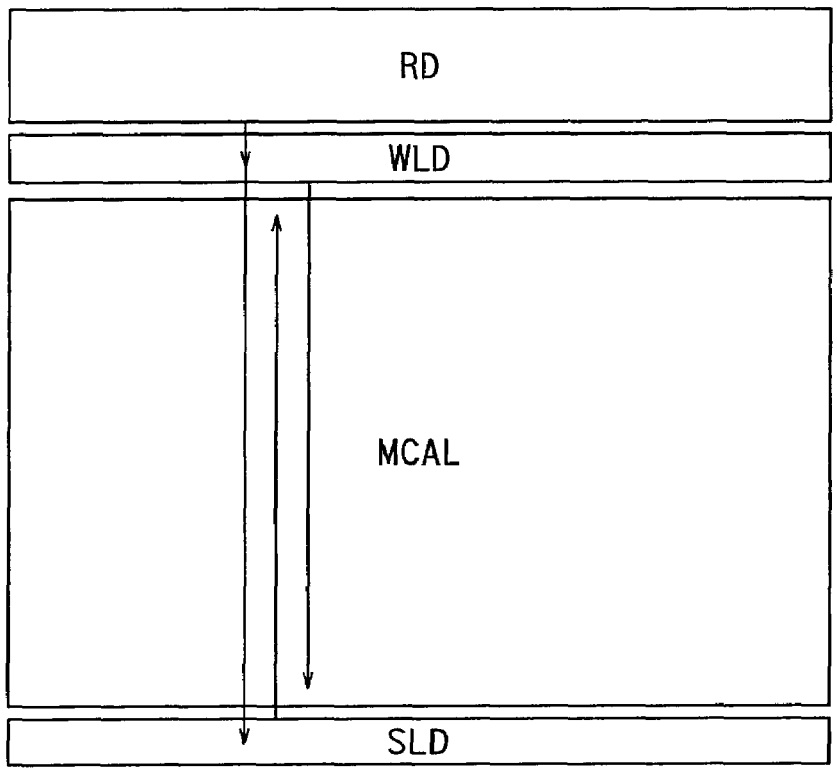

FIGS. 48A and 48B are layout diagrams showing the row decoder RD, the word line driver WLD, and the source line driver SLD shown in FIGS. 46 and 47.

In FIG. 48A, the row decoder RD, the word line driver WLD, and the source line driver SLD are all arranged on one side of the memory cell array MCAL. Because of a short distance between the word line driver WLD and the source line driver SLD, the layout shown in FIG. 48A is applicable to the configuration in which an interconnect from the row decoder RD to the word line driver WLD is prepared separately from that from the row decoder RD to the source line driver SLD (FIG. 46).

In FIG. 48B, the source line driver SLD is arranged on the opposite side to the word line driver WLD with respect to the memory cell array MCAL. Because of a relatively long distance between the word line driver WLD and the source line driver SLD, it is advantageous to apply the layout shown in FIG. 48B to the configuration in which a common interconnect is used as the interconnect from the row decoder RD to the word line driver WLD and that from the row decoder RD to the source line driver SLD (FIG. 47).

Figure 49:
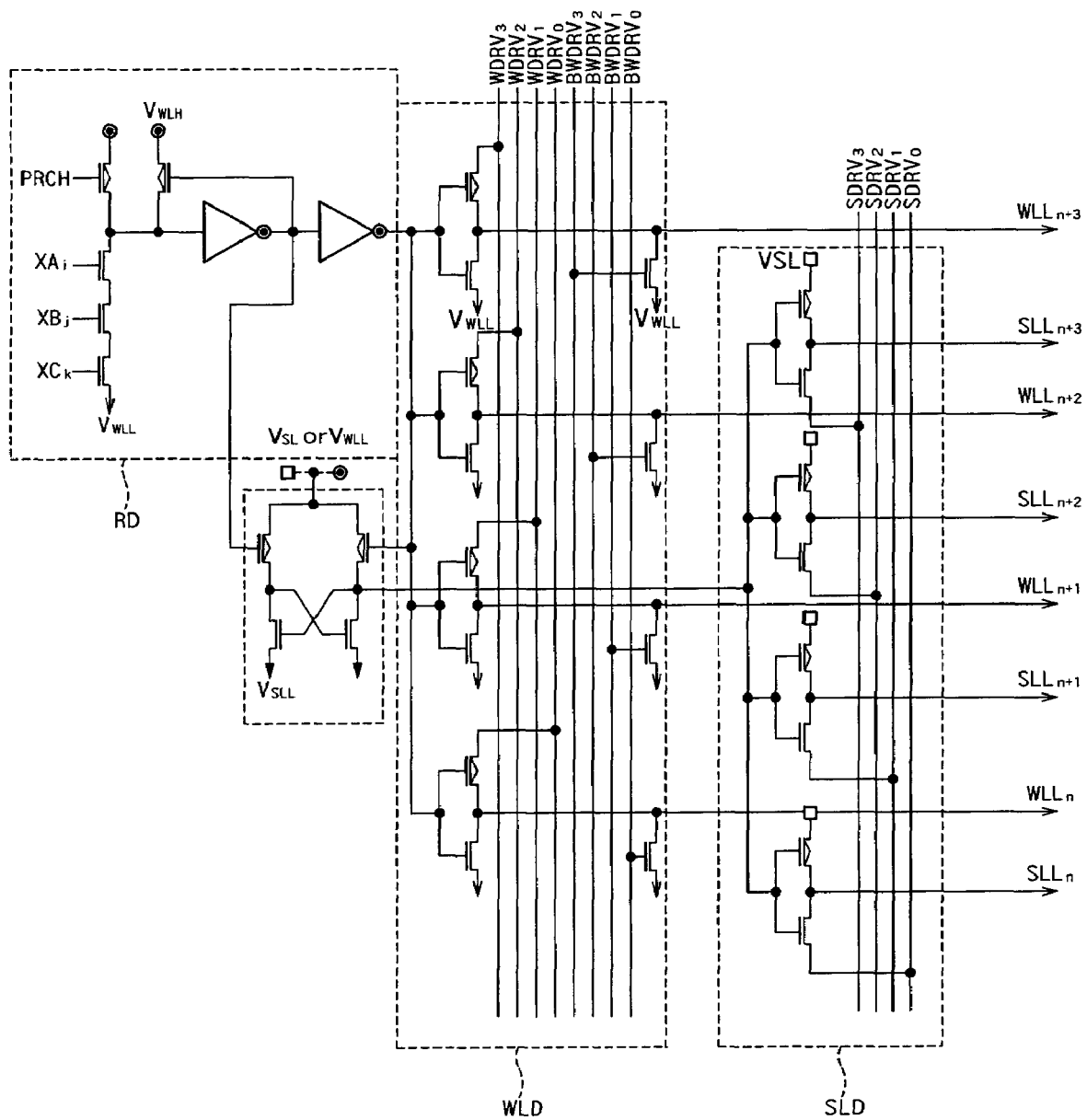
FIG. 49 is a layout diagram showing a circuit diagram showing configurations of a row decoder RD, a word line driver WLD, and a source line driver SLD.

In FIG. 49, a level shifter LS is connected between the row decoder RD and the source line driver SLD shown in FIG. 46. The source line drivers SLDs shown in FIGS. 46 and 47 may possibly not operate accurately if the low source potential VSLL is lower than the low word line potential VWLL. Due to this, if the output of the row decoder RD is VWLL, the level shifter LS converts the VWLL into the VSLL and outputs the VSLL to the source line driver SLD. By doing so, even if VSLL<VWLL, the source line driver SLD can normally operate. A high-level power supply of the level shifter LS can be either the high word line potential VWLH or the high source potential VSL. If high-level power supply of the level shifter LS is VWLH and the output of the row decoder RD is VWLH, the level shifter LS outputs the VWLH to the source line driver SLD as it is. If high-level power supply of the level shifter LS is VSL and the output of the row decoder RD is VWLH, the level shifter LS coverts the VWLH into the VSL and outputs the VSL to the source line driver SLD.

Alternatively, the level shifter LS can be provided between the row decoder RD and the source line driver SLD shown in FIG. 47. By providing the level shifter, the source line driver SLD shown in FIG. 47 can normally operate if VSLL<VWLL and/or VSL>VWLH.

The invention claimed is:

1. A semiconductor memory device comprising:
   a memory cell including a source layer, a drain layer, and a floating body provided between the source layer and the drain layer and being in an electrically floating state, the memory cell storing therein data according to number of majority carriers accumulated in the floating body;
   a word line connected to a gate of the memory cell, and extending in a first direction;
   a bit line connected to the drain layer of the memory cell, and extending in a second direction different from the first direction;
   a source line connected to the source layer of the memory cell, and extending in the first direction;
   a sense amplifier connected to the bit line, and sensing data from the memory cell selected by the bit line and the word line;
   a driver applying a voltage to the word line to form a channel in the memory cell and shifting a voltage of the source line in a voltage direction opposite to a transition direction of the voltage of the word line when first data indicating that the number of the majority carriers is small is written to the memory cell.

2. The semiconductor memory device according to claim 1, wherein the driver applies a voltage to the source line so as to apply a forward bias to a junction between the source layer and the floating body when the first data is written to the memory cell.

3. The semiconductor memory device according to claim 1, wherein
   a plurality of the memory cells is arranged two-dimensionally on a substrate, and
   the semiconductor memory device further comprises a source line contact connecting the source layer to the source line and provided to correspond to each of the memory cells.

4. The semiconductor memory device according to claim 1, wherein the source line is provided to correspond to the word line.

5. The semiconductor memory device according to claim 1, wherein the driver includes
   a word line driver applying a voltage to the word line; and
   a source line driver connected to the source line and applying a voltage to the source line corresponding to the word line according to the voltage applied to the word line.

6. The semiconductor memory device according to claim 1, wherein a voltage VWLL of the word line during data holding time, a voltage VSL of the source line during the data holding time, a voltage VWLH of the word line during writing of the first data, and a voltage VSLL of the source line during writing of the first data satisfy a relationship of VWLL<VSLL<VSL<VWLH.

7. The semiconductor memory device according to claim 5, wherein a voltage VWLL of the word line during data holding time, a voltage VSL of the source line during the data holding time, a voltage VWLH of the word line during writing of the first data, and a voltage VSLL of the source line during writing of the first data satisfy a relationship of VWLL<VSLL<VSL<VWLH.

8. The semiconductor memory device according to claim 5, wherein the source line driver includes a level shifter converting the voltage applied to the word line and outputting the voltage applied to the source line.

9. The semiconductor memory device according to claim 8, wherein a voltage VWLL of the word line during data holding time, a voltage VSL of the source line during the data holding time, a voltage VWLH of the word line during writing of the first data, and a voltage VSLL of the source line during writing of the first data satisfy a relationship of VWLL<VSLL<VSL<VWLH.

10. The semiconductor memory device according to claim 1, wherein, a source line contact connecting between the source line and the source layer is shared between two adjacent memory cells.

11. The semiconductor memory device according to claim 10, wherein, each source line driver is alternately arranged between two adjacent word lines,
   the source line driver drives the source line sharing by the two adjacent word lines, when one of the two adjacent word lines corresponding to the source line driver is selected,
   the driver further includes a word drive line driver applying the voltage VWLH to the selected word line of the two adjacent word lines, applying the voltage VWLL to the unselected word line sharing the source line with the selected word line and applying a voltage VWLM to unselected word lines which do not share the source line with the selected word line, the voltage VWLM being a voltage between the voltage VWLH and the voltage VWLL and nearer the voltage VWLL than the voltage VWLH.

12. A method of driving a semiconductor memory device, the semiconductor memory device comprising: a memory cell including a source layer, a drain layer, and a floating body provided between the source layer and the drain layer and being in an electrically floating state, the memory cell storing therein data according to number of majority carriers accumulated in the floating body; a word line connected to a gate of the memory cell, and extending in a first direction; a bit line connected to the drain layer of the memory cell, and extending in a second direction different from the first direction; a source line connected to the source layer of the memory cell, and extending in the first direction; a sense amplifier connected to the bit line, and sensing data from the memory cell selected by the bit line and the word line; a driver driving the word line and the source line, the method comprising:

shifting a voltage of the source line from a level during data holding time to a voltage direction opposite to a transition direction of the voltage of the word line when first data indicating that number of majority carriers is small is written to the memory cell.

13. The method of driving a semiconductor memory device according to claim 12, comprising:

causing the driver to write the first data to all memory cells connected to a selected certain word line;

returning a voltage of the source line to a voltage of the source line during data holding time; and writing second data indicating that the number of the majority carriers is larger than that of the first data to a selected memory cell among the memory cells connected to the selected word line.

14. The method of driving a semiconductor memory device according to claim 12, comprising:

causing the sense amplifier to write the first data to the memory cell, and latching the data from outside during an operation for writing the data from the outside, in a transition state of the voltage of the source line from the level during data holding time to the voltage direction opposite to the transition direction of the voltage of the word line.

15. The semiconductor memory device according to claim 12, wherein the driver includes a word line driver applying a voltage to the word line; and a source line driver connected to the source line and applying a voltage to the source line corresponding to the word line according to the voltage applied to the word line.

16. The semiconductor memory device according to claim 15, wherein the source line driver includes a level shifter converting the voltage applied to the word line and outputting the voltage applied to the source line.

17. The semiconductor memory device according to claim 12, wherein, a source line contact connecting between the source line and the source layer is shared between two adjacent memory cells.

18. The semiconductor memory device according to claim 17, wherein, the driver further includes a word drive line driver applying a voltage to the word line driver, the word drive line driver applies a voltage VWLH to the selected word line of the two adjacent word lines, applies a voltage VWLL to the unselected word line sharing the source line with the selected word line and applies a voltage VWLM to unselected word lines which do not share the source line with the selected word line, the voltage VWLH being a voltage of the word line during writing of the first data, the voltage VWLL being a voltage of the word line during data holding time, the voltage VWLM being a voltage between the voltage VWLH and the voltage VWLL and nearer the voltage VWLL than the voltage VWLH.

* * * * *